United States Patent
Yang

(10) Patent No.: US 12,314,092 B2
(45) Date of Patent: May 27, 2025

(54) DISPLAY PANEL AND DISPLAY APPARATUS

(71) Applicant: WUHAN TIANMA MICRO-ELECTRONICS CO., LTD., Wuhan (CN)

(72) Inventor: Yuehua Yang, Wuhan (CN)

(73) Assignee: WUHAN TIANMA MICRO-ELECTRONICS CO., LTD., Wuhan (CN)

(*) Notice: Subject to any disclaimer, the term of this patent is extended or adjusted under 35 U.S.C. 154(b) by 208 days.

(21) Appl. No.: 18/149,364

(22) Filed: Jan. 3, 2023

(65) Prior Publication Data

US 2023/0143358 A1 May 11, 2023

(30) Foreign Application Priority Data

Sep. 6, 2022 (CN) .......................... 202211099121.7

(51) Int. Cl.
- *G06F 1/16* (2006.01)
- *G09G 3/20* (2006.01)
- *G11C 19/28* (2006.01)

(52) U.S. Cl.
CPC ......... *G06F 1/1683* (2013.01); *G09G 3/2092* (2013.01); *G11C 19/28* (2013.01); *G09G 2310/0286* (2013.01)

(58) Field of Classification Search
CPC ...... G06F 1/1683; G09G 3/2092; G11C 19/28
USPC .................................................. 361/679.01
See application file for complete search history.

(56) References Cited

U.S. PATENT DOCUMENTS

| 2022/0320230 A1* | 10/2022 | Zhang | H10K 59/65 |
| 2022/0342528 A1* | 10/2022 | Niu | G06F 3/0412 |

FOREIGN PATENT DOCUMENTS

| CN | 111969027 A | 11/2020 |
| CN | 113160743 A | 7/2021 |
| CN | 113471252 A | 10/2021 |

OTHER PUBLICATIONS

Office Action mailed Oct. 17, 2024, issued in corresponding Chinese Application No. 202211099121.7, filed Sep. 6, 2022, 14 pages.

* cited by examiner

*Primary Examiner* — Binh B Tran
(74) *Attorney, Agent, or Firm* — CHRISTENSEN O'CONNOR JOHNSON KINDNESS PLLC

(57) ABSTRACT

A display panel has light-transmitting holes arranged in a first direction and a display region surrounding the light-transmitting holes. The display panel includes first-type signal lines located in the display region and each extending along the first direction, and at least one first connection line. At least one first-type signal line each includes first A segments and at least one first B segment. Each first B segment is located between two adjacent light-transmitting holes, and each first A segment is located at a side of an outermost light-transmitting hole away from the at least one first B segment. One first connection line has a first end electrically connected to one first B segment, and a second end electrically connected to one first A segment or another first B segment, and one first connection line has at least one part located in the display region.

37 Claims, 44 Drawing Sheets

DISPLAY PANEL AND DISPLAY APPARATUS

CROSS-REFERENCE TO RELATED APPLICATIONS

The present application claims priority to Chinese Patent Application No. 202211099121.7, filed on Sep. 6, 2022, the content of which is incorporated herein by reference in its entirety.

TECHNICAL FIELD

The present disclosure relates to the field of display technology, and particularly, to a display panel and a display apparatus.

BACKGROUND

In order to achieve a full-screen design, a light-transmitting hole is provided at a position in a display region corresponding to a camera arranging position. However, based on the existing design, the width of a frame of the light-transmitting hole is large, which seriously affects the display effect of the full-screen panel.

SUMMARY

In an aspect, some embodiments of the present disclosure provide a display panel. The display panel has at least two light-transmitting holes arranged in a first direction and a display region surrounding the at least two light-transmitting holes. The display panel includes first-type signal lines located in the display region and each extending along the first direction, and at least one first connection line. At least one first-type signal line of the first-type signal lines each includes first A segments and at least one first B segment, each of the at least one first B segment is located between two adjacent light-transmitting holes of the at least two light-transmitting holes, and each of the first A segments is located at a side of an outermost light-transmitting hole of the at least two light-transmitting holes away from the at least one first B segment. One of the at least one first connection line has a first end electrically connected to one of the at least one first B segment, and a second end electrically connected to one of the first A segments or another one of the at least one first B segment. One of the first connection lines has at least one part located in the display region.

In another aspect, some embodiments of the present disclosure provide a display apparatus including a display panel. The display panel has at least two light-transmitting holes arranged in a first direction and a display region surrounding the at least two light-transmitting holes. The display panel includes first-type signal lines located in the display region and each extending along the first direction, and at least one first connection line. At least one first-type signal line of the first-type signal lines each includes first A segments and at least one first B segment, each of the at least one first B segment is located between two adjacent light-transmitting holes of the at least two light-transmitting holes, and each of the first A segments is located at a side of an outermost light-transmitting hole of the at least two light-transmitting holes away from the at least one first B segment. One of the at least one first connection line has a first end electrically connected to one of the at least one first B segment, and a second end electrically connected to one of the first A segments or another one of the at least one first B segment. One of the first connection lines has at least one part located in the display region.

WINDING LINEBRIEF DESCRIPTION OF DRAWINGS

In order to better illustrate technical solutions in the embodiments of the present disclosure, the accompanying drawings used in the embodiments are briefly introduced as follows. It should be noted that the drawings described as follows are merely part of the embodiments of the present disclosure, and other drawings can also be acquired by those skilled in the art.

DESCRIPTION OF EMBODIMENTS

For better illustrating technical solutions of the present disclosure, embodiments of the present disclosure will be described in detail as follows with reference to the accompanying drawings.

It should be noted that the described embodiments are merely exemplary embodiments of the present disclosure, which shall not be interpreted as providing limitations to the present disclosure. All other embodiments obtained by those skilled in the art without creative efforts according to the embodiments of the present disclosure are within the scope of the present disclosure.

The terms used in the embodiments of the present disclosure are merely for the purpose of describing particular embodiments but not intended to limit the present disclosure. Unless otherwise noted in the context, the singular form expressions "a", "an", "the" and "said" used in the embodiments and appended claims of the present disclosure are also intended to represent plural form expressions thereof.

It should be understood that the term "and/or" used herein is merely an association relationship describing associated objects, indicating that there can be three relationships, for example, A and/or B can indicate that three cases, i.e., A alone, A and B, B alone. In addition, the character "/" herein generally indicates that the related objects before and after the character are in an "or" relationship.

It should be understood that although the layer can be described using the terms of "first", "second", etc., in the embodiments of the present disclosure, the layer will not be limited to these terms. These terms are merely used to distinguish layers from one another. For example, without departing from the scope of the embodiments of the present disclosure, a first layer can also be referred to as a second layer, similarly, a second layer can also be referred to as a first layer.

As described in Background, if the light-transmitting hole is arranged in the image display region, the width of the frame of the light-transmitting hole is large. It is inventor found that the display panel may be designed to have a single light-transmitting hole or multiple light-transmitting holes at present. However, if the display panel is designed to have multiple light-transmitting holes, the width of the frame of the light-transmitting hole is larger.

Figure 1:
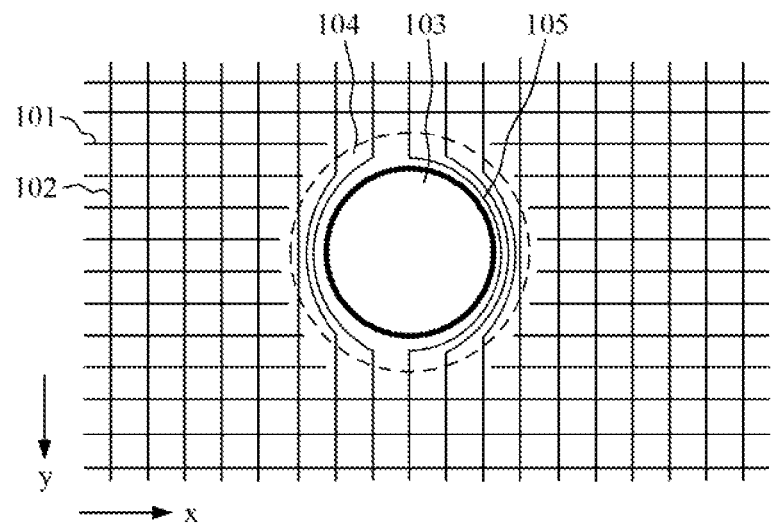
FIG. 1 is a partial top view of a display panel in the related art.
Figure 2:
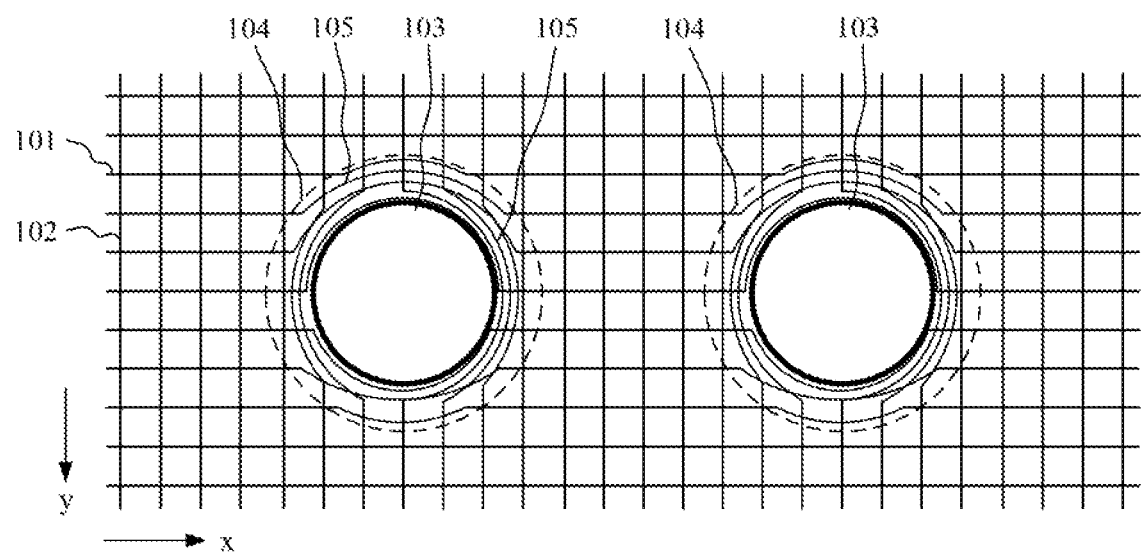
FIG. 2 is another partial top view of a display panel in the related art.

FIG. 1 is a partial top view of a conventional display panel. FIG. 2 is another partial top view of a conventional display panel. As shown in FIG. 1 and FIG. 2, the display panel includes first-type signal lines 101 each extending in a first direction x, and second-type signal lines 102 each extending in a second direction y. The first-type signal lines 101 may be configured to transmit a scanning signal, a light-emitting control signal, etc. The second-type signal lines 102 may be configured to transmit a data signal, etc.

If a light-transmitting hole 103 is arranged in an image display region, to avoid the light-transmitting hole 103, one or more first-type signal lines 101 each are broken by the light-transmitting hole 103 to two segments located at two sides (referred to as a right side and a left side hereafter) of the light-transmitting hole 103 along the first direction x, and one or more second-type signal lines 102 each are broken by the light-transmitting hole 103 to two segments located at two sides (referred to as a upper side and a lower side hereafter) of the light-transmitting hole 103 along the second direction y.

If the display panel is provided with only one light-transmitting hole 103, as shown in FIG. 1, for the second-type signal line 102 that is broken by the light-transmitting hole 103 in the second direction y, the two segments of the second-type signal line 102 located at the upper and lower sides of the light-transmitting hole 103 are typically connected by a winding line 105 arranged in a frame 104 corresponding to the light-transmitting hole 103. For the firs-type signal line 101 that is broken by the light-transmitting hole 103 along the first direction x, the two segments of the firs-type signal line 101 may be driven, in a double-side driven manner, by two shift registers located at left and right sides of the display panel, respectively. In this way, the two segments of the firs-type signal line 101 that are disconnected can normally transmit signals, and accordingly, there is no need to provide a winding line in the frame 104 for connecting the two segments of the firs-type signal line 101.

However, as shown in FIG. 2, the display panel may be provided with multiple light-transmitting holes 103 that are arranged along the first direction x, and the region between two adjacent light-transmitting holes 103 belongs to the image display region. Even if two shift registers are employed to implement the double-side driving, the segment of the first-type signal line 101 between the two adjacent light-transmitting holes 103 needs to be connected to an neighbor segment of the first-type signal line 101 through a winding line 105. As a result, the number of winding lines 105 needs to be arranged in the frame 104 is increased significantly, and thus the width of the frame 104 is relatively large, which seriously affects the display effect of the full-screen display panel.

Figure 3:
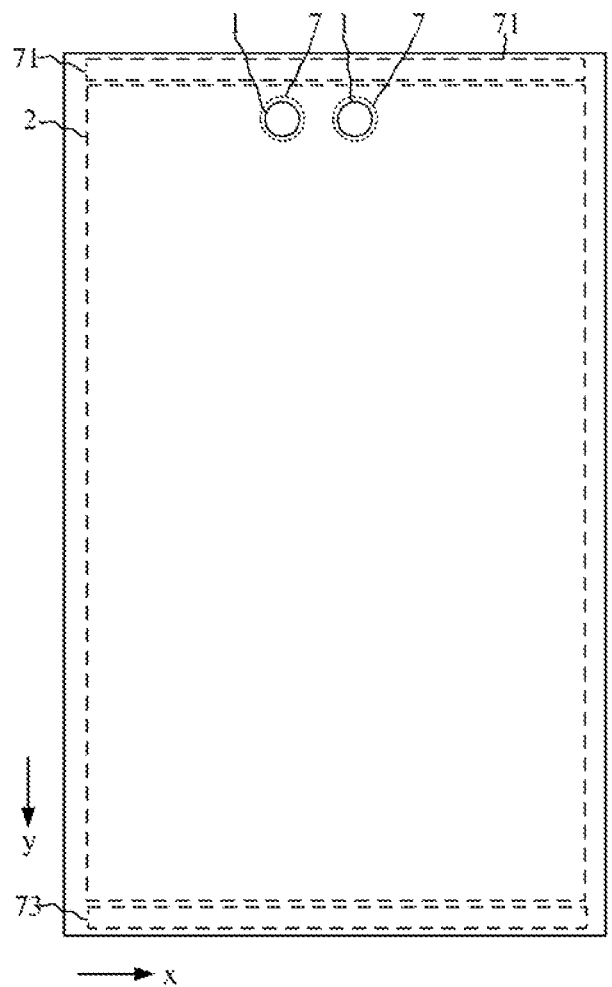
FIG. 3 is a top view of a display panel according to some embodiments of the present disclosure.

Various embodiments of the present disclosure provide a display panel. FIG. 3 is a top view of a display panel according to some embodiments of the present disclosure. As shown in FIG. 3, the display panel includes at least two light-transmitting holes 1 and a display region 2. The at least two light-transmitting holes 1 are arranged along a first direction x, and each of the at least two light-transmitting holes 1 is surrounded by the display region 2. An optical component such as a camera is arranged at a position corresponding to the light-transmitting hole 1. The light-transmitting hole 1 may penetrate through the display panel or may not penetrate through the display panel.

Figure 4:
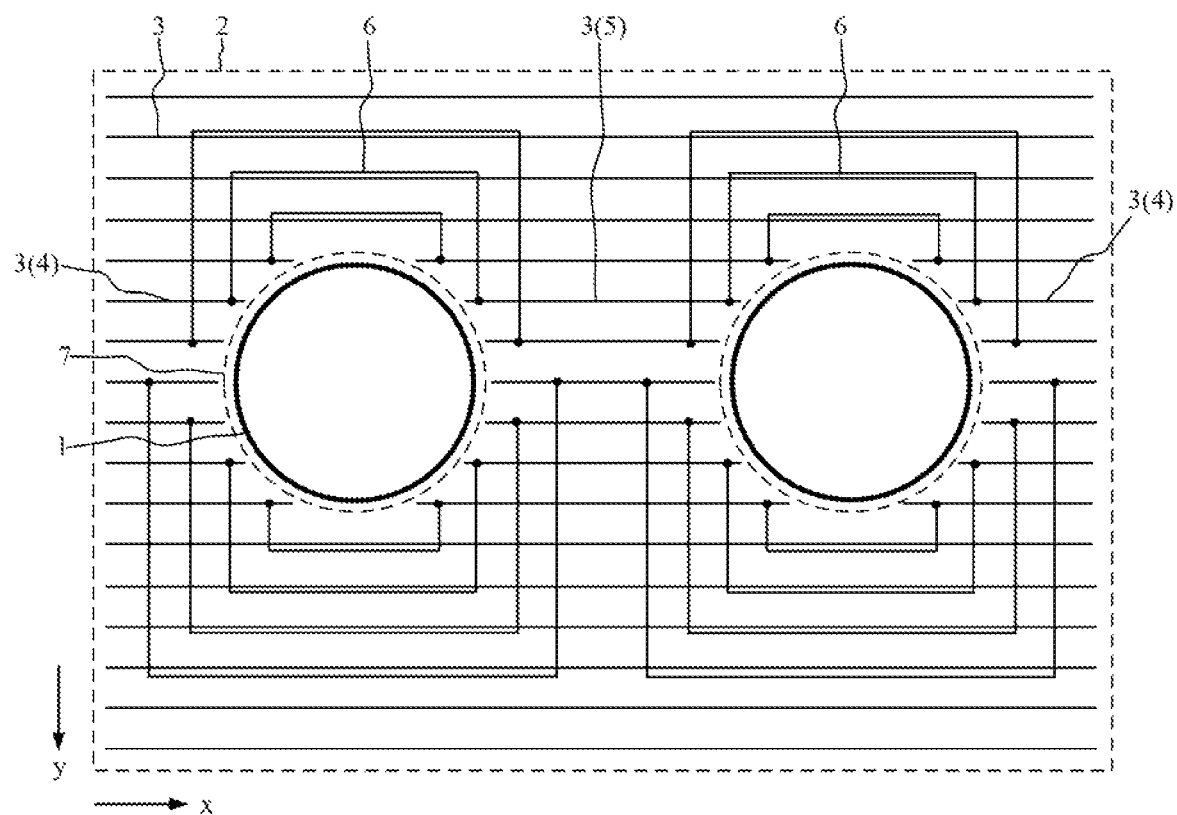
FIG. 4 is a partial top view of a display panel according to some embodiments of the present disclosure.

FIG. 4 is a partial top view of a display panel according to some embodiments of the present disclosure. As shown in FIG. 4, the display panel further includes first-type signal lines 3 that are located in the display region 2 and extend along the first direction x. One or more first-type signal lines 3 are broken by the light-transmitting hole 1 along the first direction, and such first-type signal line 3 includes: first A segments 4 and a first B segment 5. The first B segment 5 is located between two adjacent light-transmitting holes 1, and the first A segment 4 is located at a side of the outermost light-transmitting hole 1 away from the first B segment 5. The outermost light-transmitting hole 1 may be the first light-transmitting hole 1 or the last light-transmitting hole 1 of the at least two light-transmitting holes 1 arranged along the first direction x.

The display panel further includes a first connection line 6. A first end of the first connection line 6 is electrically connected to one first B segment 5, and a second end of the first connection line 6 is electrically connected to the first A segment 4 or another first B segment 5. The first connection line 6 includes at least one part located in the display region 2. In some exemplary embodiments, each first B segment 5 is electrically connected to its neighbor first A segment 4 or first B segment 5 through the first connection line 6.

In embodiments of the present disclosure, the first connection line 6 that extends at least in the display region 2 is provided. The segments (one first A segment 4 and one first B segment 5, or tow first B segments 5) of the first-type signal line 3 that are spaced apart by the light-transmitting hole 1 and are located at two sides of the light-transmitting hole 1 are connected by the first connection line 6, so as to realize the conduction of the signal transmission path. The number of winding lines that need to be arranged in a first non-display region 7 surrounding the light-transmitting hole 1 and are used for connecting segments of the first-type signal line 3 is reduced, and thus the width of the frame next to the light-transmitting hole 1 is effectively reduced. That means, the area of the non-emission region between the light-transmitting hole 1 and the display region 2 is reduced, which effectively improves the displaying effect of the full-screen display panel.

In the embodiments of the present disclosure, each first B segment 5 is connected to its neighbor first A segment 4 or first B segment 5 though the first connection line 6. The flexibility of the driving manner of the shift register may be improved without affecting the width of the frame corresponding to the light-transmitting hole 1. For example, the shift register may drive the first-type signal line 3 in a unilateral drive manner or drive the first-type signal line 3 in a bilateral drive manner.

Figure 5:
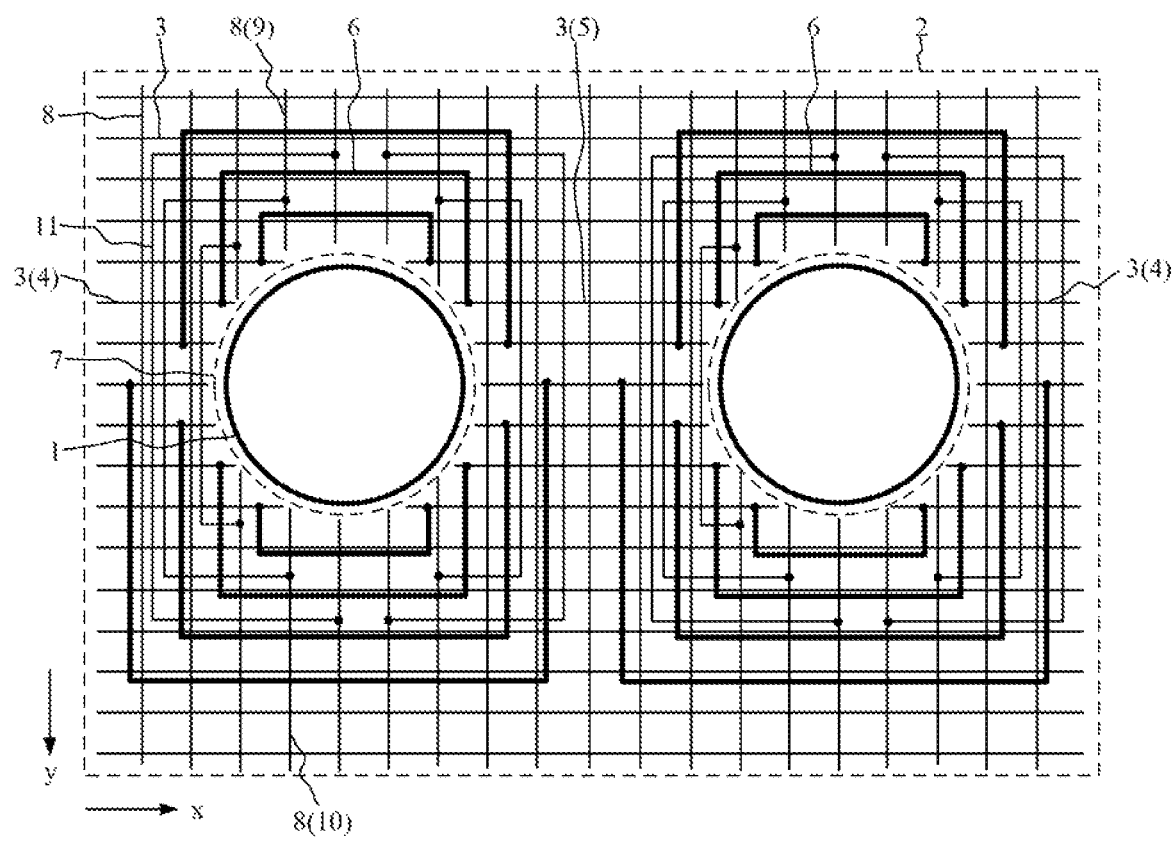
FIG. 5 is another partial top view of a display panel according to some embodiments of the present disclosure.

FIG. 5 is another partial top view of a display panel according to some embodiments of the present disclosure. In some embodiments, as shown in FIG. 5, the display panel further includes second-type signal lines 8 that are located in the display region 2 and extend along a second direction y, where the second direction y intersects the first direction x. One or more of the second-type signal lines 8 are broken by the light-transmitting hole 1 along the second direction y, and such second-type signal line 8 includes a second A segment 9 and a second B segment 10 located at two sides of the light-transmitting hole 1 along the second direction y, respectively.

The display panel further includes a second connection line 11. A first end of the second connection line 11 is electrically connected to the second A segment 9, and a second end of the second connection line 11 is electrically connected to the second B segment 10. At least one part of the second connection line 11 is located in the display region 2.

In embodiments of the present disclosure, the second connection line 11 that extends at least in the display region 2 is provided. The second A segment 9 and the second B segment 10 are electrically connected to each other by the second connection line 11, and the number of winding line that needs to be arranged in the first non-display region 7 and is configured to connect the second-type signal line 8 is further reduced, and thus the width of the frame next to the light-transmitting hole 1 can be further reduced. Especially when the connection of the first-type signal line 3 is implemented by the first connection line 6 and the connection of the second-type signal line 8 is implemented by the second connection line 11, no winding line is arranged in the first non-display region 7, and the first non-display region 7 may be omitted, thereby realizing a frameless design.

In some embodiments, as shown in FIG. 6 to FIG. 9, the at least two light-transmitting holes 1 include a first light-transmitting hole 12 and a second light-transmitting hole 13. Each of the first light-transmitting hole 12 and the second light-transmitting hole 13 has a first side and a second side opposite to the first side. For the first B segment 5 located between the first light-transmitting hole 12 and the second light-transmitting hole 13, this first B segment 5 is located between the first side of the first light-transmitting hole 12 and the first side of the second light-transmitting hole 13, this first B segment 5 is electrically connected to the first A segment 4 located at the second side of the first light-transmitting hole 12 through one first connection line 6, and is also electrically connected to the first A segment 4 located at the second side of the second light-transmitting hole 13 through another first connection line 6. In some other embodiments, the at least two light-transmitting holes include first to third light-transmitting holes sequentially arranged along the first direction x. For the first B segments located between two adjacent light-transmitting holes, one first B segment 5 is electrically connected to a first A segment located at another side of a first light-transmitting hole through one first connection line and is also electrically connected to another first B segment located at a second side of a second light-transmitting hole through another first connection line 6. In some other embodiments, the at least two light-transmitting holes include first to fourth light-transmitting holes sequentially arranged along the first direction x. For the first B segments located between two adjacent light-transmitting holes, one first B segment is electrically connected to a first A segment located at another side of a second light-transmitting hole through one first connection line and is also electrically connected to another first B segment located at a second side of a third light-transmitting hole through another first connection line 6.

In the example in which the display panel includes two light-transmitting holes 1, i.e., the first light-transmitting hole 12 and the second light-transmitting hole 13, with the above arrangement, the first B segment 5 may be electrically connected to the first A segments 4 located at its two sides, respectively, through two first connection lines 6. One the one hand, the flexibility of the manner the shift register drives the first-type signal line 3 is improved. The shift register may drive the first-type signal line 3 from one side of the first-type signal line 3, or the shift register may drive the first-type signal line 4 from two sides of the first-type signal line 3. On the other hand, even if the signal transmission path on the first side of the first B segment 5 is disconnected due to the breaking of the first connection line 6 at the first side, this first B segment 5 is still connected to the first A segment 4 at its the second side through the other first connection line 6, and the signal can be normally transmitted to the first B segment 5 through the signal transmission path at the second side, thereby improving the connection reliability of the first B segment 5.

Figure 6:
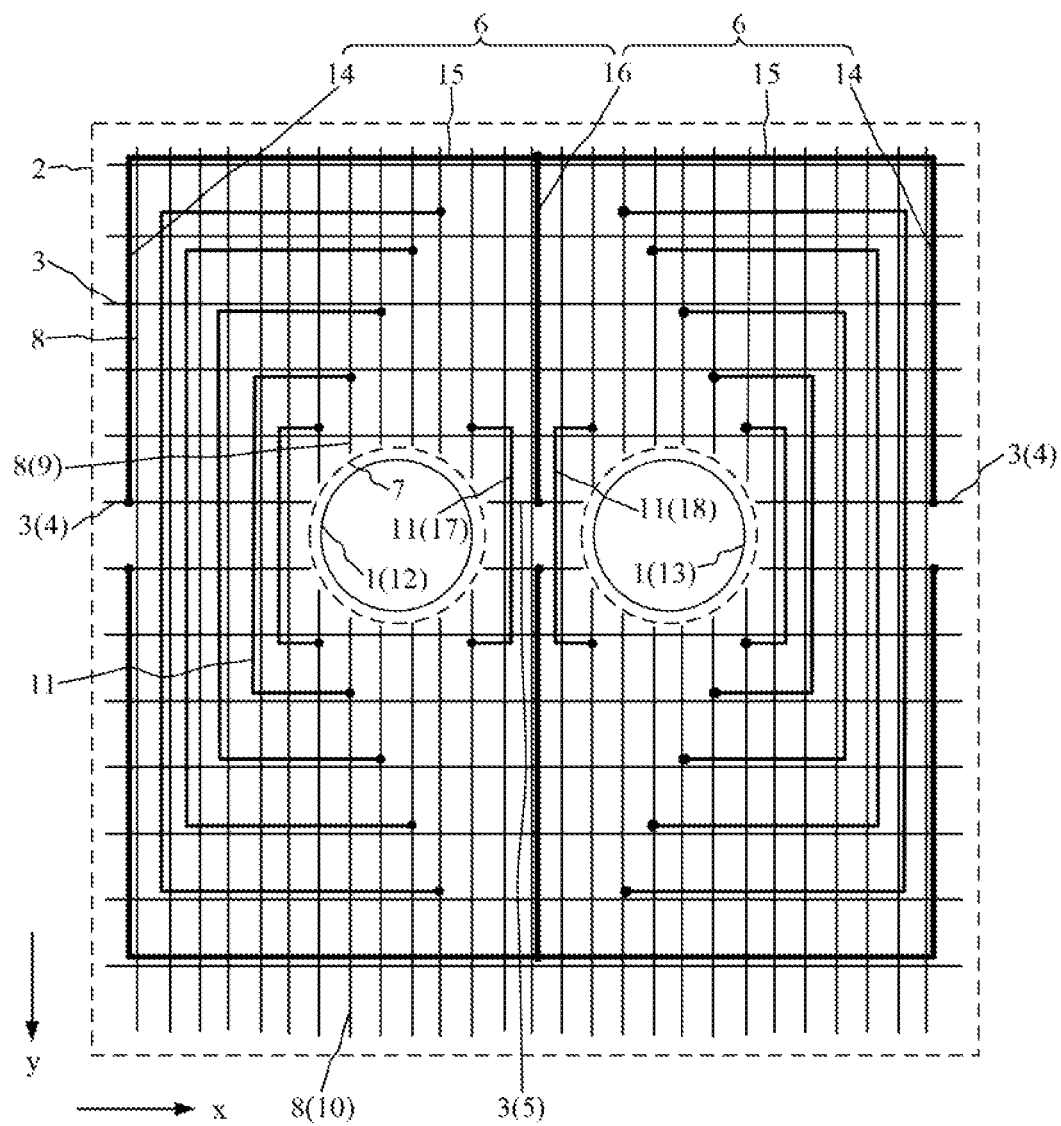
FIG. 6 is another partial top view of a display panel according to some embodiments of the present disclosure.
Figure 7:
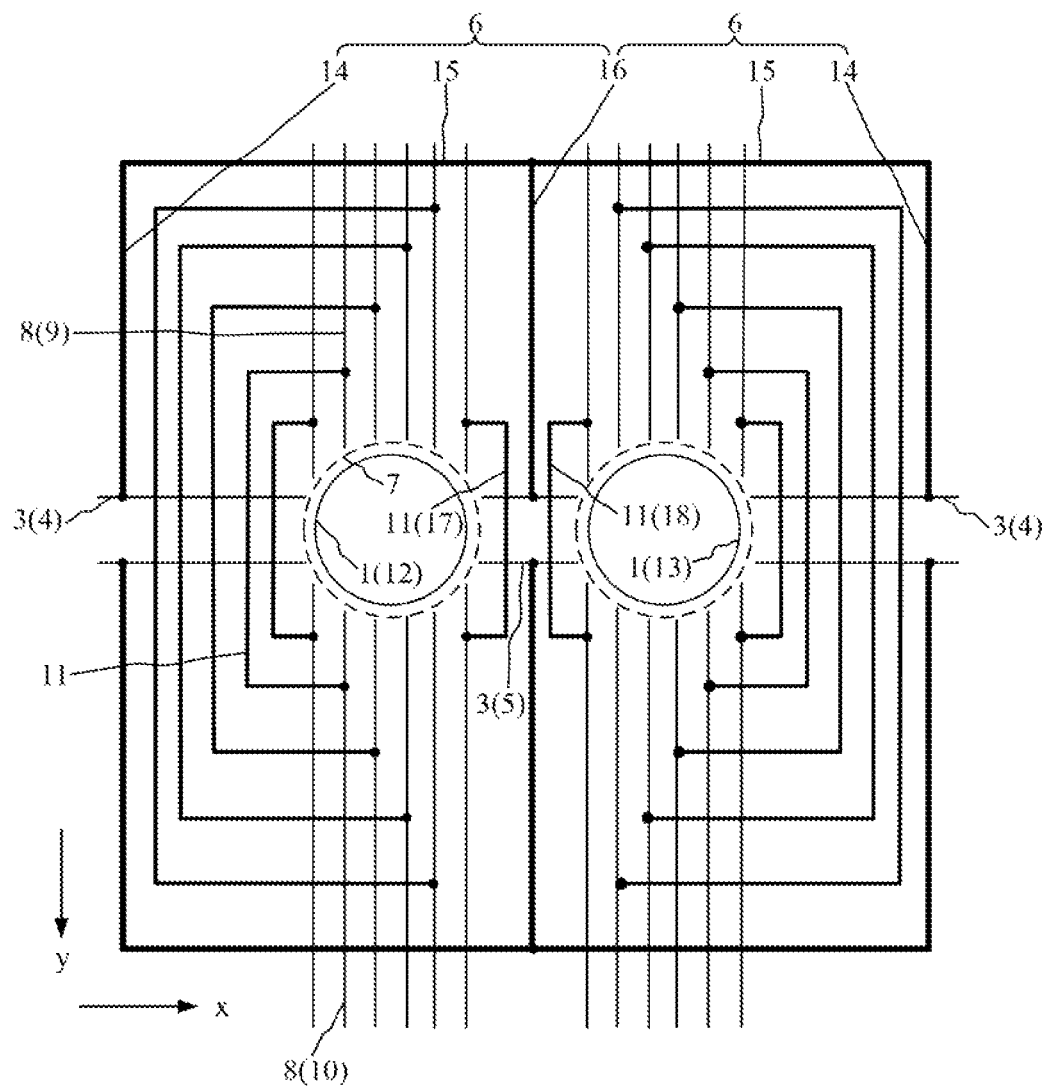
FIG. 7 is a schematic diagram showing an arrangement of a first connection line and a second connection line corresponding to FIG. 6.

FIG. 6 is another partial top view of a display panel according to some embodiments of the present disclosure. FIG. 7 is a schematic diagram showing an arrangement of the first connection line 6 and the second connection line 11 corresponding to FIG. 6. In some embodiments, as shown in FIG. 6 and FIG. 7, the first connection line 6 includes a first connection segment 14, a second connection segment 15, and a third connection segment 16 that are sequentially connected. A first end of the third connection segment is electrically connected to the first B segment 5 located between the first light-transmitting hole 12 and the second light-transmitting hole 13, and the two first connection lines 6 electrically connected to this first B segment 5 share the one third connection segment 16.

When the first B segment 5 is electrically connected to two first connection lines 6, the two first connection lines 6 share one third connection segment 16, which reduces the space between the first light-transmitting hole 12 and the second light-transmitting hole 13 and occupied by the third connection segment 16. As a result, the routing design of the region between the first light-transmitting hole 12 and the second light-transmitting hole 13 can be optimized, and too dense routing arrangement between the first light-transmitting hole 12 and the second light-transmitting hole 13 can be avoided. In other words, the above arrangement does not seriously restrict the distance between the first light-transmitting hole 12 and the second light-transmitting hole 13, and thus the first light-transmitting hole 12 and the second light-transmitting hole 13 may be close to each other, thereby improving the flexibility of the arranging positions of the first light-transmitting hole 12 and the second light-transmitting hole 13.

As shown in FIG. 6 and FIG. 7, the display panel further includes second-type signal lines 8 located in the display region 2 and each extending along the second direction y, where the second direction y intersects the first direction x. One or more of the second-type signal lines 8 each include a second A segment 9 and a second B segment 10. The second A segment 9 and the second B segment 10 are located at two sides of the light-transmitting hole 1 along the second direction y, respectively.

The display panel further includes second connection lines 11 each having a first end electrically connected to the second A segment 9 and a second end electrically connected to the second B segment 10. The second connection line 11 includes at least one part located in the display region 2.

The second connection lines 11 include at least one second A connection line 17, and/or, at least one second B connection line 18. The second A connection line 17 is electrically connected to the second A segment 9 and the second B segment 10 of the second-type signal line 8 that are located at two sides of the first light-transmitting hole 12, and at least one part of the second A connection line 17 is located between the first light-transmitting hole 12 and the second light-transmitting hole 13. The second B connection line 18 is electrically connected to the second A segment 9 and the second B segment 10 of the second-type signal line 8 that are located at two sides of the second light-transmitting hole 13, and at least one part of the second B connection line 18 is located between the first light-transmitting hole 12 and the second light-transmitting hole 13.

When the two first connection lines 6 electrically connected to the first B segment 5 share one third connection segment 16, the number of the required third connection segment 16 between the first light-transmitting hole 12 and the second light-transmitting hole 13 is reduced, and more space can be used for arranging the second connection line 11, so that the space between the first light-transmitting hole 12 and the second light-transmitting hole 13 is reasonably utilized.

One or more of the second connection lines 11 may be arranged between the first light-transmitting hole 12 and the second light-transmitting hole 13, which helps to reduce the load difference between different second connection lines 11. Specifically, taking the second connection line 11 that electrically connects two segments of the second-type signal line 8 located at two sides of the light-transmitting hole 12 for example, in some embodiments of the present disclosure, in the case of a certain number of such second connection lines 11, by arranging a part of the second connection line 11 (the second A segment 17) between the first light-transmitting hole 12 and the second light-transmitting hole 13, the number of the second connection line 11 that partially surrounds the first light-transmitting hole 12 and is located at the side of the first light-transmitting hole 12 away from the second light-transmitting hole 13 can be reduced. As a result, the difference between the extending length of the second connection line 11 located at the side close to the second light-transmitting hole 13 and partially surrounding the first light-transmitting hole 12 and the extending length of the second connection line 11 located at the side away from the second light-transmitting hole 13 and partially surrounding the first light-transmitting hole 12 can be reduced, and thus the load difference between different second connection lines 11 can be effectively reduced, which helps to improve the load uniformity.

In some embodiments of the present disclosure, among of the second-type signal lines 8 that are broken by the first light-transmitting hole 12, the second A connection line 17 may be used for connecting the second-type signal line 8 close to the second light-transmitting hole 13; and among of the second-type signal lines 8 that are broken by the second light-transmitting hole 13, the second B connection line 18 may be used for connecting the second-type signal line 8 close to the first light-transmitting hole 12, which can further reduce the extending lengths and loads of the second A connection line 17 and the second B connection line 18.

Figure 8:
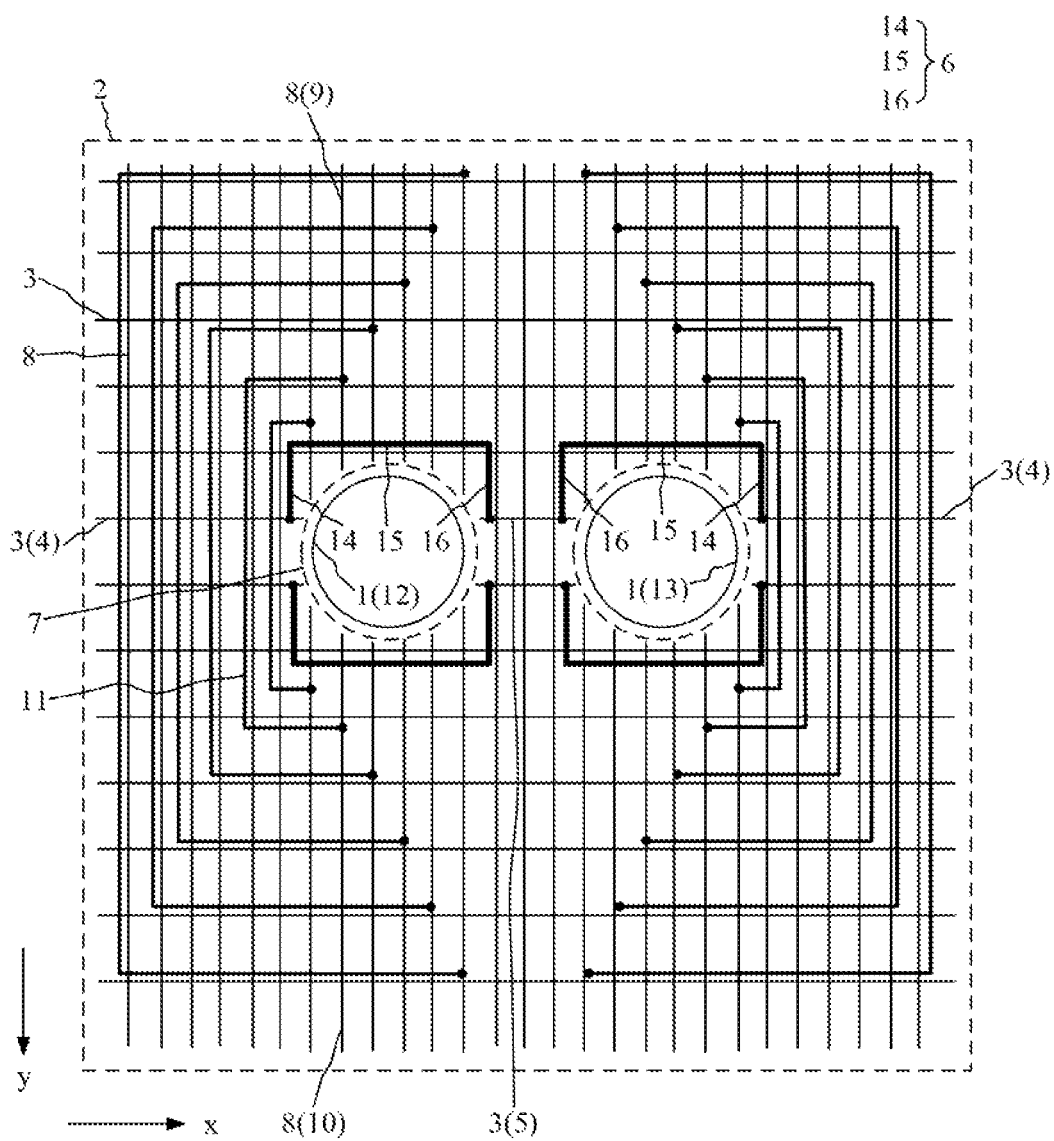
FIG. 8 is another partial top view of a display panel according to some embodiments of the present disclosure.
Figure 9:
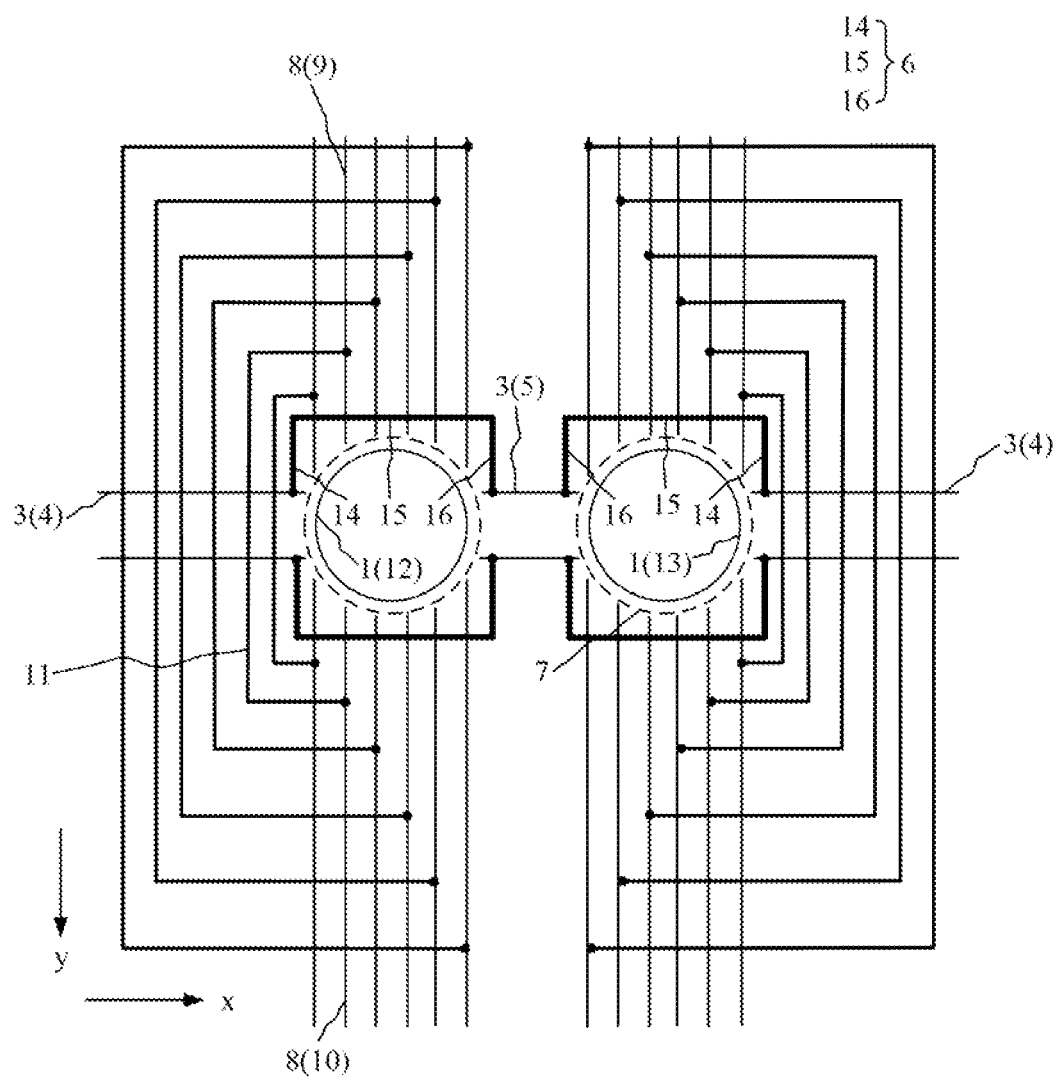
FIG. 9 is a schematic diagram showing an arrangement of a first connection line and a second connection line corresponding to FIG. 8.

FIG. 8 is another partial top view of a display panel according to some embodiments of the present disclosure. FIG. 9 is a schematic diagram showing an arrangement of the first connection line 6 and the second connection line 11 corresponding to FIG. 8. In some embodiments, as shown in FIG. 8 and FIG. 9, the first connection line 6 includes: a first connection segment 14, a second connection segment 15, and a third connection segment 16 that are sequentially connected. A first end of the third connection segment 16 is electrically connected to the first B segment 5 between the first light-transmitting hole 12 and the second light-transmitting hole 13. The third connection segments 16 in the two first connection lines 6 that are electrically connected to the first B segment 5 are spaced apart from each other.

In the above configuration, the two first connection lines 6 electrically connected to the first B segment 5 are independent of each other. Even if the third connection segment 16 of one first connection line 6 is broken, the first B segment 5 can also be electrically connected to the first A segment 4 located at the other side though the first connection line 6 including the other third connection segment 16, so that the signal can be normally transmitted to the first B segment 5, and the connection reliability of the first B segment 5 is better.

As shown in FIG. 8 and FIG. 9, the display panel further includes second-type signal lines 8 located in the display region 2 and extending along the second direction y. One or more of the second-type signal lines 8 each include a second A segment 9 and a second B segment 10. The second A segment 9 and the second B segment 10 are located at two sides of the light-transmitting hole 1 along the second direction y, respectively. The second direction y intersects the first direction x.

The display panel further includes a second connection line 11. A first end of the second connection line 11 is electrically connected to the second A segment 9, and a second end of the second connection line 11 is electrically connected to the second B segment 10. At least one part of the second connection line 11 is located in the display region 2.

The second connection line 11 electrically connected to the second-type signal line 8 that is broken by the first light-transmitting hole 12 surrounds the first light-transmitting hole 12 along the side of the first light-transmitting hole 12 away from the second light-transmitting hole 13; and the second connection line 11 electrically connected to the second-type signal line 8 that is broken by the second light-transmitting hole 13 surrounds the second light-transmitting hole 13 along the side of the second light-transmitting hole 13 away from the first light-transmitting hole 12.

When the third connection segments 16 in the two first connection lines 6 electrically connected to the first B segment 5 are independent of each other, the number of the third connection segments 16 needs to be arranged between the first light-transmitting hole 12 and the second light-transmitting hole 13 is large. In view of this, the second connection line 11 electrically connecting the second-type signal line 8 that is broken by the first light-transmitting hole 12 is arranged to surround the first light-transmitting hole 12 on the side of the first light-transmitting hole 12 away from the second light-transmitting hole 13; and the second connection line 11 electrically connecting the second-type signal line 8 that is broken by the second light-transmitting hole 13 is arranged to surround the second light-transmitting hole 13 on the side of the second light-transmitting hole 13 away from the first light-transmitting hole 12, and thus these second connection lines 11 do not occupy the space between the first light-transmitting hole 12 and the second light-transmitting hole 13, thereby avoiding the mutual interference of signals caused by a large number of connection lines between the first light-transmitting hole 12 and the second light-transmitting hole 13.

In some embodiments, as shown in FIG. 6 and FIG. 7 again, the first connection line 6 electrically connecting the first-type signal line 3 that is broken by the light-transmitting hole 1 and the second connection line 11 electrically connecting the second-type signal line 8 that is broken by the light-transmitting hole 1 are referred to as the first connection line 6 and the second connection line 11 corresponding to the light-transmitting hole 1. For at least one light-transmitting hole of the at least two light-transmitting holes 1, its corresponding first connection line 6 is located at the side of its corresponding second connection line 11 away from the light-transmitting hole 1.

That is, for at least one light-transmitting hole of the at least two light-transmitting holes 1, its corresponding first connection line 6 surrounds its corresponding second connection line 11 the outer side of the second connection line 11. Exemplarily, in one embodiment, the at least two light-transmitting holes 1 include a first light-transmitting hole 12 and a second light-transmitting hole 13, the first connection line 6 corresponding to the first light-transmitting hole 12 is located at the side of the second connection line 11 corresponding to the first light-transmitting hole 12 away from the first light-transmitting hole 12; and the first connection line 6 corresponding to the second light-transmitting hole 13 is located at the side of the second connection line 11 corresponding to the second light-transmitting hole 13 away from the second light-transmitting hole 13.

It should be understood that the signal transmitted by the first-type signal line 3 and the signal transmitted by the second-type signal line 8 are different in type and have a great difference. In the present embodiment, the first connection line 6 corresponding to the light-transmitting hole 1 is arranged on the outer side of the second connection line 11, so that the second connection lines 11 may be intensively arranged at positions close to the light-transmitting hole 1, and the first connection lines 6 may be intensively arranged at positions on the side of the second connection lines 11 away from the light-transmitting hole 1, thereby reducing the mutual interference between the first connection line 6 and the second connection line 11 and improving the transmission reliability of different types of signals. Moreover, with the above arrangement, the first connection line 6 and the second connection line 11 do not overlap each other. In some embodiments, the first connection line 6 and the second connection line 11 are arranged in the same layer, which is beneficial to the routing design of the first connection line 6 and the second connection line 11.

Furthermore, as shown in FIG. 6 and FIG. 7 again, since the first connection line 6 is located at the outer side of the second connection line 11, the extending length of the first connection line 6 is large. In view of this, the two first connection lines 6 electrically connected to the first B segment 5 share the third connection segment 16. In addition to reducing the space required for arranging the third connection segment 16 between two light-transmitting holes 1, the sharing of the third connection segment 16 can also reduce the load of an entirety liner including the first connection line 6, and the first A segment 4 and the first B segment 5 electrically connected though the first connection line 6.

In some embodiments, as shown in FIG. 8 and FIG. 9 again, the first connection line 6 electrically connecting the first-type signal line 3 that is broken by the light-transmitting hole 1 and the second connection line 11 electrically connecting the second-type signal line 8 that is broken by the light-transmitting hole 1 are referred to as the first connection line 6 and the second connection line 11 corresponding to the light-transmitting hole 1. For at least one light-transmitting hole of the at least two light-transmitting holes 1, its corresponding second connection line 11 is located at the side of its corresponding first connection line 6 away from the light-transmitting hole 1.

That means, for at least one light-transmitting hole of the at least two light-transmitting holes 1, its corresponding second connection line 11 surrounds its corresponding first connection line 6 on the outer side of the first connection line 6. Exemplarily, in one embodiment, the at least two light-transmitting holes 1 include a first light-transmitting hole 12 and a second light-transmitting hole 13, the second connection line 11 corresponding to the first light-transmitting hole 12 is located at the side of the first connection line 6 corresponding to the first light-transmitting hole 12 away from the first light-transmitting hole 12; and the second connection line 11 corresponding to the second light-transmitting hole 13 is located at the side of the first connection line 6 corresponding to the second light-transmitting hole 13 away from the second light-transmitting hole 13.

As described above, the signal transmitted by the first-type signal line 3 and the second-type signal line 8 have a large difference. In the present embodiment, the second connection line 11 corresponding to the light-transmitting hole 1 is located at the outer side of the first connection line 6, so that the first connection lines 6 may be intensively arranged at positions close to the light-transmitting hole 1, and the second connection lines 11 may be intensively arranged at the side of the first connection lines 6 away from the light-transmitting hole 1, thereby reducing the mutual interference between the first connection line 6 and the second connection line 11 and improving the transmission reliability of different types of signals. Moreover, with the above arrangement, the first connection line 6 and the second connection line 11 do not overlap each other. In some embodiments, the first connection line 6 and the second connection line 11 are arranged in the same layer, which is beneficial to the routing design of the first connection line 6 and the second connection line 11.

In some embodiments, as shown in FIG. 8 and FIG. 9, when the second connection line 11 is located at the outer side of the first connection line 6, the extending length of the first connection line 6 is short, and thus the load is small. Accordingly, the third connection segments 16 of the two first connection lines 6 electrically connected to the first B segment 5 may be spaced apart from each other.

Figure 10:
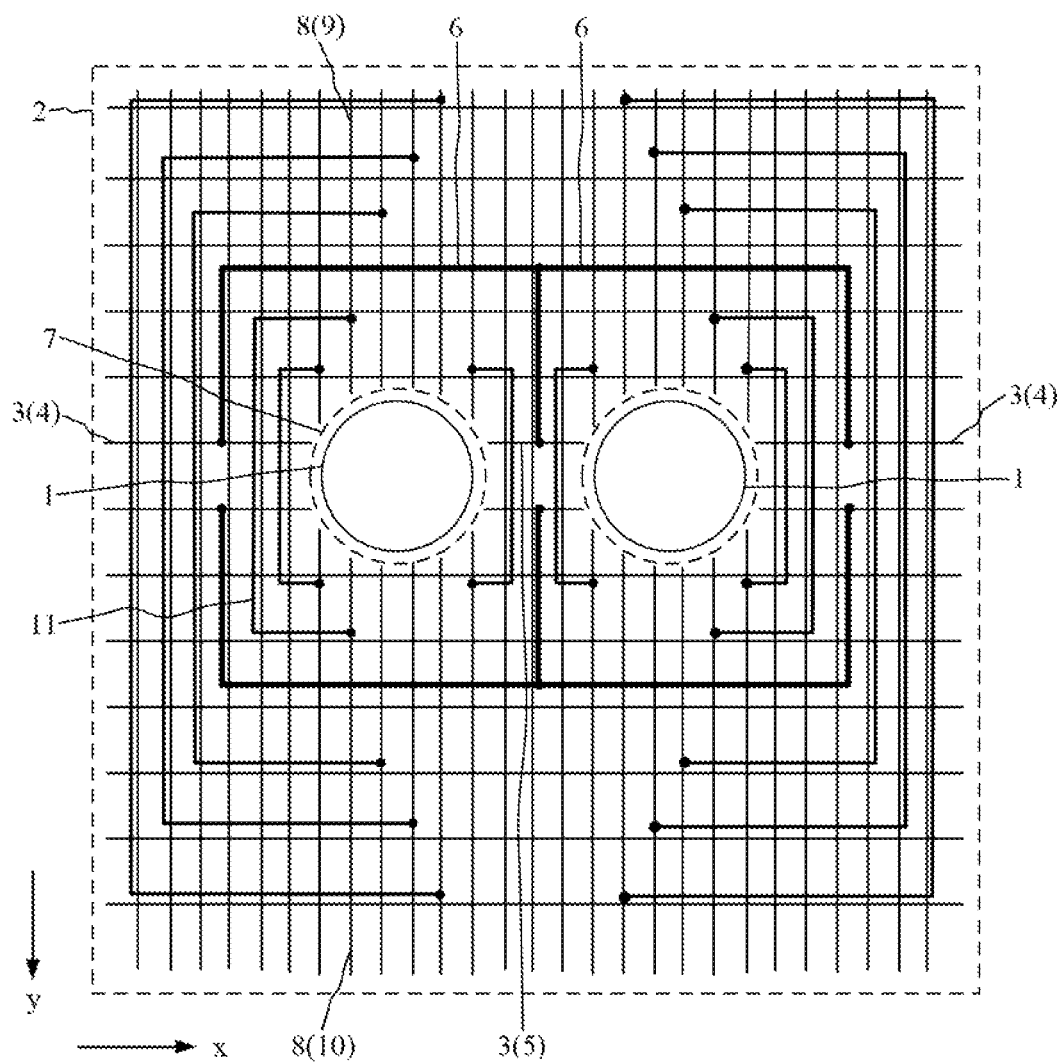
FIG. 10 is another partial top view of a display panel according to some embodiments of the present disclosure.
Figure 11:
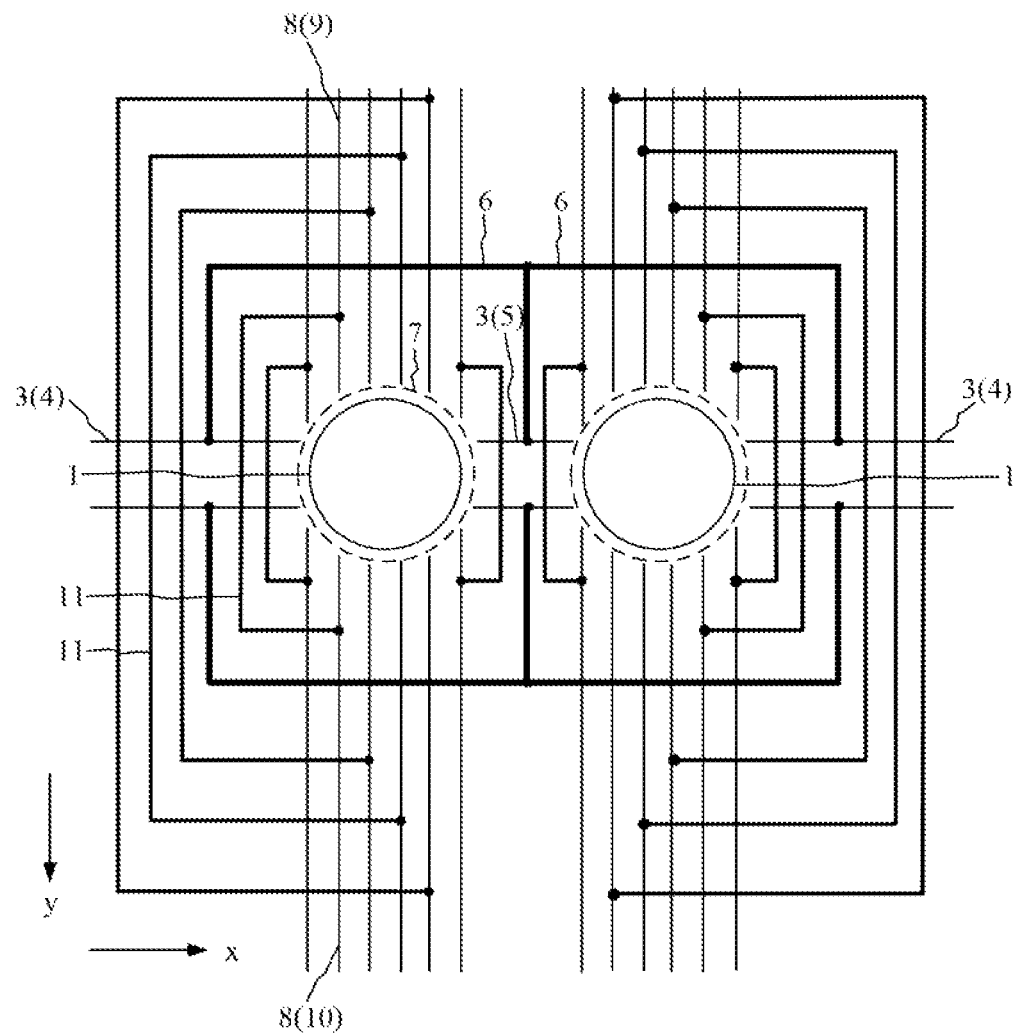
FIG. 11 is a schematic diagram showing an arrangement of a first connection line and a second connection line corresponding to FIG. 10.

FIG. 10 is another partial top view of a display panel according to some embodiments of the present disclosure. FIG. 11 is a schematic diagram showing an arrangement of the first connection line 6 and the second connection line 11 corresponding to FIG. 10. In some embodiments of the present disclosure, as shown in FIG. 10 and FIG. 11, the first connection line 6 electrically connecting the first-type signal line 3 that is broken by the light-transmitting hole 1 and the second connection line 11 electrically connecting the second-type signal line 8 that is broken by the light-transmitting hole 1 are referred to as the first connection line 6 and the second connection line 11 corresponding to the light-transmitting hole 1. For at least one light-transmitting hole 1 of the at least two light-transmitting holes 1, at least one second connection line 11 corresponding to the light-transmitting hole 1 is arranged between at least two first connection lines 6 corresponding to the light-transmitting hole 1; and/or, at least one first connection line 6 corresponding to the light-transmitting hole 1 is arranged between at least two second connection lines 11 corresponding to the light-transmitting hole 1.

In some exemplary embodiments, the at least two light-transmitting holes 1 include a first light-transmitting hole 12 and a second light-transmitting hole 13, at least one second connection line 11 corresponding to the first light-transmitting hole 12 is arranged between at least two first connection lines 6 corresponding to the first light-transmitting hole 12; and/or, at least one first connection line 6 corresponding to the first light-transmitting hole 12 is arranged between at least two second connection lines 11 corresponding to the first light-transmitting hole 12. At least one second connection line 11 corresponding to the second light-transmitting hole 13 is arranged between at least two first connection lines 6 corresponding to the second light-transmitting hole 13; and/or, at least one first connection line 6 corresponding to the second light-transmitting hole 13 is arranged between at least two second connection lines 11 corresponding to the second light-transmitting hole 13.

In embodiments of the present disclosure, the first-type signal lines 3 may be used for transmitting an emission control signal, a reset signal or a scan signal for driving a pixel circuit. When the first-type signal lines 3 are transmitting the above signals, based on the operation principal of the pixel circuit, during a frame time, the voltage of the signal transmitted by each first-type signal line 3 does not jumps frequently and may be kept at a low level or a high level in most of the frame time. Particularly, if the first-type signal line 3 transmits the reset signal, a constant voltage is continuously transmitted by the first-type signal line 3. As a result, when the first connection lines 6 are alternated with the second connection lines 11, the first connection lines 6 may function as a shielding line, so as to reduce the mutual interference between adjacent second connection lines 11.

Figure 12:
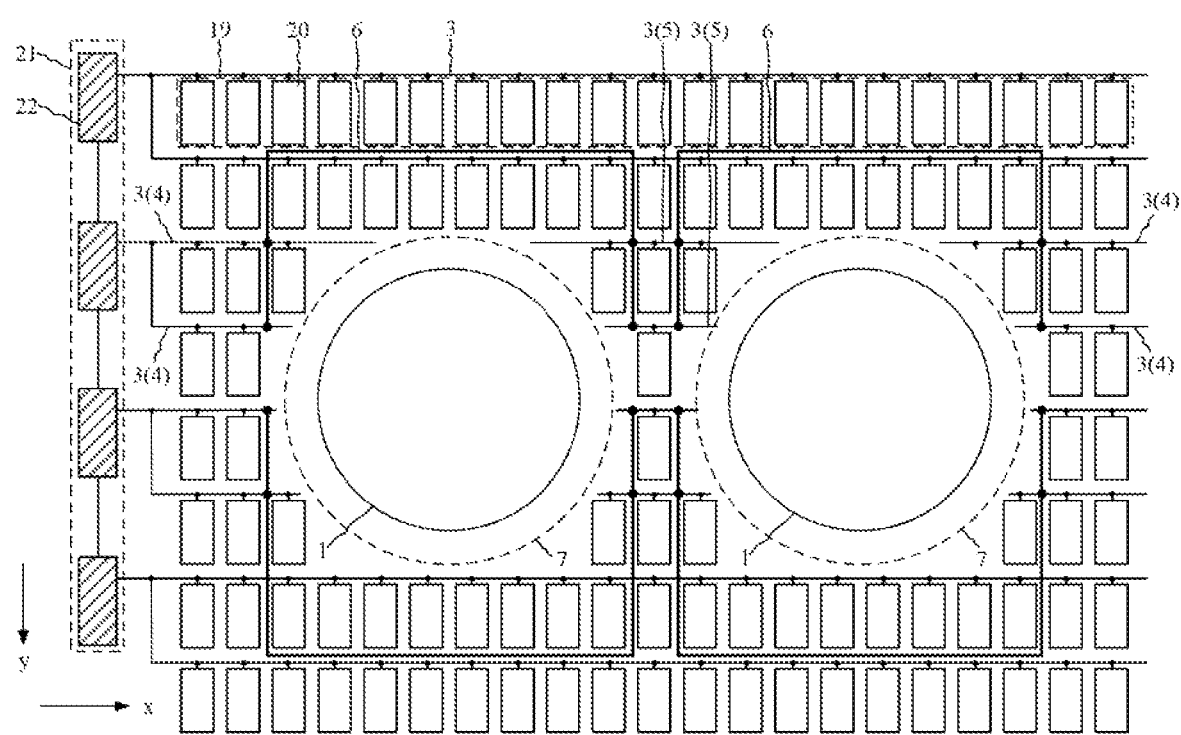
FIG. 12 is another partial top view of a display panel according to some embodiments of the present disclosure.

FIG. 12 is another partial top view of a display panel according to some embodiments of the present disclosure. In some embodiments, as shown in FIG. 12, the display panel further includes a plurality of pixel rows 19 that is arranged along the second direction y. Each of the plurality of pixel rows 19 includes a plurality of pixel circuits 20 that is arranged along the first direction x. Each of the plurality of pixel circuits 20 is electrically connected to one first-type signal line 3. The second direction y intersects the first direction x.

The display panel further includes a shift register 21. The shift register 21 includes a plurality of cascaded shift register units 22, and one of the plurality of cascaded shift units 22 is electrically connected to the first-type signal lines 3 that are electrically connected to at least two pixel rows 19.

For the first-type signal lines 3 electrically connected to the same shift unit 22 and each including segments located at two sides of the light-transmitting hole 1, the first A segments 4 or the first B segments 5, located at a same side of a same light-transmitting hole 1, in these first-type signal lines 3 are electrically connected to a same first connection line 6.

In some embodiments, the light-transmitting hole 1 includes a first side and a second side oppositely arranged along the first direction x. For the first-type signal lines 3 electrically connected to the same shift unit 22 and each including segments located at two sides of the light-transmitting hole 1, the first A segments 4 or the first B segments 5, located at the first side of the same light-transmitting hole 1, of these first-type signal lines 3 are electrically connected to the same first connection line 6, and the first A segments 4 or the first B segments 5, located at the second side of the same light-transmitting hole 1, of these first-type signal lines 3 are electrically connected to another same first connection line 6.

If the first-type signal lines 3 electrically connected to at least two pixel rows 19 are electrically connected to a same shift unit 22, these first-type signal lines 3 receive a same signal at a same time. Accordingly, in some embodiments of the present disclosure, in the arrangement of the first connection line 6 corresponding to these first-type signal lines 3, the first A segments 4 or the first B segments 5, located at a same side of a same light-transmitting hole 1, in these first-type signal lines 3 are electrically connected to a same first connection line 6. With the above arrangement, there is no need to provide an individual first connection line 6 for each of these first-type signal lines 3, and these first-type signal lines 3 are electrically connected through one first connection line 6. As a result, the number of the first connection lines 6 need to be arranged in the display panel is reduced without affecting the normal signal transmission of these first-type signal lines 3, which significantly simplifies the routing design.

Figure 13:
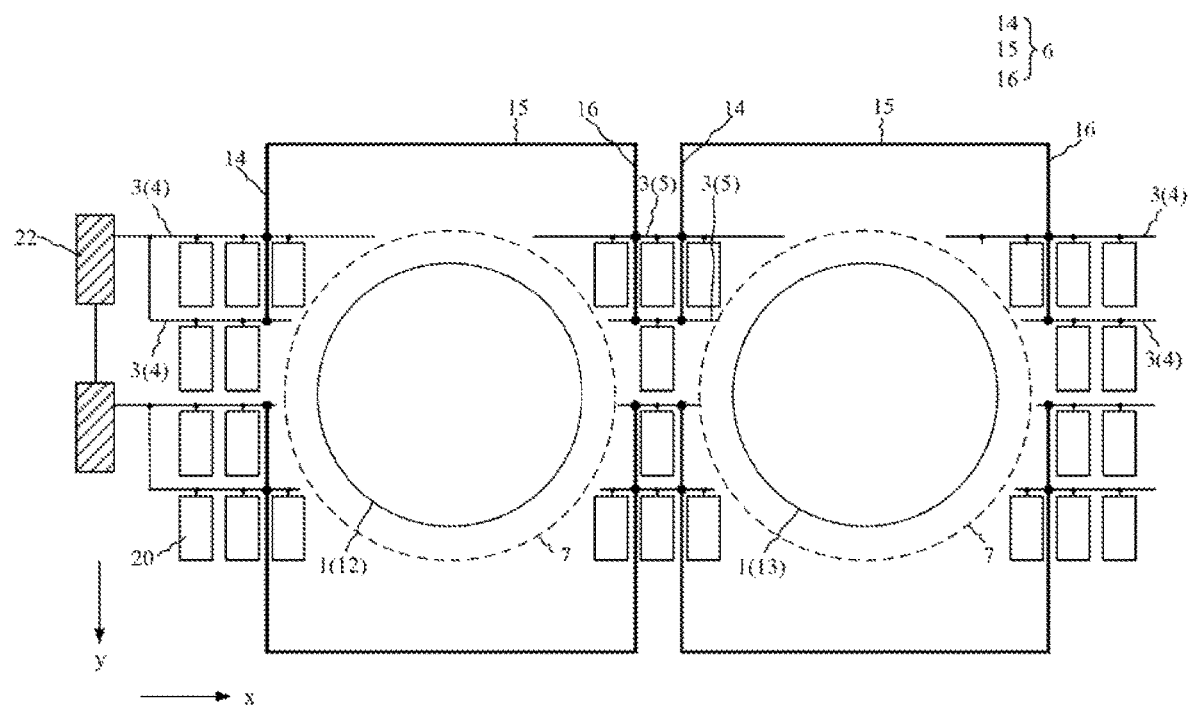
FIG. 13 is another partial top view of a display panel according to some embodiments of the present disclosure.

FIG. 13 is another partial top view of a display panel according to some embodiments of the present disclosure. In some embodiments, as shown in FIG. 13, the first connection line 6 includes a first connection segment 14, a second connection segment 15, and a third connection segment 16. Both the first connection segment 14 and the third connection segment 16 extend along the second direction y, and the second connection segment 15 extends along the first direction x.

For the first-type signal lines 3 electrically connected to a same shift unit 22 and each including segments located at two sides of the light-transmitting hole 1, the first A segments 4, located at a same side of a same light-transmitting hole 1, in these first-type signal lines 3 are electrically connected to a same first connection segment 14; and the first B segments 5, located at a same side of a same light-transmitting hole 1, in these first-type signal lines 3 are electrically connected to a same third connection segment 16 or a same first connection segment 14.

The display panel including two light-transmitting holes 1, i.e., the first light-transmitting hole 12 and the second light-transmitting hole 13 is taken as an example. For at least two first-type signal lines 3 electrically connected to the same shift unit 22 and each including segments located at two sides of the light-transmitting hole 1, the first A segments 4, located at one side of the first light-transmitting hole 12, in the at least two first-type signal lines 3 are all electrically connected to the first connection segment 14 of one first connection line 6; the first A segments 4, located at one side of the second light-transmitting hole 13, in the at least two first-type signal lines 3 are all electrically connected to the first connection segment 14 of the other first connection line 6; and the first B segments 5 in the at least two first-type signal lines 3 are all electrically connected to the third connection segments 16 of the two first connection lines 6.

In the above configuration, the extending direction of the first connection segment 14 and the third connection segment 16 intersects the extending direction of the first A segment 4 and the first B segment 5. For example, the first connection segment 14 and the third connection segment 16 extend in the vertical direction, the first A segment 4 and the first B segment 5 extend in the horizontal direction, the first connection segment 14 and the third connection segment 16 cross the first A segment 4 and the first B segment 5. In this way, multiple horizontal first A segments 4 may be electrically connected, directly through a via, to the vertical first connection segment 14 that crosses the multiple horizontal first A segments 4; and multiple horizontal first B segments 5 may be electrically connected, directly through a via, to the vertical third connection segment 16 that crosses the multiple horizontal first B segments 5. As a result, there is no need to provide additional connection lines, and the connection manner is easy to implement.

Figure 14:
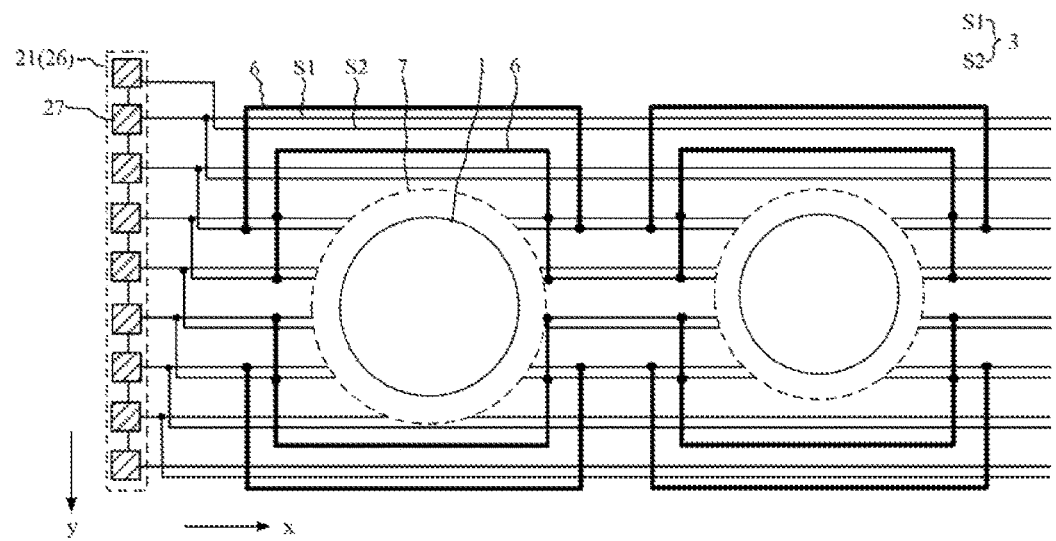
FIG. 14 is another partial top view of a display panel according to some embodiments of the present disclosure.
Figure 15:
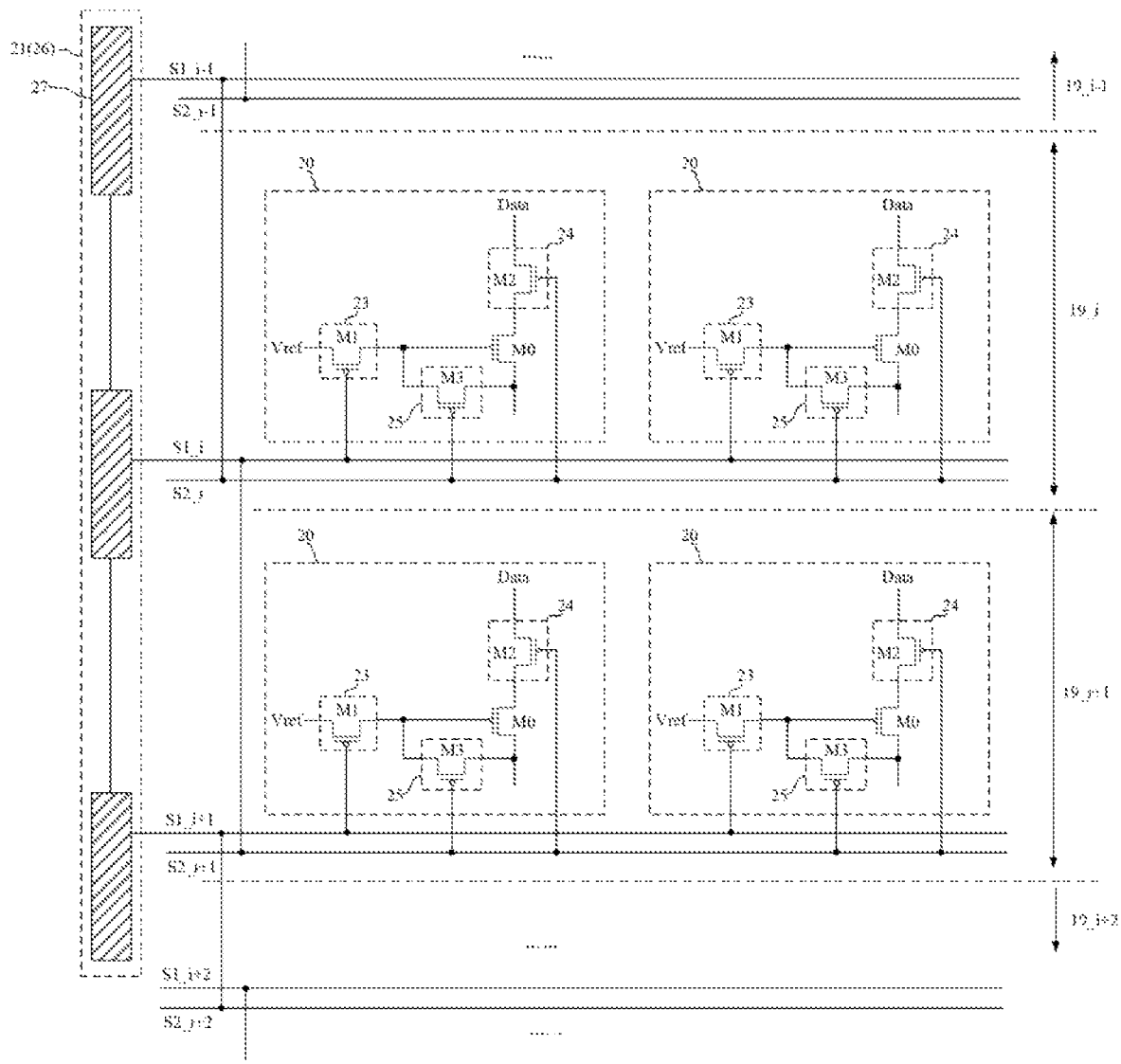
FIG. 15 is a schematic diagram showing connection of a shift register and a first-type signal line according to some embodiments of the present disclosure.

FIG. 14 is another partial top view of a display panel according to some embodiments of the present disclosure. FIG. 15 is a schematic diagram showing connection of a shift register 21 and a first-type signal line 3 according to some embodiments of the present disclosure. In some embodiments of the present disclosure, as shown in FIG. 14 and FIG. 15, the pixel circuit 20 includes: a driving transistor M0, a gate reset circuit 23, a data writing circuit 24, and a threshold voltage compensation circuit 25. The gate reset circuit 23 is electrically connected to a first scanning signal line S1, a reset signal line Vref, and a gate of the driving transistor M0. The data writing circuit 24 is electrically connected to a second scanning signal line S2, a data line Data, and a first electrode of the driving transistor M0. The threshold voltage compensation circuit 25 is electrically connected to the second scanning signal line S2, a second electrode of the driving transistor M0, and the gate of the driving transistor M0.

The first-type signal lines 3 include the first scanning signal line S1 and the second scanning signal line S2. The shift register 21 includes a first shift register 26, and the first shift register 26 includes a plurality of cascaded first shift units 27. For two adjacent pixel rows 19, the second scanning signal line S2 electrically connected to the preceding pixel row 19 and the first scanning signal line S1 electrically connected to the succeeding pixel row 19 are electrically connected to a same first shift unit 27.

It should be understood that in FIG. 15, the i-th pixel row 19_i is denoted by the reference numeral 19_i. Accordingly, the first scanning signal line S1 and the second scanning signal line S2 electrically connected to the i-th pixel row 19_i are denoted by the reference numerals S1_i and S2_i, respectively. In addition, it should be noted that the circuit structure illustrated in FIG. 15 is not a complete circuit structure of the pixel circuit 20. For the complete circuit structure of the pixel circuit 20 illustrated in FIG. 15, reference can be made to FIG. 16.

Figure 16:
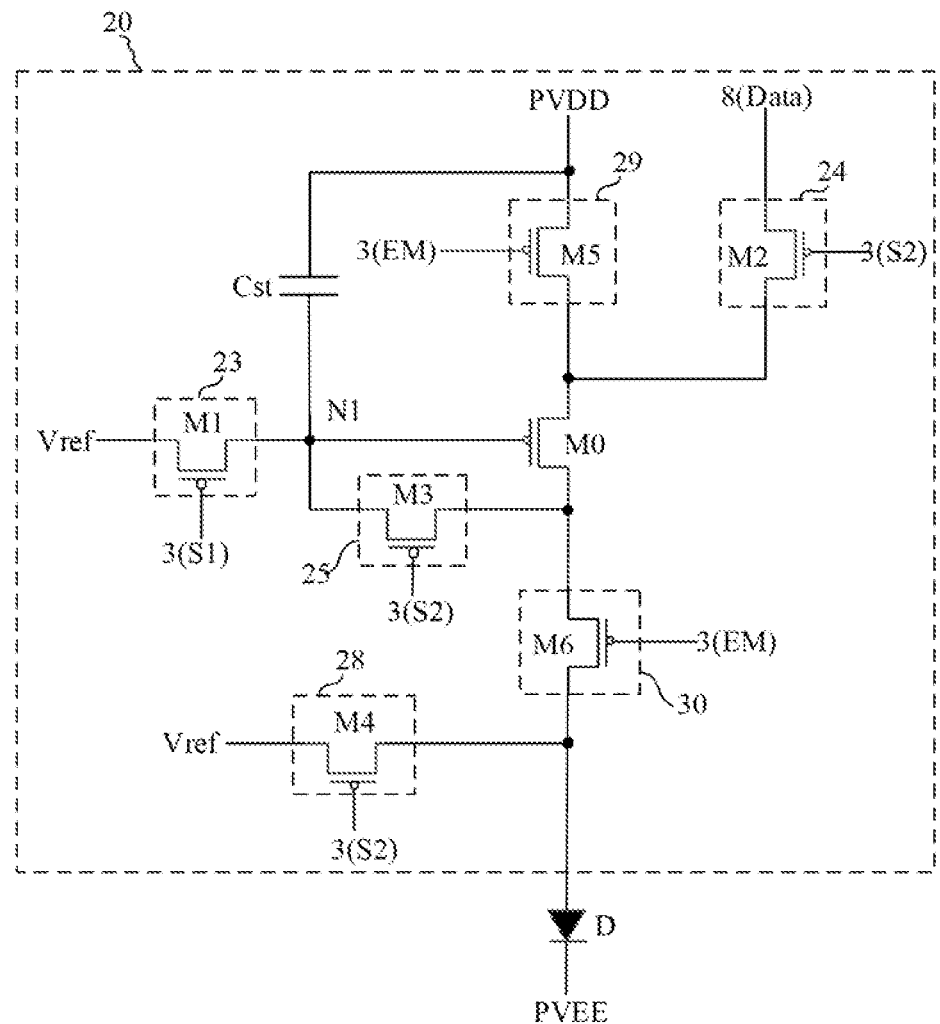
FIG. 16 is a schematic diagram of a pixel circuit according to some embodiments of the present disclosure.

FIG. 16 is a schematic diagram of a pixel circuit 20 according to some embodiments of the present disclosure. As shown in FIG. 16, the gate reset circuit 23 includes a gate reset transistor M1. The gate reset transistor M1 includes a gate electrically connected to the first scanning signal line S1, a first electrode electrically connected to the reset signal line Vref, and a second electrode electrically connected to the gate of the driving transistor M0.

The data writing circuit 24 includes a data writing transistor M2. The data writing transistor M2 includes a gate electrically connected to the second scanning signal line S2, a first electrode electrically connected to the data line Data, and a second electrode electrically connected to the first electrode of the driving transistor M0.

The threshold voltage compensation circuit 25 includes a threshold voltage compensation transistor M3. The threshold voltage compensation transistor M3 includes a gate electrically connected to the second scanning signal line S2, a first electrode electrically connected to the second electrode of the driving transistor M0, and a second electrode electrically connected to the gate of the driving transistor M0.

The pixel circuit 20 further includes an anode reset circuit 28, a first light-emitting control circuit 29, a second light-emitting control circuit 30, and a storage capacitor Cst.

The anode reset circuit 28 includes an anode reset transistor M4. The anode reset transistor M4 includes a gate electrically connected to the second scanning signal line S2, a first electrode electrically connected to the reset signal line Vref, and a second electrode electrically connected to an anode of a light-emitting element D.

The first light-emitting control circuit 29 includes a first emission control transistor M5. The first emission control transistor M5 includes a gate electrically connected to a light-emitting control signal line EM, a first electrode electrically connected to a power supply signal line PVDD, and a second electrode electrically connected to the first electrode of the driving transistor M0.

The second light-emitting control circuit 30 includes a second emission control transistor M6. The second emission control transistor M6 includes: a gate electrically connected to the light-emitting control signal line EM, a first electrode electrically connected to the second electrode of the driving transistor M0, and a second electrode electrically connected to the anode of the light-emitting element D.

The storage capacitor Cst includes: a first plate electrically connected to the power supply signal line PVDD, and a second plate electrically connected to the gate of the driving transistor M0.

In some embodiments, the driving transistor M0, the gate reset transistor M1, the data writing transistor M2, the threshold voltage compensation transistor M3, the anode reset transistor M4, the first light-emitting control circuit 29, and the second emission control transistor M6 may all be p-type low temperature polysilicon (LTPS) transistors.

Figure 17:
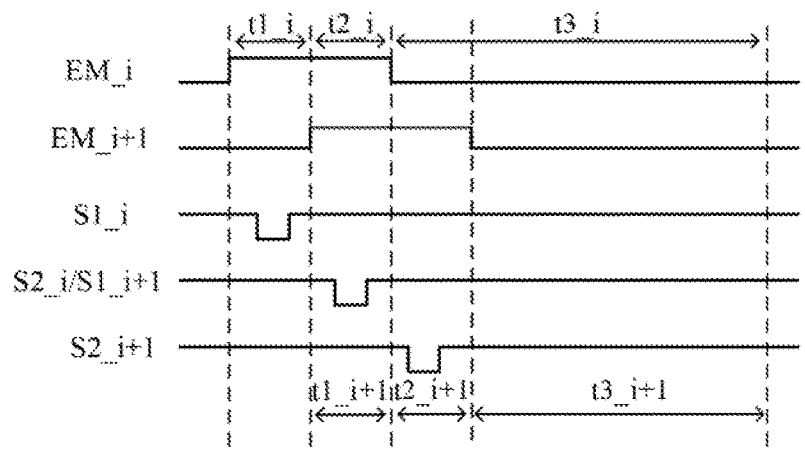
FIG. 17 is a timing diagram according to some embodiments of the present disclosure.

FIG. 17 is a timing diagram according to some embodiments of the present disclosure. As shown in FIG. 17, a working process of the pixel circuit 20 includes: an initialization phase t1, a charging phase t2, and a light-emitting phase t3. It should be noted that FIG. 17 illustrates the drive timing of the pixel circuit 20 in the i-th pixel row 19_i and the drive timing of the pixel circuit 20 in the (i+1)-th pixel row 19_i+1, the reference numerals t1_i, t2_i, and t3_i correspond to the work phases of the pixel circuit 20 in the i-th pixel row 19_i, and the reference numerals t1_i+1, t2_i+1, and t3_i+1 correspond to the work phases of the pixel circuit 20 in the (i+1)-th pixel row 19_i+1.

In the initialization phase t1_1 of the pixel circuit 20 in the i-th pixel row 19_i, the first scanning signal line S1_i corresponding to the i-th pixel row 19_i provides a low level, and in the pixel circuit 20 in the i-th pixel row 19_i, a reset voltage provided by the reset signal line Vref is inputted to the gate of the driving transistor M0 through the gate reset transistor M1, so as to reset the gate of the driving transistor M0.

In the charging phase t2_i of the pixel circuit 20 in the i-th pixel row 19_i, the second scanning signal line S2_i corresponding to the i-th pixel row 19_i provides a low level. In the pixel circuit 20 in the i-th pixel row 19_i, the data voltage provided by the data line Data is inputted to the first electrode of the driving transistor M0 through the data writing transistor M2, and the data voltage is also inputted to the gate of the driving transistor M0 through the threshold voltage compensation transistor M3, so as to compensate the threshold voltage of the driving transistor M0. Meanwhile, a reset voltage provided by the reset signal line Vref is inputted to the anode of the light-emitting element D through the anode reset transistor M4, so as to reset the anode of the light-emitting element D.

Since the second scanning signal line S2_i corresponding to the i-th pixel row 19_i and the first scanning signal line S1_i+1 corresponding to the (i+1)-th pixel row 19_i+1 are electrically connected to the same first shift unit 27, the period of the charging phase of the i-th pixel row 19_i is also the initialization phase t1_1+1 of the pixel circuit 20 in the (i+1)-th pixel row 19_i+1. In the initialization phase t1_1+1, in the pixel circuit 20 in the (i+1)-th pixel row 19_i+1, the reset voltage provided by the reset signal line Vref is inputted to the gate of the driving transistor M0 through the gate reset transistor M1, so as to reset the gate of the driving transistor M0.

In the light-emitting phase t3_i of the pixel circuit 20 in the i-th pixel row 19_i, the light-emitting control signal line EM_i corresponding to the i-th pixel row 19_i provides a low level. In the pixel circuit 20 in the i-th pixel row 19_i, the power supply voltage provided by the power supply signal line PVDD is inputted to the first electrode of the driving transistor M0 through the first emission control transistor M5, and a drive current generated by the driving transistor M0 according to the power supply voltage and the data voltage is transmitted to the anode of the light-emitting element D through the second emission control transistor M6, so as to drive the light-emitting element D to emit light.

The front part of the light-emitting phase t3_$i$ of the pixel circuit 20 in the i-th pixel row 19_$i$ corresponds to the charging phase t2_$i$+1 of the pixel circuit 20 in the (i+1)-th pixel row 19_$i$+1. In the charging phase t2_$i$+1, the second scanning signal line S2_$i$+1 corresponding to the (i+1)-th pixel row 19_$i$+1 provides a low level. In the pixel circuit 20 in the (i+1)-th pixel row 19_$i$+1, the data voltage provided by the data line Data is inputted to the first electrode of the driving transistor M0 through the data writing transistor M2, and the data voltage is also inputted to the gate of the driving transistor M0 through the threshold voltage compensation transistor M3, so as to compensate the threshold voltage of the driving transistor M0. Meanwhile, in the pixel circuit 20 in the (i+1)-th pixel row 19_$i$+1, the reset voltage provided by the reset signal line Vref is inputted to the anode of the light-emitting element D through the anode reset transistor M4, so as to reset the anode of the light-emitting element D.

In the light-emitting phase t3_$i$+1 of the pixel circuit 20 in the (i+1)-th pixel row 19_$i$+1, the light-emitting control signal line EM_$i$+1 corresponding to the (i+1)-th pixel row 19_$i$+1 provides a low level. In the pixel circuit 20 in the (i+1)-th pixel row 19_$i$+1, the power supply voltage provided by the power supply signal line PVDD is inputted to the first electrode of the driving transistor M0 through the first emission control transistor M5, and a drive current generated by the driving transistor M0 according to the power supply voltage and the data voltage is transmitted to the anode of the light-emitting element D through the second emission control transistor M6, so as to drive the light-emitting element D to emit light.

For two adjacent pixel rows 19, the second scanning signal line S2 connected to the preceding pixel row 19 and the first scanning signal line S1 connected to the succeeding pixel row 19 are electrically connected to the same first shift unit 27. When the pixel circuit 20 in the preceding pixel row 19 performs the charging operation, the pixel circuit 20 in the succeeding pixel row 19 performs the initialization operation synchronously, and such arrangement still can ensure the normal operation of multiple pixel rows 19.

The first scanning signal line Si and the second scanning signal line S2 that receive a same signal are electrically connected to the same first connection line 6, and thus the number of the first connection lines 6 required in the display panel is reduced, thereby simplifying the routing design.

Figure 18:
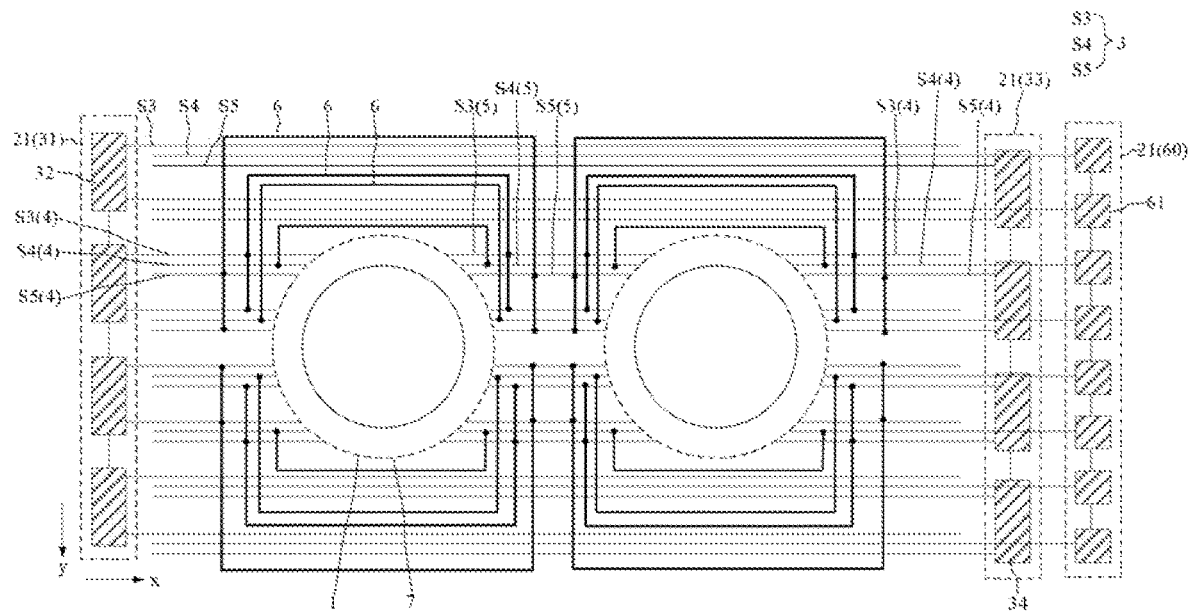
FIG. 18 is another partial top view of a display panel according to some embodiments of the present disclosure.
Figure 19:
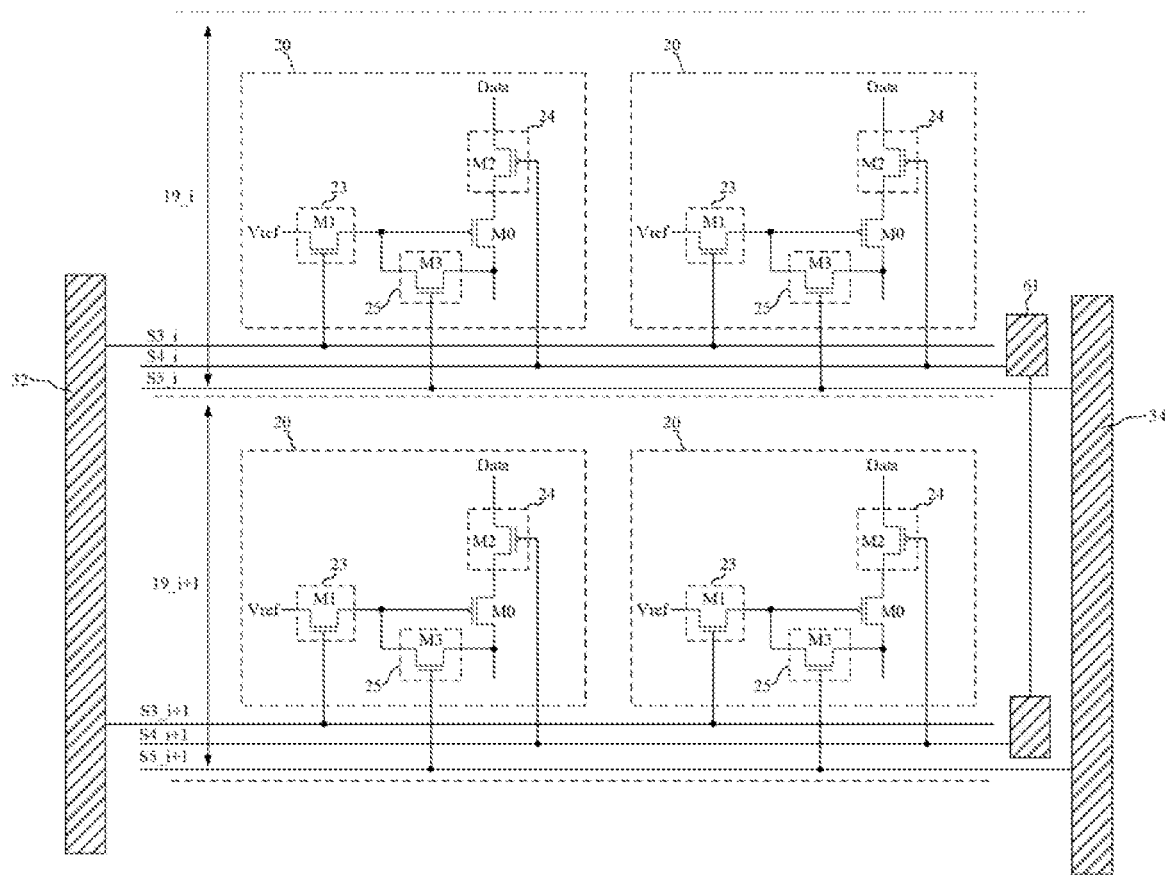
FIG. 19 is another schematic diagram showing connection of a shift register and a first-type signal line according to some embodiments of the present disclosure.

FIG. 18 is another partial top view of a display panel according to some embodiments of the present disclosure. FIG. 19 is another schematic diagram showing connection of a shift register 21 and a first-type signal line 3 according to some embodiments of the present disclosure. In some embodiments, as shown in FIG. 18 and FIG. 19, the pixel circuit 20 includes: a driving transistor M0, a gate reset circuit 23, a data writing circuit 24, and a threshold voltage compensation circuit 25. The gate reset circuit 23 is electrically connected to a third scanning signal line S3, a reset signal line Vref, and a gate of the driving transistor M0. The data writing circuit 24 is electrically connected to a fourth scanning signal line S4, a data line Data, and a first electrode of the driving transistor M0. The threshold voltage compensation circuit 25 is electrically connected to a fifth scanning signal line S5, a second electrode of the driving transistor M0, and the gate of the driving transistor M0.

The first-type signal lines 3 include the third scanning signal line S3, and the shift register 21 includes a second shift register 31. The second shift register 31 includes a plurality of cascaded second shift units 32. The second shift unit 32 is electrically connected to the third scanning signal lines S3 of at least two pixel rows 19.

In some embodiments, the first-type signal lines 3 include the fifth scanning signal line S5, and the shift register 21 includes a third shift register 33. The third shift register 33 includes a plurality of cascaded third shift units 34. The third shift unit 34 is electrically connected to the fifth scanning signal lines S5 that are connected to at least two pixel rows 19.

It should be understood that the circuit structure illustrated in FIG. 19 is not a complete circuit structure of the pixel circuit 20. For the complete circuit structure of the pixel circuit 20 illustrated in FIG. 19, reference can be made to FIG. 20.

Figure 20:
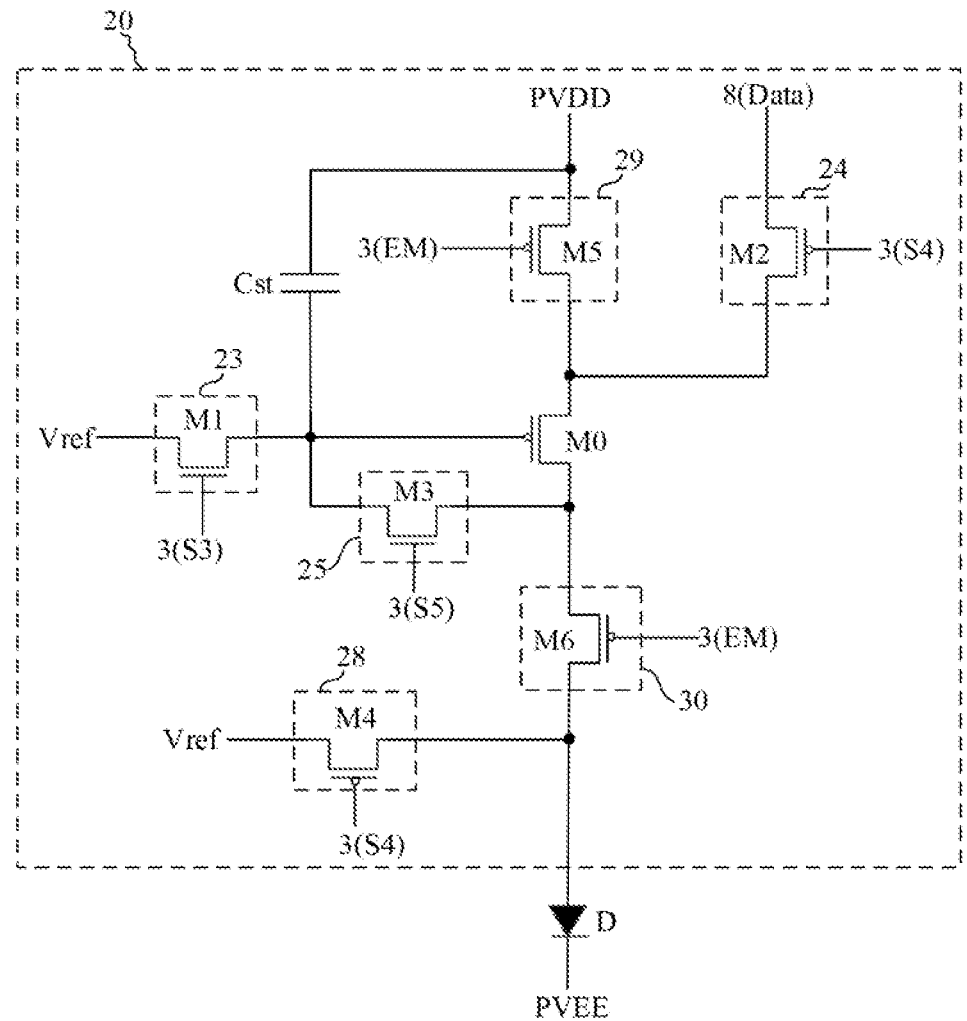
FIG. 20 is another schematic structural diagram of a pixel circuit according to some embodiments of the present disclosure.

FIG. 20 is another schematic structural diagram of a pixel circuit according to some embodiments of the present disclosure. As shown in FIG. 20, the gate reset circuit 23 includes a gate reset transistor M1, and the gate reset transistor M1 includes: a gate electrically connected to the third scanning signal line S3, a first electrode electrically connected to the reset signal line Vref, and a second electrode electrically connected to the gate of the driving transistor M0.

The data writing circuit 24 includes a data writing transistor M2. The data writing transistor M2 includes: a gate electrically connected to the fourth scanning signal line S4, a first electrode electrically connected to the data line Data, and a second electrode electrically connected to the first electrode of the driving transistor M0.

The threshold voltage compensation circuit 25 includes a threshold voltage compensation transistor M3. The threshold voltage compensation transistor M3 includes: a gate electrically connected to the fifth scanning signal line S5, a first electrode electrically connected to the second electrode of the driving transistor M0, and a second electrode electrically connected to the gate of the driving transistor M0.

The pixel circuit 20 further includes: an anode reset circuit 28, a first light-emitting control circuit 29, a second light-emitting control circuit 30, and a storage capacitor Cst.

The anode reset circuit 28 includes an anode reset transistor M4. The anode reset transistor M4 includes: a gate electrically connected to the fourth scanning signal line S4, a first electrode electrically connected to the reset signal line Vref, and a second electrode electrically connected to an anode of a light-emitting element D.

The first light-emitting control circuit 29 includes a first emission control transistor M5. The first emission control transistor M5 includes: a gate electrically connected to a light-emitting control signal line EM, a first electrode electrically connected to a power supply signal line PVDD, and a second electrode electrically connected to the first electrode of the driving transistor M0.

The second light-emitting control circuit 30 includes a second emission control transistor M6. The second emission control transistor M6 includes: a gate electrically connected to the light-emitting control signal line EM, a first electrode electrically connected to the second electrode of the driving transistor M0, and a second electrode electrically connected to the anode of the light-emitting element D.

The storage capacitor Cst includes: a first plate electrically connected to the power supply signal line PVDD, and a second plate electrically connected to the gate of the driving transistor M0.

In some embodiments, the driving transistor M0, the data writing transistor M2, the anode reset transistor M4, the first light-emitting control circuit 29, and the second emission control transistor M6 may all be P-type LTPS transistors;

and the gate reset transistor M1 and the threshold voltage compensation transistor M3 may be N-type indium gallium zinc oxide (IGZO) transistors, so as to reduce the affecting of the leakage current of the gate reset transistor M1 and the threshold voltage compensation transistor M3 on the gate potential of the driving transistor M0.

Figure 21:
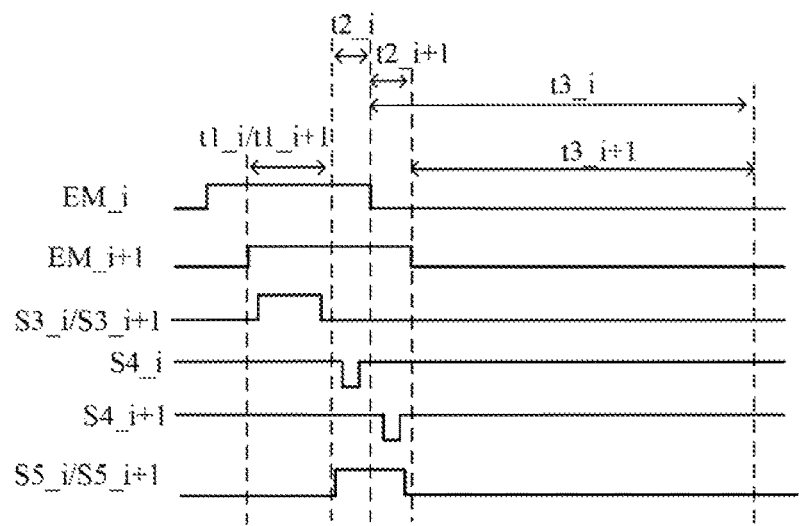
FIG. 21 is another timing diagram according to some embodiments of the present disclosure.

FIG. 21 is a timing diagram according to some embodiments of the present disclosure. As shown in FIG. 21, a working process of the pixel circuit 20 includes: an initialization phase t1, a charging phase t2, and a light-emitting phase t3. It should be noted that FIG. 21 illustrates the drive timing of the pixel circuit 20 in the i-th pixel row 19_i and the drive timing of the pixel circuit 20 in the (i+1)-th pixel row 19_i+1, the reference numerals t1_i, t2_i, and t3_i correspond to the work phases of the pixel circuit 20 in the i-th pixel row 19_i, and the reference numerals t1_i+1, t2_i+1, and t3_i+1 correspond to the work phases of the pixel circuit 20 in the (i+1)-th pixel row 19_i+1.

In the initialization phase t1_1 of the i-th pixel row 19_i and the initialization phase t1_1+1 of the (i+1)-th pixel row 19_i+1, both the third scanning signal line S3_i corresponding to the i-th pixel row 19_i and the third scanning signal line S3_i+1 corresponding to the (i+1)-th pixel row 19_i+1 provide a high level. In the pixel circuit 20 in the i-th pixel row 19_i and the pixel circuit 20 in the (i+1)-th pixel row 19_i+1, a reset voltage provided by the reset signal line Vref is inputted to the gate of the driving transistor M0 through the gate reset transistor M1, so as to reset the gate of the driving transistor M0.

In the charging phase t2_i of the i-th pixel row 19_i, the fourth scanning signal line S4_i corresponding to the i-th pixel row 19_i provides a low level, and both the fifth scanning signal line S5_i corresponding to the i-th pixel row 19_i and the fifth scanning signal line S5_i+1 corresponding to the (i+1)-th pixel row 19_i+1 provide a high level. In the pixel circuit 20 in the i-th pixel row 19_i, the data voltage provided by the data line Data is inputted to the first electrode of the driving transistor M0 through the data writing transistor M2, and the data voltage is also inputted to the gate of the driving transistor M0 through the threshold voltage compensation transistor M3, so as to compensate the threshold voltage of the driving transistor M0. Meanwhile, the reset voltage provided by the reset signal line Vref is inputted to the anode of the light-emitting element D through the anode reset transistor M4, so as to reset the anode of the light-emitting element D.

In the charging phase t2_i+1 of the (i+1)-th pixel row 19_i+1, the fourth scanning signal line S4_i+1 corresponding to the (i+1)-th pixel row 19_i+1 provides a low level, and both the fifth scanning signal line S5_i corresponding to the i-th pixel row 19_i and the fifth scanning signal line S5_i+1 corresponding to the (i+1)-th pixel row 19_i+1 provide a high level. In the pixel circuit 20 in the (i+1)-th pixel row 19_i+1, the data voltage provided by the data line Data is inputted to the first electrode of the driving transistor M0 through the data writing transistor M2, and the data voltage is also inputted to the gate of the driving transistor M0 through the threshold voltage compensation transistor M3, so as to compensate the threshold voltage of the driving transistor M0. Meanwhile, the reset voltage provided by the reset signal line Vref is inputted to the anode of the light-emitting element D through the anode reset transistor M4, so as to reset the anode of the light-emitting element D.

In the light-emitting phase t3_i of the pixel circuit 20 in the i-th pixel row 19_i, the light-emitting control signal line EM_i corresponding to the i-th pixel row 19_i provides a low level. In the pixel circuit 20 in the i-th pixel row 19_i, the power supply voltage provided by the power supply signal line PVDD is inputted to the first electrode of the driving transistor M0 through the first emission control transistor M5, and a drive current generated by the driving transistor M0 according to the power supply voltage and the data voltage is transmitted to the anode of the light-emitting element D through the second emission control transistor M6, so as to drive the light-emitting element D to emit light.

In the light-emitting phase t3_i+1 of the pixel circuit 20 in the (i+1)-th pixel row 19_i+1, the light-emitting control signal line EM_i_1 corresponding to the (i+1)-th pixel row 19_i+1 provides a low level. In the pixel circuit 20 in the (i+1)-th pixel row 19_i+1, the power supply voltage provided by the power supply signal line PVDD is inputted to the first electrode of the driving transistor M0 through the first emission control transistor M5, and a drive current generated by the driving transistor M0 according to the power supply voltage and the data voltage is transmitted to the anode of the light-emitting element D through the second emission control transistor M6, so as to drive the light-emitting element D to emit light.

When the second shift unit 32 is electrically connected to the third scanning signal lines S3 of at least two pixel rows 19, and the third shift unit 34 is electrically connected to the fifth scanning signal lines S5 of at least two pixel rows 19, the at least two pixel rows 19 may perform the initialization operation synchronously, and perform the charging operation separately.

With the arrangement that the third scanning signal lines S3 receiving the same signal are electrically connected to the same first connection line 6 and the fifth scanning signal lines S5 receiving the same signal are electrically connected to the same first connection line 6, the number of the first connection lines 6 required in the display panel is reduced, and thus the routing design is simplified.

As shown in FIG. 18, the first-type signal lines 3 may include the fourth scanning signal line S4, and the display panel further includes a sixth shift register 60. The sixth shift register 60 includes a plurality of cascaded sixth shift units 61. One sixth shift unit 60 is electrically connected to one fourth scanning signal line S4. Different fourth scanning signal lines S4 may be electrically connected to different first connection lines 6.

Figure 22:
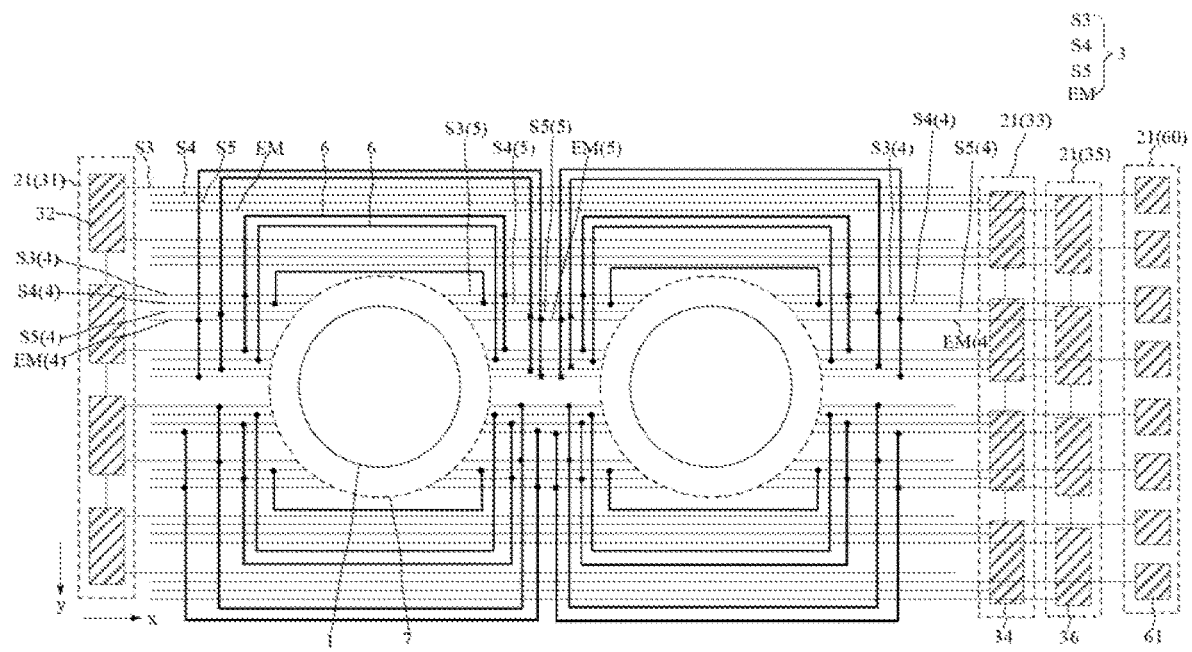
FIG. 22 is another partial top view of a display panel according to some embodiments of the present disclosure.
Figure 23:
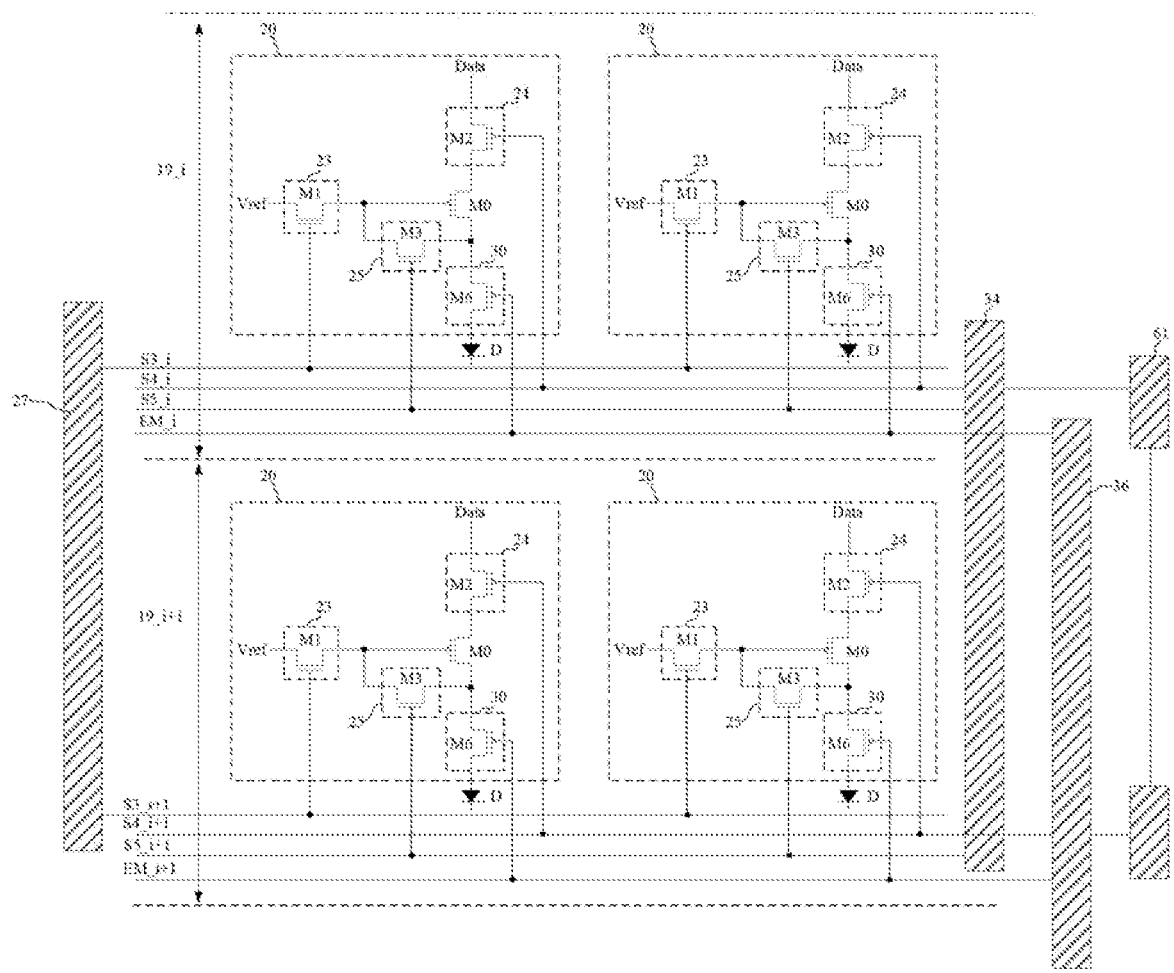
FIG. 23 is another schematic diagram showing connection of a shift register and a first-type signal line according to some embodiments of the present disclosure.

FIG. 22 is another partial top view of a display panel according to some embodiments of the present disclosure. FIG. 23 is another schematic diagram showing connection of a shift register 21 and a first-type signal line 3 according to some embodiments of the present disclosure. In some embodiments, as shown in FIG. 22 and FIG. 23, the pixel circuit 20 includes a driving transistor M0 and a second light-emitting control circuit 30. The second light-emitting control circuit 30 is electrically connected to an light-emitting control signal line EM, a second electrode of the driving transistor M0, and a light-emitting element D.

The first-type signal lines 3 include the light-emitting control signal line EM. The shift register 21 includes a fourth shift register 35, and the fourth shift register 35 includes a plurality of cascaded fourth shift units 36. Each fourth shift unit 36 is electrically connected to the light-emitting control signal lines EM of at least two pixel rows 19.

It should be understood that the circuit structure illustrated in FIG. 23 is not a complete circuit structure of the pixel circuit 20. For the complete circuit structure of the pixel circuit 20 illustrated in FIG. 23, reference can be made to FIG. 20.

Figure 24:
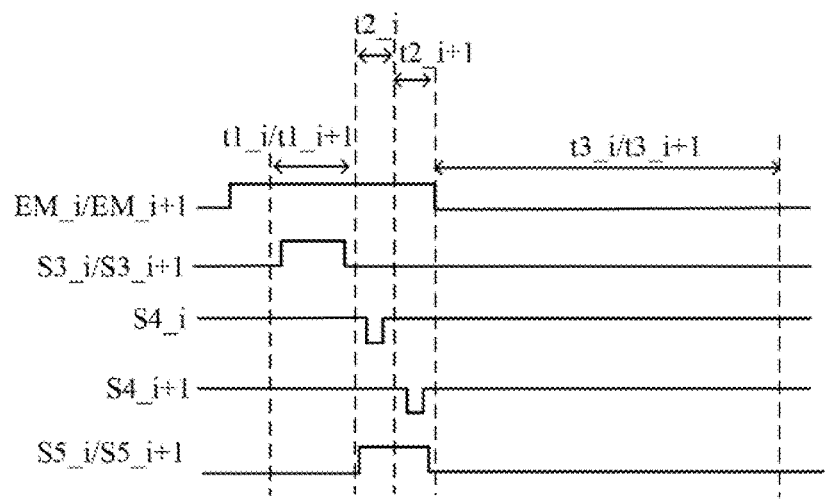
FIG. 24 is another timing diagram according to some embodiments of the present disclosure.

FIG. 24 is another timing diagram according to some embodiments of the present disclosure. Based on the above structure, as shown in FIG. 24, a working process of the pixel circuit 20 includes: an initialization phase t1, a charging phase t2, and a light-emitting phase t3. It should be understood that FIG. 24 illustrates the drive timing of the pixel circuit 20 in the i-th pixel row 19_$i$ and the drive timing of the pixel circuit 20 in the (i+1)-th pixel row 19_$i$+1, the reference numerals t1__$i$, t2_$i$, and t3_$i$ correspond to the work phases of the pixel circuit 20 in the i-th pixel row 19_$i$, and the reference numerals t1_$i$+1, t2_$i$+1, and t3_$i$+1 correspond to the work phases of the pixel circuit 20 in the (i+1)-th pixel row 19 $i$+1. The working principle of the pixel circuit 20 in the initialization phase t1, the charging phase t2, and the light-emitting phase t3 is same as that in the above embodiments and is not repeated herein.

It should be understood that in the working process of the pixel circuit 20 in the i-th pixel row 19_$i$ and the working process of the pixel circuit 20 in the (i+1)-th pixel row 19_$i$+1, when the light-emitting control signal line EM corresponding to the i-th pixel row 19_$i$ and the light-emitting control signal line EM corresponding to the (i+1)-th pixel row 19_$i$+1 are electrically connected to the same fourth shift unit 36, in order to ensure the normal working of the pixel circuit 20, the duration of the high level of the emission control signal needs to cover the duration of the high level of the third scan signal corresponding to the i-th pixel row 19_$i$, the duration of the high level of the third scan signal corresponding to the (i+1)-th pixel row 19_$i$+1, the duration of the low level of the fourth scan signal corresponding to the i-th pixel row 19_$i$, the duration of the low level of the fourth scan signal corresponding to the (i+1)-th pixel row 19_$i$+1, the duration of the high level of the fifth scan signal corresponding to the i-th pixel row 19_$i$, and the duration of the high level of the fifth scan signal corresponding to the (i+1)-th pixel row 19_$i$+1.

In the present embodiment, the light-emitting control signal lines EM receiving the same signal are electrically connected to the same first connection line 6, and thus the number of the first connection lines 6 required in the display panel is reduced, thereby simplifying the routing design.

Figure 25:
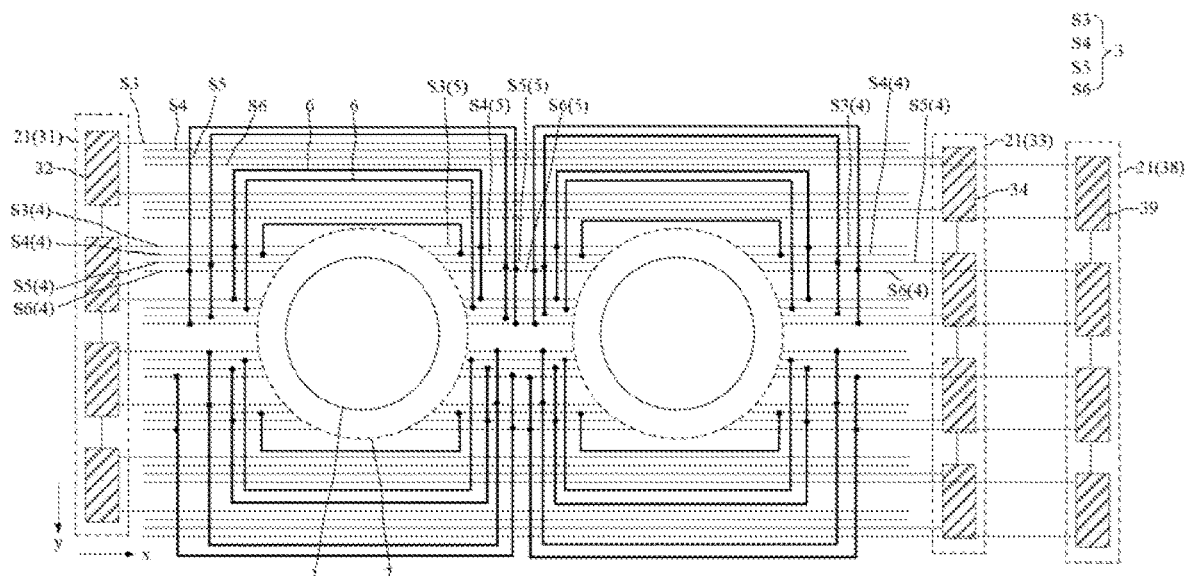
FIG. 25 is another partial top view of a display panel according to some embodiments of the present disclosure.
Figure 26:
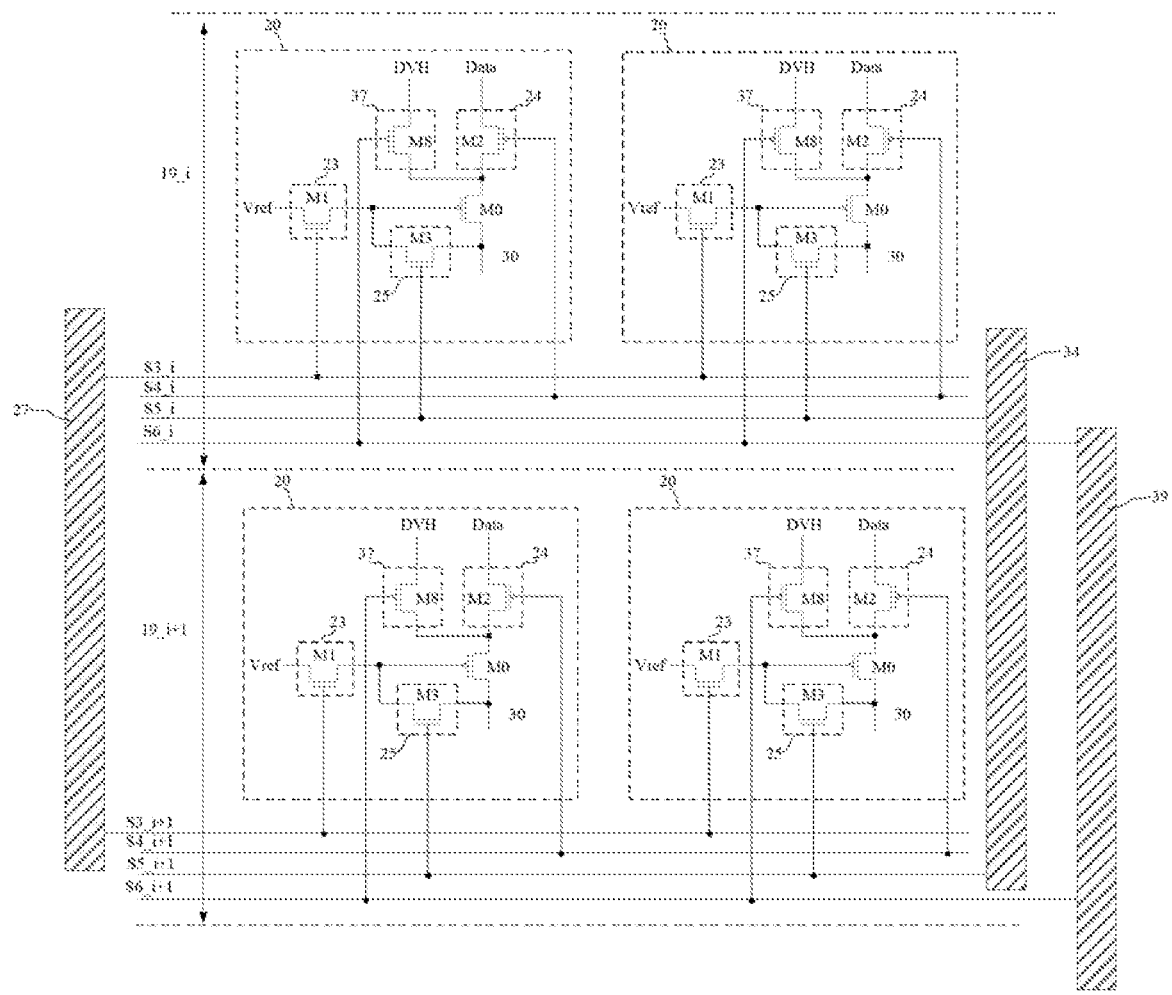
FIG. 26 is another schematic diagram showing connection of a shift register and a first-type signal line according to some embodiments of the present disclosure.

FIG. 25 is another partial top view of a display panel according to some embodiments of the present disclosure. FIG. 26 is another schematic diagram showing connection of a shift register 21 and a first-type signal line 3 according to some embodiments of the present disclosure. In some embodiments, as shown in FIG. 25 and FIG. 26, the pixel circuit 20 includes a driving transistor M0 and a bias adjusting circuit 37. The bias adjusting circuit 37 is electrically connected to a sixth scanning signal line S6, a bias signal line DVH, and a first electrode of the driving transistor M0.

The first-type signal lines 3 include the sixth scanning signal line S6. The shift register 21 includes a fifth shift register 38, and the fifth shift register 38 includes a plurality of cascaded fifth shift units 39. The fifth shift unit 39 is electrically connected to the sixth scanning signal lines S6 of at least two pixel rows 19.

It should be understood that the circuit structure illustrated in FIG. 26 is not a complete circuit structure of the pixel circuit 20. For the complete circuit structure of the pixel circuit 20 illustrated in FIG. 26, reference can be made to FIG. 27.

Figure 27:
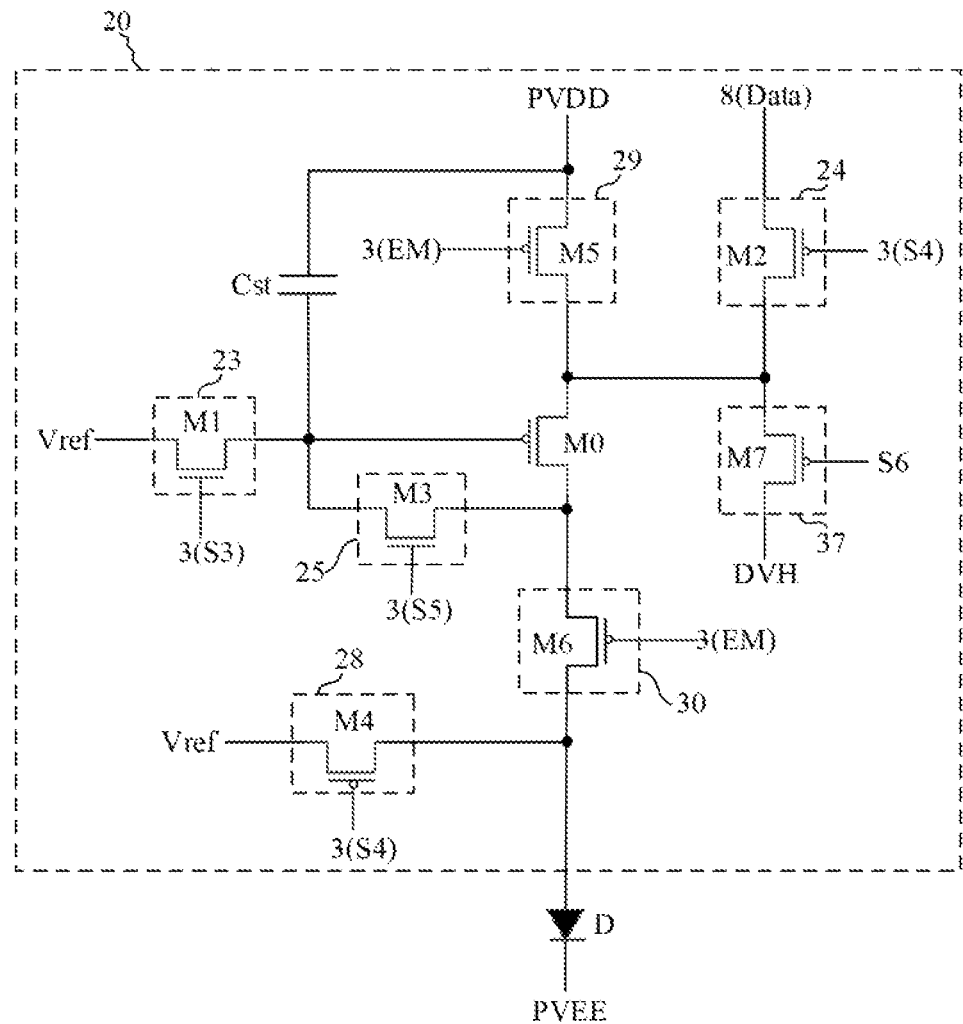
FIG. 27 is another schematic structural diagram of a pixel circuit according to some embodiments of the present disclosure.

FIG. 27 is another schematic structural diagram of a pixel circuit according to some embodiments of the present disclosure. As shown in FIG. 27, the bias adjusting circuit 37 includes a bias adjust transistor M7. The bias adjust transistor M7 includes: a gate electrically connected to the sixth scanning signal line S6, a first electrode electrically connected to the bias signal line DVH, and a second electrode electrically connected to a first electrode of the driving transistor M0.

In some embodiments, the pixel circuit 20 includes a gate reset circuit 23, a data writing circuit 24, a threshold voltage compensation circuit 25, an anode reset circuit 28, a first light-emitting control circuit 29, a second light-emitting control circuit 30, and a storage capacitor Cst. The connection manner and function of these elements have been described in details in the above embodiments, and are not repeated herein.

Figure 28:
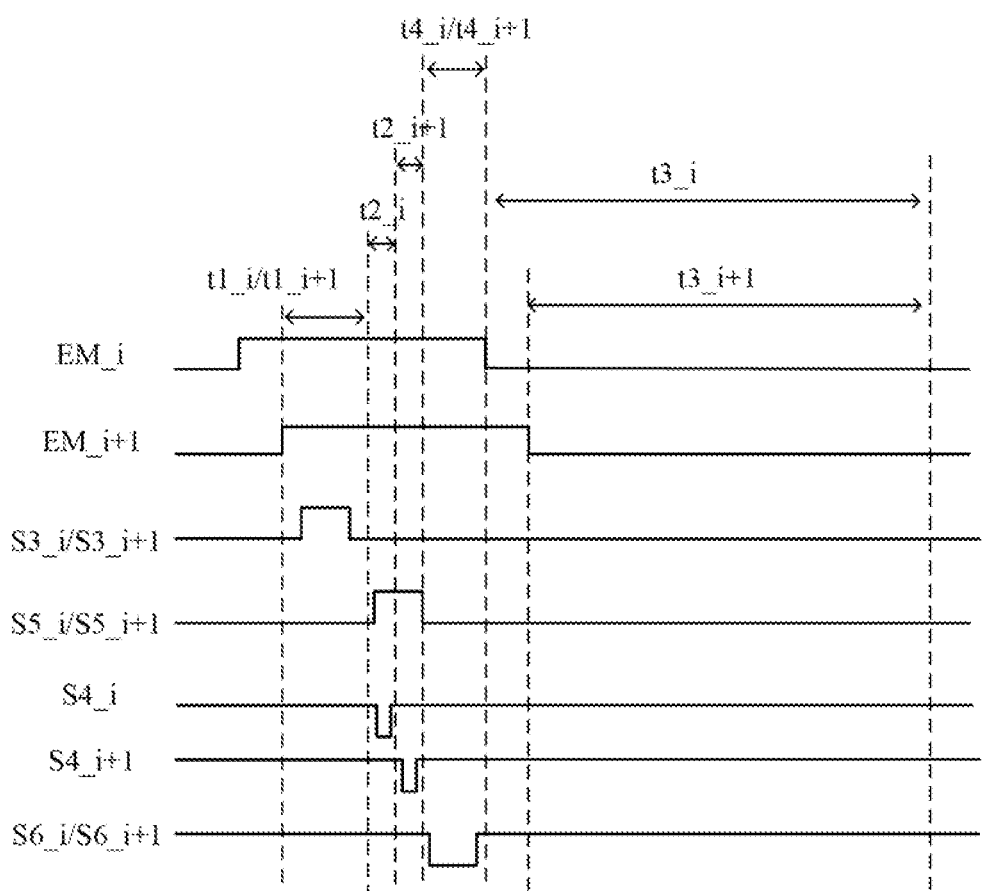
FIG. 28 is another timing diagram according to some embodiments of the present disclosure.

FIG. 28 is another timing diagram according to some embodiments of the present disclosure. As shown in FIG. 28, in addition to the initialization phase t1, the charging phase t2, and the light-emitting phase t3, the working process of the pixel circuit 20 also includes an adjusting phase t4. It should be noted that FIG. 28 illustrates the drive timing of the pixel circuit 20 in the i-th pixel row 19_$i$ and the drive timing of the pixel circuit 20 in the (i+1)-th pixel row 19_$i$+1, the reference numerals t1_$i$, t2_$i$, t3_$i$, and t4_$i$ correspond to the work phases of the pixel circuit 20 in the i-th pixel row 19_$i$, and the reference numerals t1_$i$+1, t2_$i$+1, t3_$i$+1, and t4_$i$+1 correspond to the work phases of the pixel circuit 20 in the (i+1)-th pixel row 19_$i$+1. The working principle of the pixel circuit 20 in the initialization phase t1, the charging phase t2, and the light-emitting phase t3 is same as that in the above embodiments and is not repeated herein.

The adjusting phase t4 is between the charging phase t2 and the light-emitting phase t3. In the adjusting phase t4 corresponding to the i-th pixel row 19_$i$ and the adjusting phase t4 corresponding to the (i+1)-th pixel row 19_$i$+1, the sixth scanning signal line S6 corresponding to the i-th pixel row 19_$i$ and the sixth scanning signal line S6 corresponding to the (i+1)-th pixel row 19_$i$+1 provide a low level. In the pixel circuit 20 in the i-th pixel row 19_$i$ and the pixel circuit 20 in the (i+1)-th pixel row 19_$i$+1, a bias voltage provided by the bias signal line DVH is inputted to the first electrode of the driving transistor M0 though the bias adjust transistor M7, and the bias voltage adjusts the bias state of the driving transistor M0.

In the present embodiment, the sixth scanning signal lines S6 receiving the same signal are electrically connected to the same first connection line 6, and thus the number of the first connection lines 6 required in the display panel is reduced, thereby simplifying the routing design.

Figure 29:
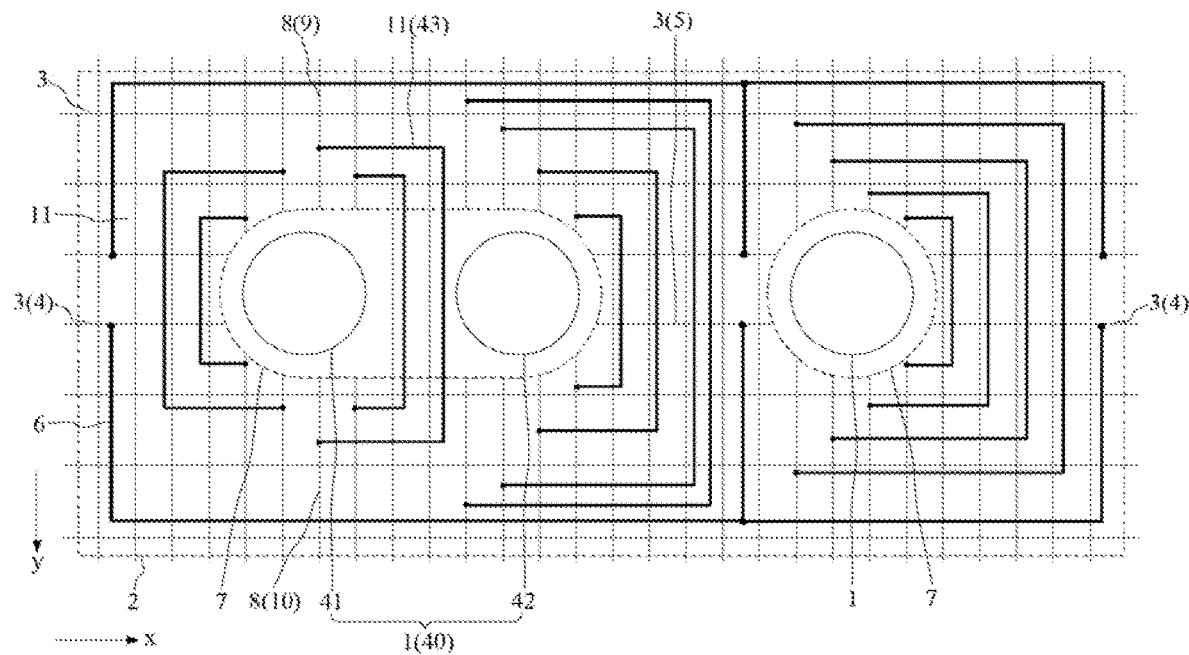
FIG. 29 is another partial top view of a display panel according to some embodiments of the present disclosure.
Figure 30:
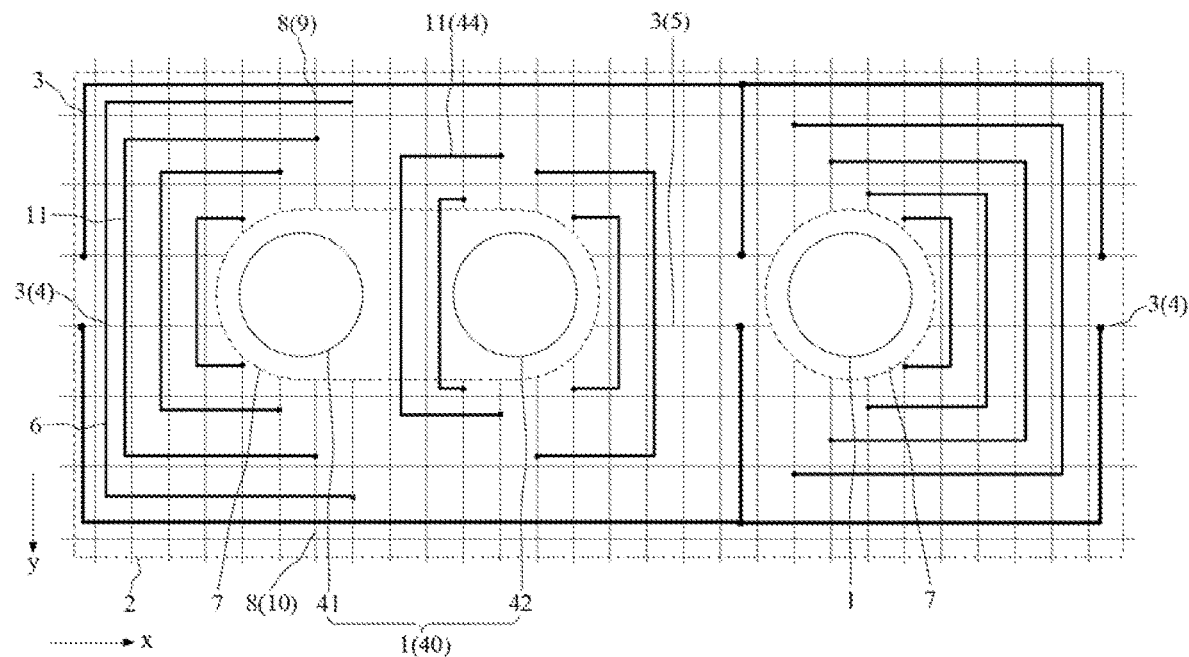
FIG. 30 is another partial top view of a display panel according to some embodiments of the present disclosure.
Figure 31:
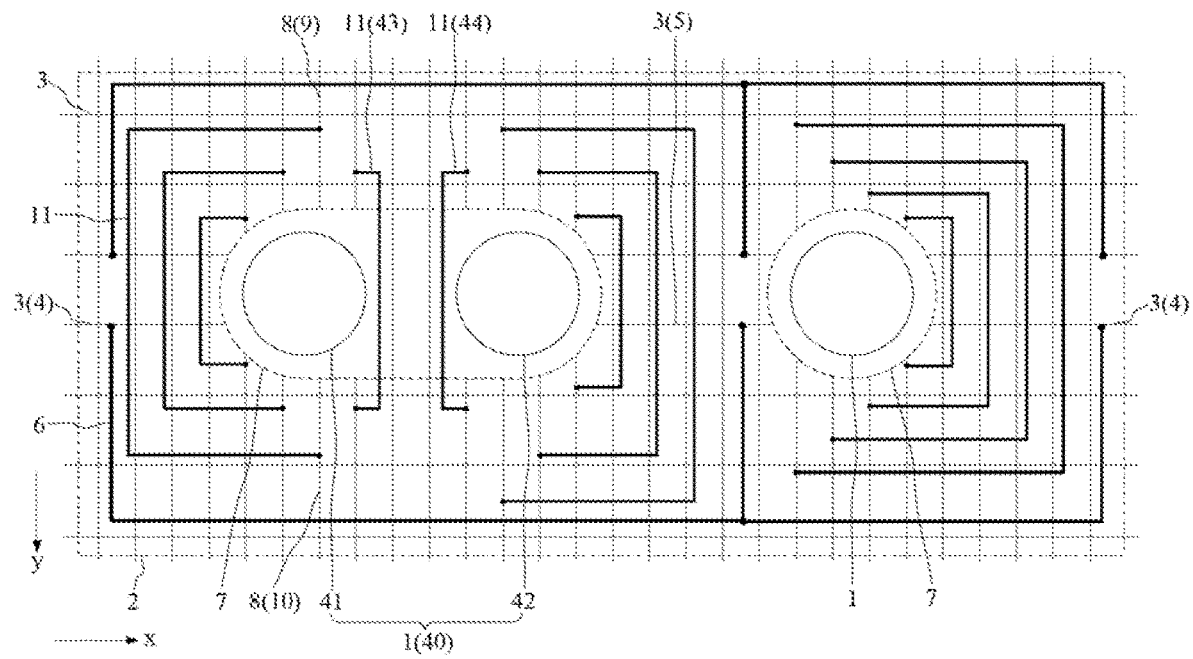
FIG. 31 is another partial top view of a display panel according to some embodiments of the present disclosure.

FIG. 29 is another partial top view of a display panel according to some embodiments of the present disclosure. FIG. 30 is another partial top view of a display panel according to some embodiments of the present disclosure. FIG. 31 is another partial top view of a display panel according to some embodiments of the present disclosure. In some embodiments, as shown in FIG. 29 to FIG. 31, the display panel also includes a first non-display region 7. The first non-display region 7 surrounds the light-transmitting hole 1, and the display region 2 surrounds the first non-display region 7. The first non-display region 7 may be understood as the frame corresponding to the light-transmitting hole 1.

The light-transmitting holes 1 include a racetrack-shaped hole 40. The racetrack-shaped hole 40 includes a first light-transmitting sub-hole 41 and a second light-transmitting sub-hole 42 that are arranged along the first direction x.

The second connection lines 11 further include at least one second C connection line 43. The second C connection line 43 electrically connects segments of the second-type signal line 8 that are located at two sides of the first light-transmitting sub-hole 41. A part of the second C connection line 43 is located between the first light-transmitting sub-hole 41 and the second light-transmitting sub-hole 42. That is, the second C connection line 43 includes a part extending in the display region 2, and a part extending in the first non-display region 7 between the first light-transmitting sub-hole 41 and the second light-transmitting sub-hole 42. The second C connection line 43 surrounds the first light-transmitting sub-hole 41 between the first light-transmitting sub-hole 41 and the second light-transmitting sub-hole 42.

In some embodiments, the second connection lines 11 also includes at least one second D connection lines 44. The second D connection line 44 electrically connects segments of the second-type signal line 8 that are located at two sides of the second light-transmitting sub-hole 42. A part of the second D connection line 44 is located between the first light-transmitting sub-hole 41 and the second light-transmitting sub-hole 42. That is, the second D connection line 44 includes a part extending in the display region 2, and a part extending in the first non-display region 7 between the first light-transmitting sub-hole 41 and the second light-transmitting sub-hole 42. The second D connection line 44 surrounds the second light-transmitting sub-hole 42 between the second light-transmitting sub-hole 42 and the first light-transmitting sub-hole 41.

Since the region between the first light-transmitting sub-hole 41 and the second light-transmitting sub-hole 42 belongs to the first non-display region 7 that is not used for image displaying, with the arrangement that at least one of the second C connection line 43 or the second D connection line 44 has a part extending between the first light-transmitting sub-hole 41 and the second light-transmitting sub-hole 42, this non-display region can be rationally utilized. Moreover, this arrangement also may reduce the number of the second connection line 11 that surrounds the racetrack-shaped hole 40 from the outer side of the racetrack-shaped hole 40. As a result, the difference between the extending length of the second connection line 11 that surrounds the racetrack-shaped hole 40 from the outer side and the extending length of the second connection line 11 that surrounds the racetrack-shaped hole 40 from the inner side is reduced, thereby effectively reducing the load difference between different second connection lines 11 and improving the load uniformity.

When at least one of the second C connection line 43 or the second D connection line 44 includes a part extending between the first light-transmitting sub-hole 41 and the second light-transmitting sub-hole 42, the at least one of the C connection line 43 or the second D connection line 44 does not need to surround the racetrack-shaped hole 40 at the outer side, and thus the extending length of the at least one of the C connection line 43 or the second D connection line 44 is short, and the load is small accordingly. As a result, the entirety line composed of the second C connection line 43, and the second A segment 9 and the second B segment 10 that are electrically connected by the second C connection line 43, the entirety line composed of the second D connection line 44, and the second A segment 9 and the second B segment 10 that are electrically connected by the second D connection line 44, and the second-type signal line 8 that is not broken by the light-transmitting hole 1 have a small load difference, which helps to improve the load uniformity.

In some embodiments, for the second-type signal lines 8 each including two segments separated by the first light-transmitting sub-hole 41, the second C connection line 43 may electrically connect the second-type signal line 8 in these second-type signal lines 8 close to the second light-transmitting sub-hole 42; and for the second-type signal lines 8 each including two segments separated by the second light-transmitting sub-hole 42, the second D connection line 43 may electrically connect the second-type signal line 8 in these second-type signal lines 8 close to the first light-transmitting sub-hole 41, thereby further reducing the extending lengths and loads of the second C connection line 43 and the second D connection line 44.

Figure 32:
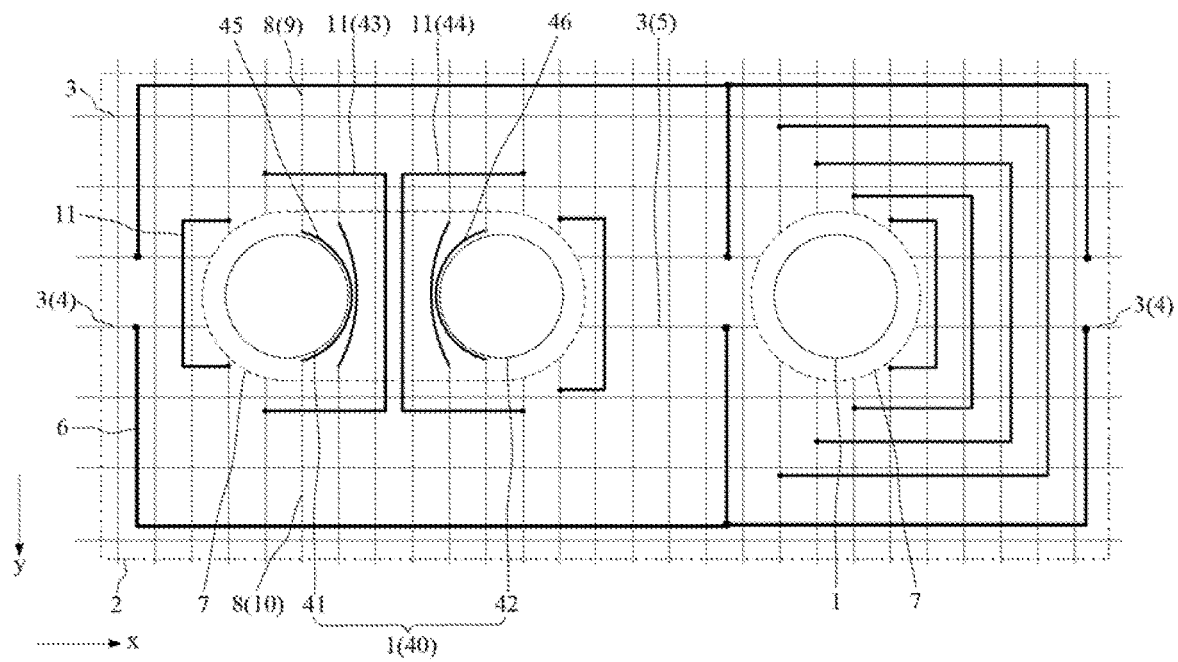
FIG. 32 is another partial top view of a display panel according to some embodiments of the present disclosure.

FIG. 32 is another partial top view of a display panel according to some embodiments of the present disclosure. In some embodiments, as shown in FIG. 32, the display panel further includes: a first winding line 45, and the first winding line 45 is located in the first non-display region 7 surrounding the racetrack-shaped hole 40. The first winding line 45 electrically connects two segments of the second-type signal line 8 that are located at two sides of the first light-transmitting sub-hole 41 and is located between the first light-transmitting sub-hole 41 and the second C connection line 43. Exemplarily, at least one part of the first winding line 45 may extend in an arc along the edge of the first light-transmitting sub-hole 41.

In some embodiments, the display panel also includes a second winding line 46, and the second winding line 46 is located in the first non-display region 7 surrounding the racetrack-shaped hole 40. The second winding line 46 electrically connects two segments of the second-type signal line 8 that are located at two sides of the second light-transmitting sub-hole 42 and is located between the second light-transmitting sub-hole 42 and the second D segment 44. Exemplarily, at least one part of the second winding line 46 may extend in an arc along the edge of the second light-transmitting sub-hole 42.

In the above configuration, two segments of the second-type signal line 8 separated by the racetrack-shaped hole 40 are connected by the winding line between the first light-transmitting sub-hole 41 and the second light-transmitting sub-hole 42. In this way, the non-display region between the first light-transmitting sub-hole 41 and the second light-transmitting sub-hole 42 can be rationally utilized, and the first winding line 45 and the second winding line 36 have small extending lengths and loads, which helps to reducing the load difference between the entirety line composed of the first wrapping winding line 45, and the second A segment 9 and the second B segment 10 electrically connected by the first wrapping winding line 45, the entirety line composed of the second wrapping winding line 46, and the second A segment 9 and the second B segment 10 electrically connected by the second wrapping winding line 46, and other conventional second-type signal line 8, thereby improving the load uniformity.

In some embodiments, for at least one of the second-type signal lines each including two segments separated by the racetrack-shaped hole 40, the wrapping winding line is employed for connecting the segments separated by the racetrack-shaped hole 40. As a result, the number of the second connection line 11 that surrounds the racetrack-shaped hole 40 at the outer side of the racetrack-shaped hole 40 is reduced, thereby reducing the extending length difference between the second connection line 11 surrounds the racetrack-shaped hole 40 at the outer side of the racetrack-shaped hole 40 and the second connection line 11 surrounds the racetrack-shaped hole 40 at the inner side of the racetrack-shaped hole 40, and reducing the load difference between different second connection lines 11.

Figure 33:
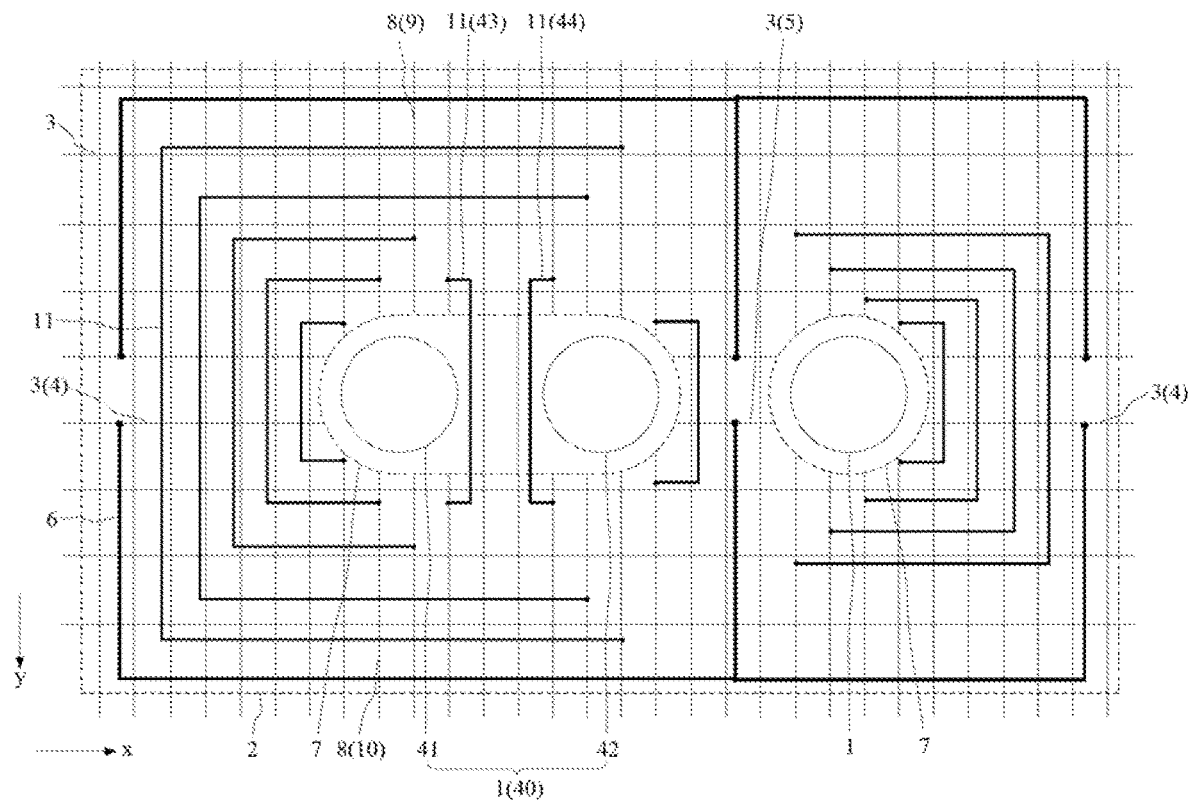
FIG. 33 is another partial top view of a display panel according to some embodiments of the present disclosure.

FIG. 33 is another partial top view of a display panel according to some embodiments of the present disclosure. In some embodiments, as shown in FIG. 33, the light-transmitting holes 1 include a racetrack-shaped hole 40. The racetrack-shaped hole 40 includes a first light-transmitting sub-hole 41 and a second light-transmitting sub-hole 42 that are arranged along the first direction x. The light-transmitting holes 1 other than the racetrack-shaped hole 40 are located at the side of the second light-transmitting sub-hole 42 away from the first light-transmitting sub-hole 41.

For the second connection lines 11 each electrically connecting two segments of one second-type signal line 8 located at two sides of the first light-transmitting sub-hole 41, at least one of these second connection lines 11 surrounds the racetrack-shaped hole 40 at the side of the first light-transmitting sub-hole 41 away from the second light-transmitting sub-hole 42. For the second connection lines 11 each electrically connecting two segments of one second-type signal line 8 located at two sides of the second light-transmitting sub-hole 42, at least one of these second connection lines 11 surrounds the racetrack-shaped hole 40 at the side of the first light-transmitting sub-hole 41 away from the second light-transmitting sub-hole 42.

In the above configuration, at least one second connection line 11 of the second connection lines 11 each electrically connecting the second-type connection line 8 that is broken by the racetrack-shaped hole 40 surrounds the racetrack-shaped hole 40 at the side of the first light-transmitting sub-hole 41 away from the second light-transmitting sub-hole 42. Accordingly, the at least one second connection line 11 extends on the side of the racetrack-shaped hole 40 away from other light-transmitting holes 1, and does not extends between the racetrack-shaped hole 40 and other light-transmitting hole 1 adjacent to the racetrack-shaped hole 40, and thus the at least one second connection line 11 does not occupy the space between the racetrack-shaped hole 40 and other light-transmitting hole 1 adjacent to the racetrack-shaped hole 40, thereby avoiding the signal interference caused by too many connection lines arranged in the region between the racetrack-shaped hole 40 and its adjacent light-transmitting hole 1. In other words, this arrangement does not seriously restrict the distance between the racetrack-shaped hole 40 and other light-transmitting hole 1, the racetrack-shaped hole 40 and other light-transmitting hole 1 may be spaced apart by a large distance, and thus the positions of the racetrack-shaped hole 40 and other light-transmitting hole 1 can be arranged more flexibly.

Figure 34:
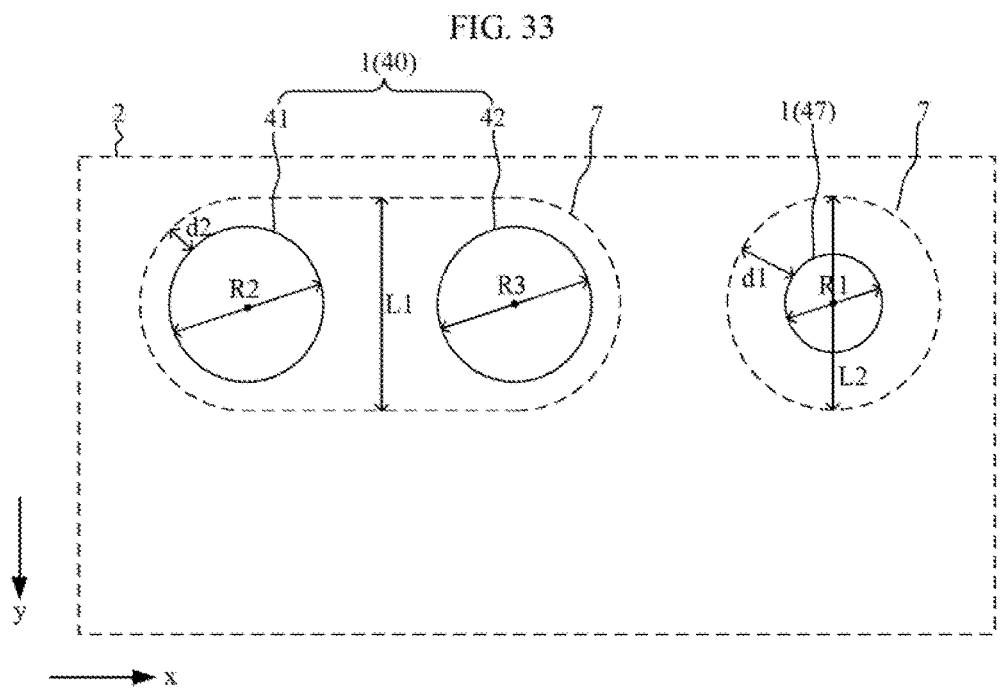
FIG. 34 is another partial top view of a display panel according to some embodiments of the present disclosure.

FIG. 34 is another partial top view of a display panel according to some embodiments of the present disclosure. As shown in FIG. 34, the light-transmitting holes 1 include a racetrack-shaped hole 40 and a first hole 47. The racetrack-shaped hole 40 includes a first light-transmitting sub-hole 41 and a second light-transmitting sub-hole 42 arranged along the first direction x. An aperture r1 of the first hole 47 is smaller than an aperture r2 of the first light-transmitting sub-hole 41, and the aperture r1 of the first hole 47 is smaller than an aperture r3 of the second light-transmitting sub-hole 42.

In some embodiments, the first light-transmitting sub-hole 41 and the second light-transmitting sub-hole 42 in the light-transmitting holes 1 may be used for arranging an infrared camera that is used for realizing a facial recognition function, and the first hole 47 may be used for arranging a photographing camera that is used for realizing a photographing function. Since the cameras corresponding to the first light-transmitting sub-hole 41, the second light-transmitting sub-hole 42, and the first hole 47 are different in type, the aperture of the first hole 47 is different from the apertures of the first light-transmitting sub-hole 41 and the second light-transmitting sub-hole 42, so that the aperture of each of the first light-transmitting sub-hole 41, the second light-transmitting sub-hole 42, and the first hole 47 matches the sizes of its corresponding camera.

In some embodiments, as shown in FIG. 34, the display panel further includes a first non-display region 7, the first non-display region 7 surrounds the light-transmitting holes 1, and the display region 2 surrounds the first non-display region 7. That means, the first non-display region 7 is the frame of the light-transmitting holes 1. A part of the first non-display region 7 surrounding the first hole 47 has a minimum width d1, another part of the first non-display region 7 surrounding the racetrack-shaped hole 40 has a minimum width d2, and d1>d2.

In the present embodiment, the width of the frame corresponding to the racetrack-shaped hole 40 and the width of the frame corresponding to the first hole 47 are independently designed. As a result, the overall structure composed of the racetrack-shaped hole 40 and the first non-display region 7 surrounding the racetrack-shaped hole 40 has a length L1 along the second direction y, the overall structure composed of the first hole 47 and the first non-display region 7 surrounding the first hole 47 has a length L2 along the second direction y, and the length L1 is approximately equal to the length L2. In this way, the two structures can present a more beautiful exclamation point shape, and the appearance of the display panel is better.

Figure 35:
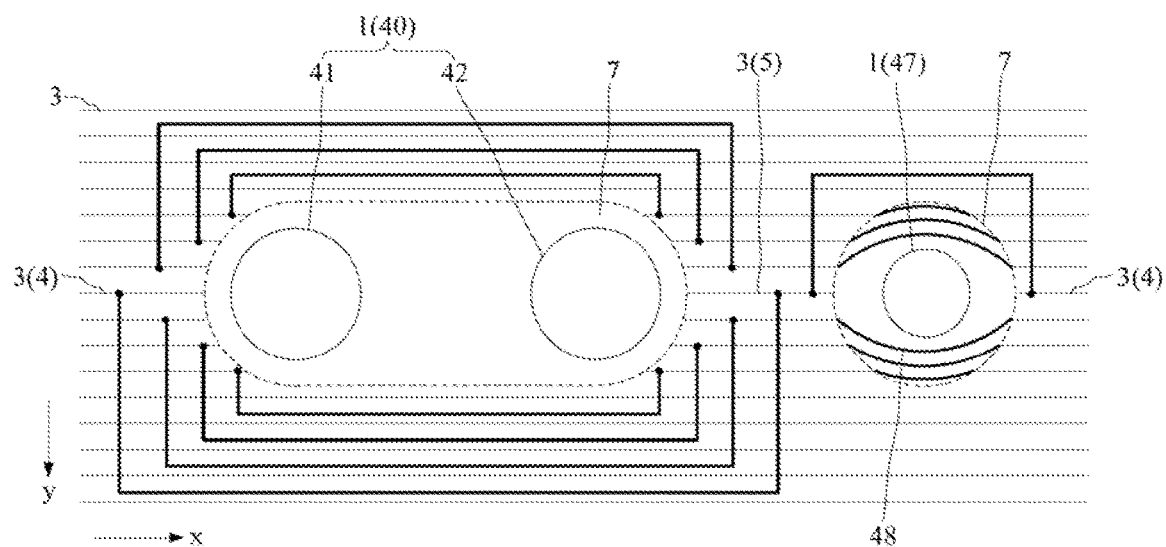
FIG. 35 is another partial top view of a display panel according to some embodiments of the present disclosure.

FIG. 35 is another partial top view of a display panel according to some embodiments of the present disclosure. In some embodiments, as shown in FIG. 35, the display panel further includes a sixth winding line 48. A first end of the sixth winding line 48 is electrically connected to the first B segment 5 located at a first side of the first hole 47, and a second end of the sixth winding line 48 is electrically connected to the first A segment 4 or the first B segment 5 located at a second side of the first hole 47. The sixth winding line 48 is located in the first non-display region 7 surrounding the first hole 47. At least one part of the sixth winding line 48 extends in an arc along the edge of the first hole 47.

As stated above, the width of the frame corresponding to the first hole 47 is greater than the width of the frame corresponding to the racetrack-shaped hole 40. In some embodiments, one or more winding lines for connecting the first-type signal line 3 may be arranged in the frame corresponding to the first hole 47. With such an arrangement, the frame of the first hole 47 can be reasonably utilized, and the number of the first connection lines 6 that surround the first hole 47 at the outer side of the first hole 47, thereby reducing the extending length difference and the load difference between different first connection lines 6.

Figure 36:
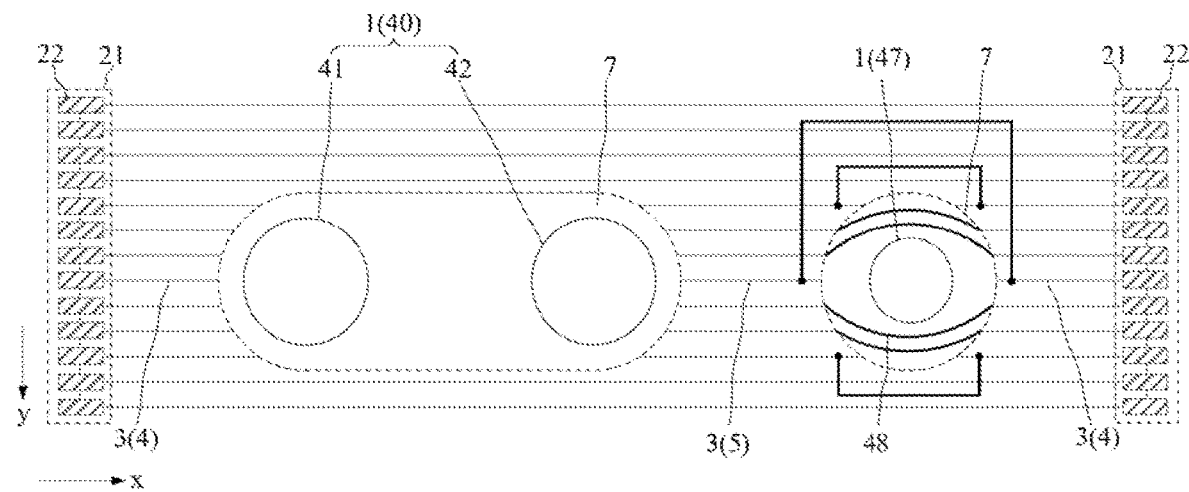
FIG. 36 is another partial top view of a display panel according to some embodiments of the present disclosure.

FIG. 36 is another partial top view of a display panel according to some embodiments of the present disclosure. In some embodiments, as shown in FIG. 36, the display panel also includes shift registers 21, and each of the shift registers 21 includes a plurality of cascaded shift units 22. The first A segment 4 located at a side of the first hole 47 away from the racetrack-shaped hole 40 is electrically connected to the shift unit 22 in one of the shift registers 21, and the first A segment 4 located at a side of the racetrack-shaped hole 40 away from the first hole 47 is electrically connected to the shift unit 22 in another one of the shift registers 21.

In the present embodiment, a bilateral drive manner is used by the shift registers 21. As a result, the segments of the first-type signal line 3 that are separated by the racetrack-shaped hole 40 can transmit the signal normally without being electrically connected by the first connection line 6 or the winding line. Therefore, there is no need to arrange connection lines on two sides of the racetrack-shaped hole 40, and there is no need to arrange the winding line in the first non-display region 7 corresponding to the racetrack-shaped hole 40.

Figure 37:
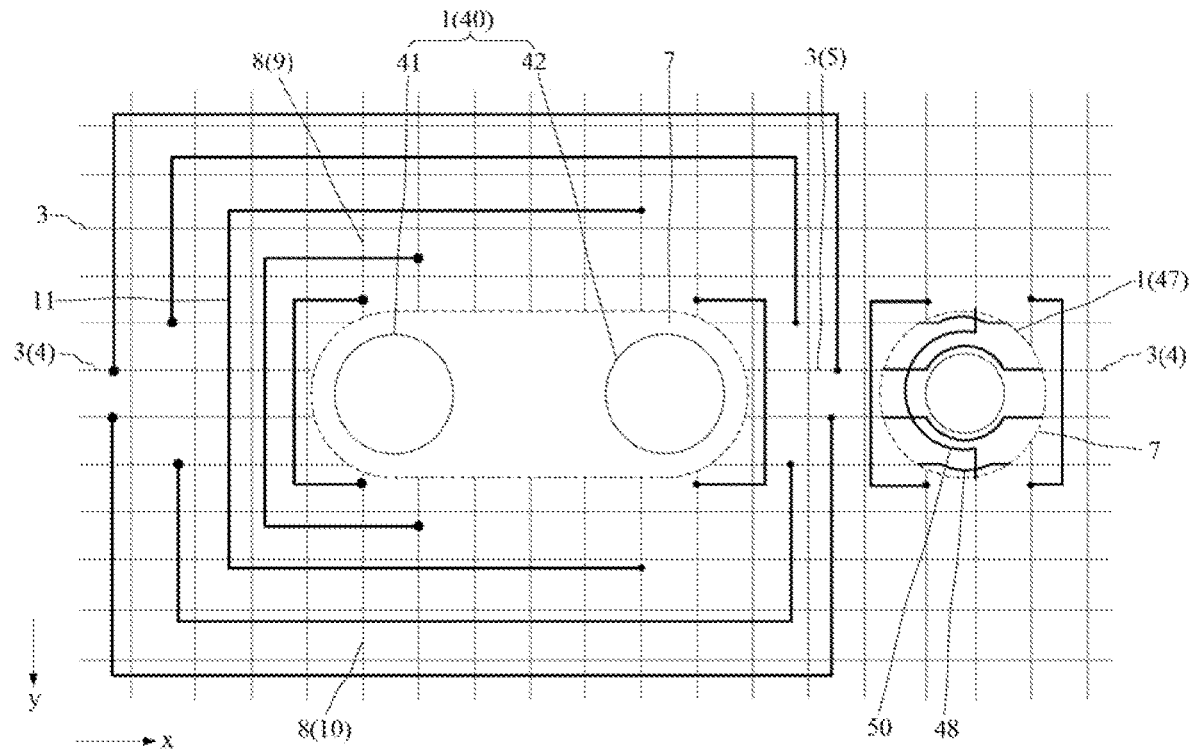
FIG. 37 is another partial top view of a display panel according to some embodiments of the present disclosure.

FIG. 37 is another partial top view of a display panel according to some embodiments of the present disclosure. In some embodiments, as shown in FIG. 37, the display panel also includes a seventh winding line 50. The seventh winding line 50 has two ends respectively electrically connected to the second A segment 9 and the second B segment 10 located at two sides of the first hole 47. The seventh winding line 50 is located in the first non-display region surrounding the first hole 47.

As stated above, the width of the frame corresponding to the first hole 47 is greater than the width of the frame corresponding to the racetrack-shaped hole 40. In some embodiments, one or more seventh winding lines 50 for connecting the second-type signal line 8 may be arranged in the frame corresponding to the first hole 47. With such an arrangement, the frame of the first hole 47 can be reasonably utilized, and the number of the second connection lines 11 that are located outside the first hole 47 and surround the first hole 47 is reduced, thereby reducing the load difference between different second connection lines 11.

Figure 38:
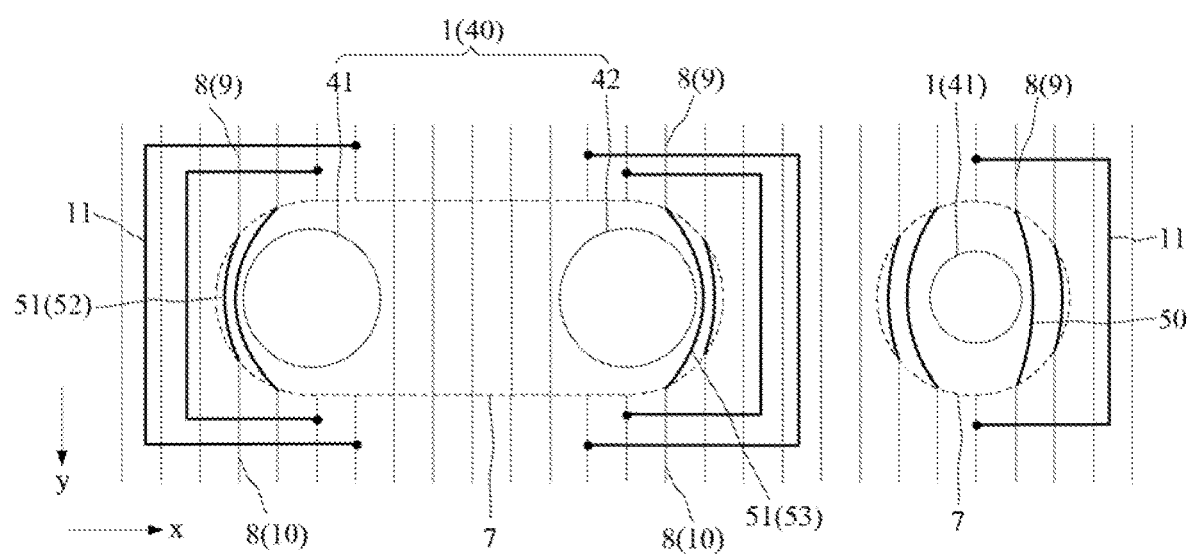
FIG. 38 is another partial top view of a display panel according to some embodiments of the present disclosure.

FIG. 38 is another partial top view of a display panel according to some embodiments of the present disclosure. In some embodiments, as shown in FIG. 38, the display panel further includes eighth winding lines 51. The eighth winding lines 51 include an eighth A winding line 52. The eighth A winding line 52 has two ends that are respectively electrically connected to the second A segment 9 and the second B segment 10 located at two sides of the first light-transmitting sub-hole 41. The eighth A winding line 52 is located in the first non-display region surrounding the racetrack-shaped hole 40 and extends on the side of the first light-transmitting sub-hole 41 away from the second light-transmitting sub-hole 42.

In some embodiments, the eighth winding lines 51 include an eighth B winding line 53. The eighth B winding line 53 has two ends that are respectively electrically connected to the second A segment 9 and the second B segment 10 located at two sides of the second light-transmitting sub-hole 42. The eighth B winding line 53 is located in the first non-display region surrounding the racetrack-shaped hole 40 and extends on the side of the second light-transmitting sub-hole 42 away from the first light-transmitting sub-hole 41.

In the present embodiment, for one or more second-type signal lines 8 that are broken by the racetrack-shaped hole 40, two segments of the second-type signal line 8 located at two sides of the racetrack-shaped hole 40 may be connected by the winding line in the first non-display region 7. With such an arrangement, the frame of the racetrack-shaped hole 40 can be reasonably utilized, and the number of the second connection lines 11 that located outside of the racetrack-shaped hole 40 and surround the racetrack-shaped hole 40 is reduced, thereby reducing the load difference between different second connection lines 11.

In the embodiments, the minimum distance d2 of the first non-display region 7 surrounding the racetrack-shaped hole 40 is smaller than the minimum distance d1 of the first non-display region 7 surrounding the first hole 47. Accordingly, the number of the eighth winding lines 51 is arranged to be smaller than the number of the seventh winding lines 50, so as the avoid an over dense arrangement of the winding lines in the first non-display region 7 surrounding the racetrack-shaped hole 40, which may cause signal interference between the winding lines.

Figure 39:
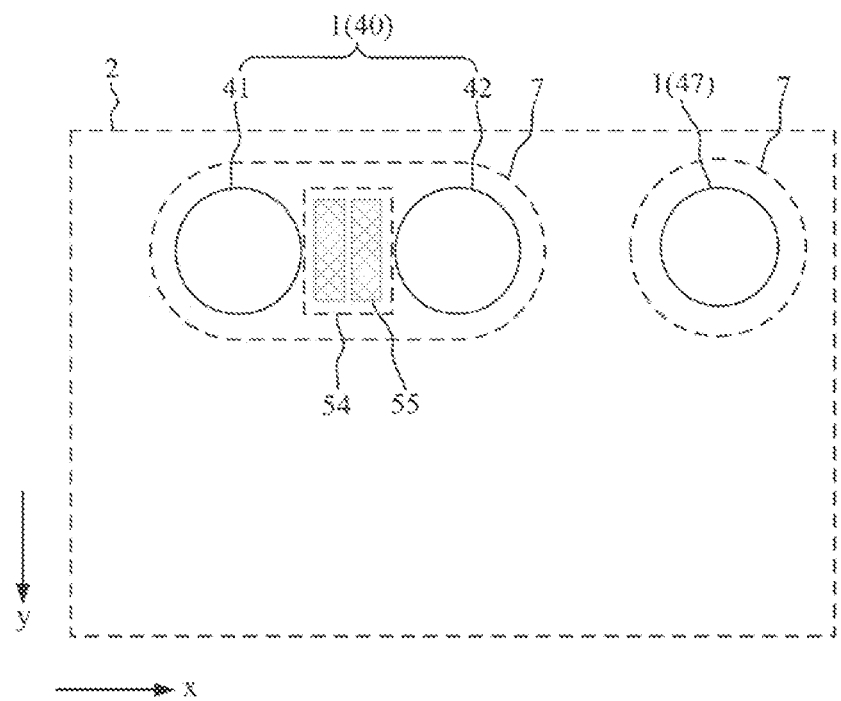
FIG. 39 is another partial top view of a display panel according to some embodiments of the present disclosure.

FIG. 39 is another partial top view of a display panel according to some embodiments of the present disclosure. In some embodiments, as shown in FIG. 39, the light-transmitting holes 1 include a racetrack-shaped hole 40. The racetrack-shaped hole 40 includes a first light-transmitting sub-hole 41 and a second light-transmitting sub-hole 42 that are arranged along the first direction x. The display panel further includes first non-display regions 7. The first non-display regions 7 surround the light-transmitting holes 1, and the display region 2 surrounds the first non-display regions 7. The first non-display region 7 surrounding the racetrack-shaped hole 40 includes a first non-display sub-region 54. The first non-display sub-region 54 is located between the first light-transmitting sub-hole 41 and the second light-transmitting sub-hole 42, and a sensing element 55 is arranged in the first non-display sub-region 54.

In the present embodiment, the sensing element 55 is configured to work together with a camera provided corresponding to the first light-transmitting sub-hole 41 and the second light-transmitting sub-hole 42, so as to realize a specific function. For example, infrared cameras are provided below the first light-transmitting sub-hole 41 and the second light-transmitting sub-hole 42, and a proximity sensor, an ambient light sensor and the like may be provided in the first non-display sub-region 54. The infrared camera and the sensing element 55 cooperate to perform facial recognition, so as to improve the accuracy of the facial recognition and improve the performance of the display panel.

Figure 40:
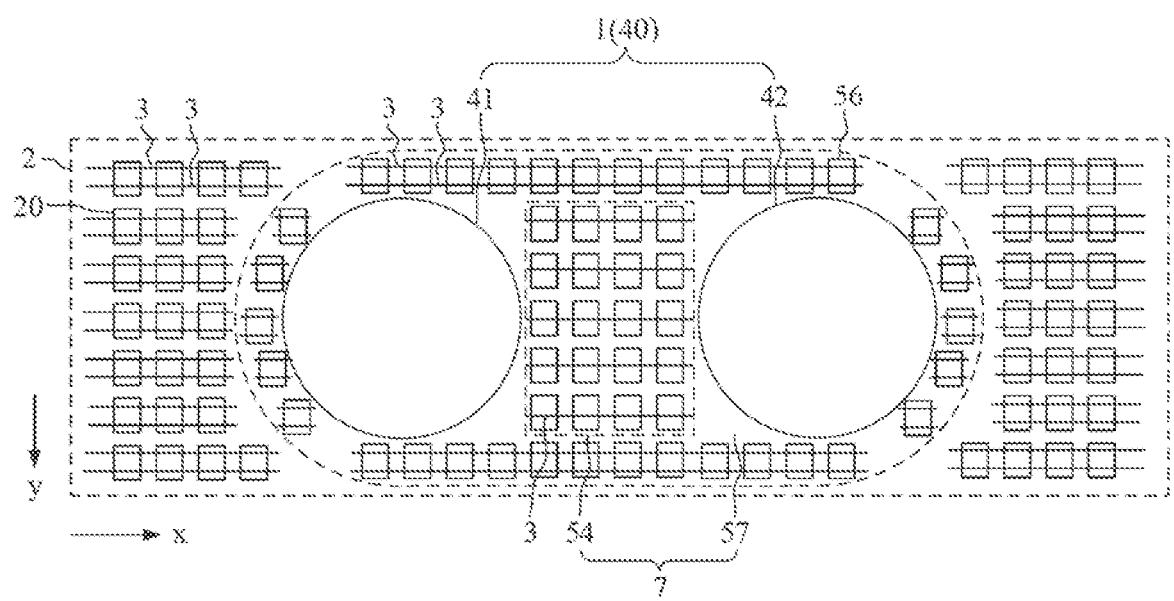
FIG. 40 is another partial top view of a display panel according to some embodiments of the present disclosure.

FIG. 40 is another partial top view of a display panel according to some embodiments of the present disclosure. In some embodiments, as shown in FIG. 40, the display panel further includes pixel circuits 20 and first dummy pixel circuits 56. The first dummy pixel circuits 56 are located in the first non-display region 7. The pixel circuits 20 and one or more of the first dummy pixel circuits 56 are electrically connected to the first-type signal lines 3.

It should be understood that the first dummy pixel circuits 56 are provided for ensuring the uniformity of the pattern density and optimizing the etching effect. In one embodiment, a segment of the first-type signal line 3 electrically connected to the pixel circuit 20 may be electrically connected to another segment of the first-type signal line 3 electrically connected to the first dummy pixel circuit 56, and thus the load uniformity of different first-type signal lines 3 is further improved by the first dummy pixel circuit 56. Alternatively, in another embodiment, the segment of the first-type signal line 3 electrically connected to the pixel circuit 20 and the segment of the first-type signal line 3 electrically connected to the first dummy pixel circuit 56 are separated and electrically insulated from each other.

In the first non-display sub-region 54, the number of the first-type connection lines 3 that are electrically connected to the first dummy pixel circuits 56 is smaller than the number of the first-type connection lines 3 that are electrically connected to the pixel circuits 20, so as to reduce the number of the first-type connection lines 3 in the first non-display sub-region 54 and improve the light transmittance of the first non-display sub-region 54. In this way, more ambient light will pass through the first non-display sub-region 54 and then be received by the sensing element 55, thereby improving the accuracy of the facial recognition.

It should be understood that, in some embodiments of the present disclosure, none of the first-type signal lines 3 is electrically connected to the first dummy pixel circuit 56 in the first non-display sub-region 54. That is, the first dummy pixel circuit 56 in the first non-display sub-region 54 is not electrically connected to any first-type signal line 3. With such an arrangement, the light transmittance of the first non-display sub-region 54 can be increased to a greater extent.

It should be understood that the first dummy pixel circuits 56 are not used for driving the light-emitting element D to emit light. Therefore, even if the number of the first-type signal lines 3 electrically connected to the first dummy pixel circuits 56 in the first non-display sub-region 54, the normal function of the display panel is not affected.

Figure 41:
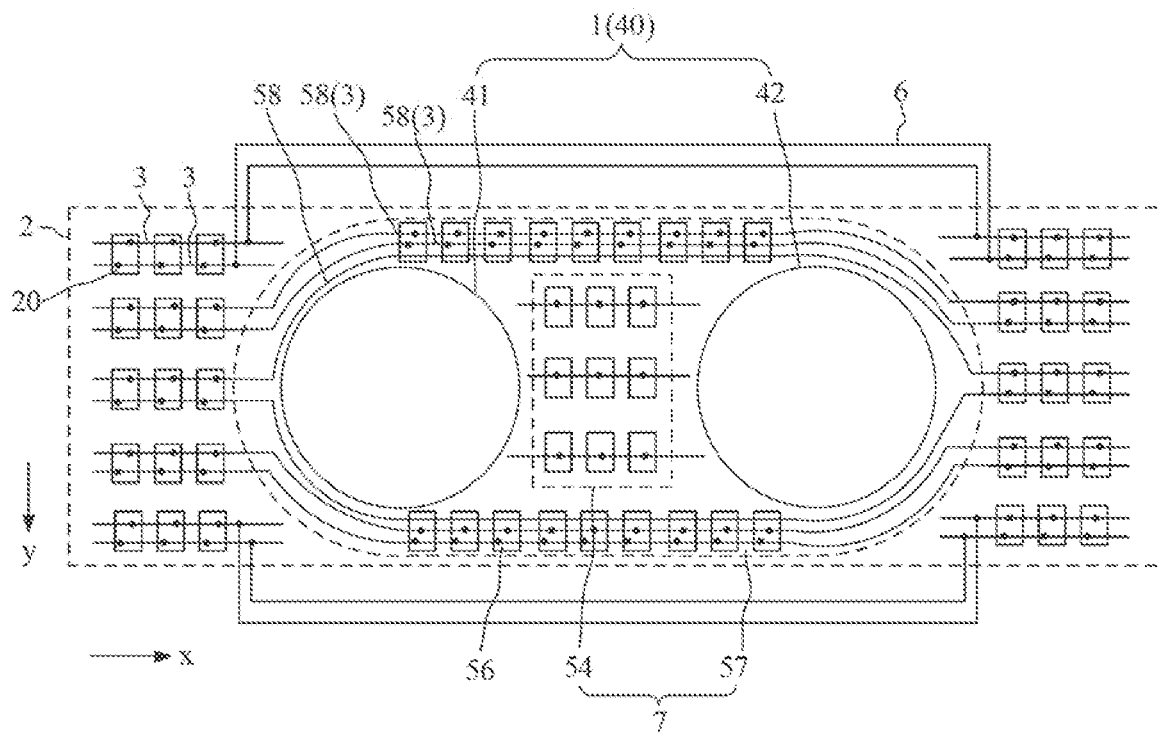
FIG. 41 is another partial top view of a display panel according to some embodiments of the present disclosure.

FIG. 41 is another partial top view of a display panel according to some embodiments of the present disclosure. In some embodiments, as shown in FIG. 41, the first non-display region 7 surrounding the racetrack-shaped hole 40 includes a second non-display sub-region 57. The display panel further includes third winding lines 58. A first end of the third winding line 58 is electrically connected to the first A segment 4 or the first B segment 5 located at the first side of the racetrack-shaped hole 40, and a second end of the third winding line 58 is electrically connected to the first A segment 4 or the first B segment 5 located at the second side of the racetrack-shaped hole 40 opposite to the first side. The third winding line 58 is located in the second non-display sub-region 57. At least one third winding line 58 of the third winding lines 58 is reused as the first-type signal line 3 electrically connected to the first dummy pixel circuits 56 in the second non-display sub-region 57.

In the embodiments, at least one third winding line 58 of the third winding lines 58 is reused as the first-type signal line 3 electrically connected to the first dummy pixel circuits 56, thereby reducing the number of lines in the first non-display region 7. In addition, due to the existence of the light-transmitting hole 1, at least one first-type signal line 3 is divided by the light-transmitting hole 1 into two segments located at the upper side and the lower side of the light-transmitting hole 1. Compared with the first-type signal line 3 that is located at the upper or lower side of the light-transmitting hole 1 and is not divided by the light-transmitting hole 1, the first-type signal line 3 that is divided by the light-transmitting hole 1 is connected to fewer pixel circuits 20 and has smaller load accordingly. In the present embodiment, at least one third winding line 58 is reused as the first-type signal line 3 electrically connected to the first dummy pixel circuit 56, so that the number of circuits connected to the entirety line composed of the first A segment 4, the third winding line 58, the first B segment 5 is approximately equal to the number of circuits connected to the first-type signal line 3 that is not divided by the light-transmitting hole 1, which is beneficial to improving the load uniformity of different signal lines.

Figure 42:
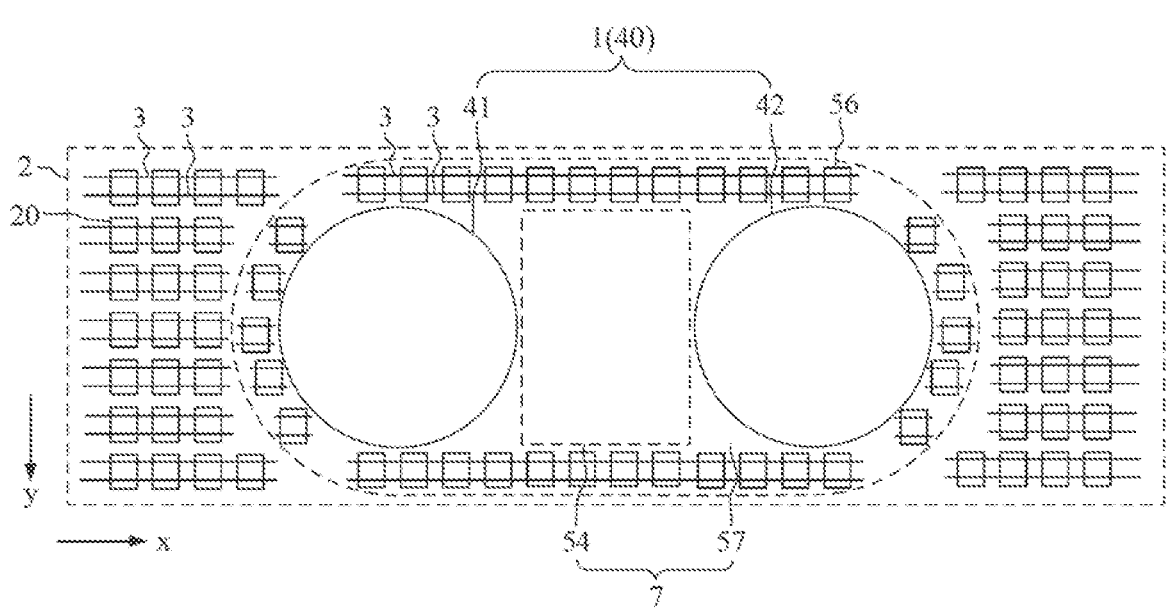
FIG. 42 is another partial top view of a display panel according to some embodiments of the present disclosure.

FIG. 42 is another partial top view of a display panel according to some embodiments of the present disclosure. In some embodiments, as shown in FIG. 42, the display panel includes first dummy pixel circuits 56. The first dummy pixel circuits 56 are located in first non-display region 7. The first non-display region 7 includes a second non-display sub-region 57. The first dummy pixel circuits 56 located in the first non-display region 7 are located in only the second non-display sub-region 57.

In the present embodiment, the arrangement of the first dummy pixel circuits 56 can increase the etching uniformity or load uniformity. In addition, since the first dummy pixel circuits 56 in the first non-display region 7 are only arranged in the second non-display sub-region 57, metal wires forming the first dummy pixel circuits 56 do not block the ambient light. As a result, the light transmittance of the first non-display sub-region 54 is increased to a greater extent, and more ambient light will pass through the first non-display sub-region 54 and then be received by the sensing element 55.

Figure 43:
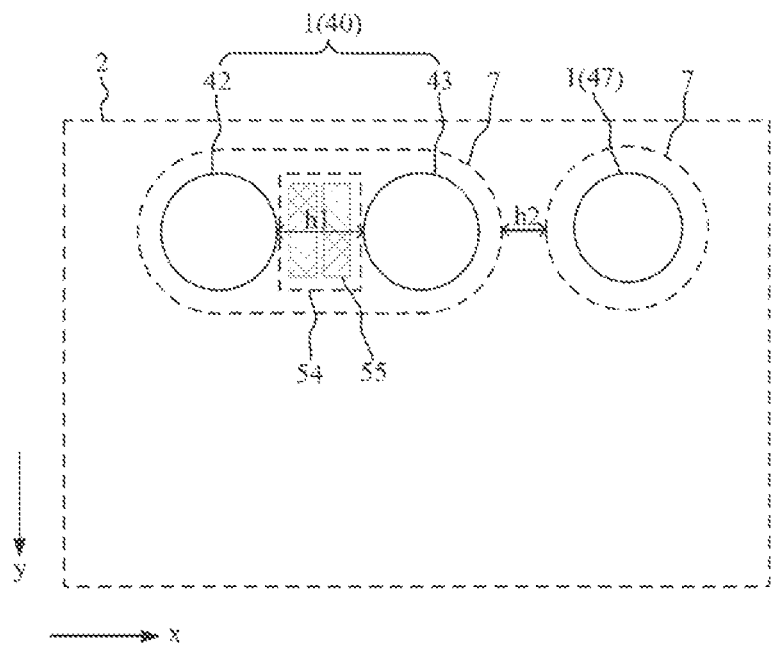
FIG. 43 is another partial top view of a display panel according to some embodiments of the present disclosure.

FIG. 43 is another partial top view of a display panel according to some embodiments of the present disclosure. In some embodiments, as shown in FIG. 43, the light-transmitting holes 1 include a racetrack-shaped hole 40 and a first hole 47. The racetrack-shaped hole 40 includes a first light-transmitting sub-hole 41 and a second light-transmitting sub-hole 42 arranged along the first direction x. A distance h1 between the first light-transmitting sub-hole 41 and the second light-transmitting sub-hole 42 is greater than a distance h2 between the second light-transmitting sub-hole 42 and the first hole 47.

As stated above, a sensing element 55 may be arranged between the first light-transmitting sub-hole 41 and the second light-transmitting sub-hole 42. When designing the distance between the first light-transmitting sub-hole 41 and the second light-transmitting sub-hole 42 and the distance between the second light-transmitting sub-hole 42 and the first hole 47, the distance between the first light-transmitting sub-hole 41 and the second light-transmitting sub-hole 42 is set larger, so that more sensing elements 55 can be arranged, thereby further improving the accuracy of the facial recognition.

Figure 44:
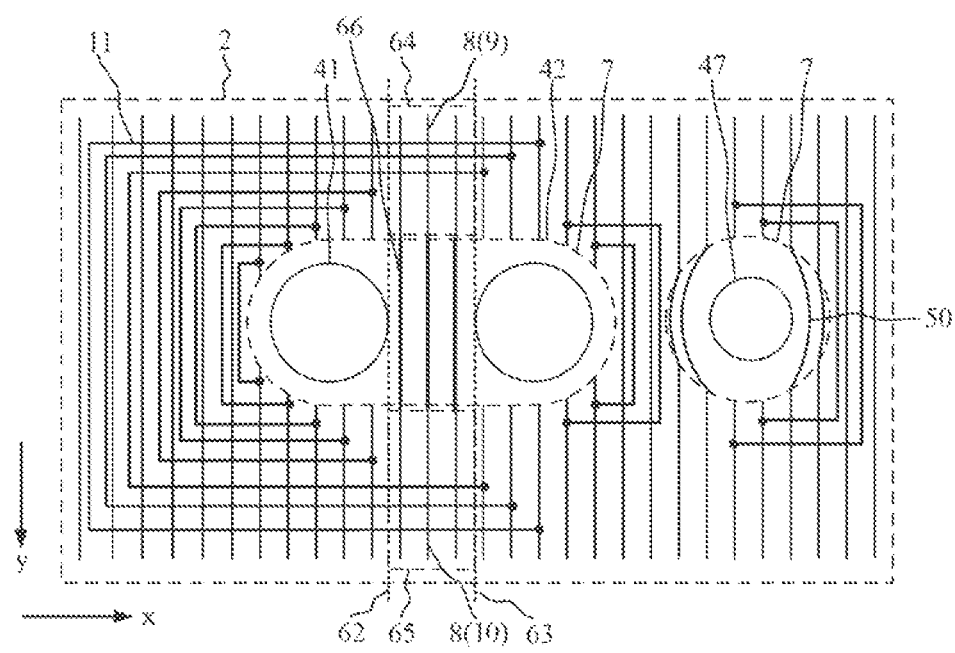
FIG. 44 is another partial top view of a display panel according to some embodiments of the present disclosure.

FIG. 44 is another partial top view of a display panel according to some embodiments of the present disclosure. In some embodiments, as shown in FIG. 44, the display panel includes a first non-display region 7, the first non-display region 7 surrounds the light-transmitting holes 1, and the display region 2 surrounds the first non-display region 7.

The display panel further includes a first dummy straight line 62 and a second dummy straight line 63. The first dummy straight line 62 and the second dummy straight line 63 extend along the second direction y at least between the first light-transmitting sub-hole 41 and the second light-transmitting sub-hole 42. The first dummy straight line 62 intersects the edge of the first light-transmitting sub-hole 41, and the second dummy straight line 63 intersects the edge of the second light-transmitting sub-hole 42.

The display region 2 includes a third display sub-region 64 and a fourth display sub-region 65. The third display sub-region 64 and the fourth display sub-region 65 are located at two sides of the racetrack-shaped hole 40 along the second direction y, respectively. The third display sub-region 64 has two edges opposite to each other along the first direction x, and the two edges coincide the third display sub-region 64 and the fourth display sub-region 65, respectively. The fourth display sub-region 65 has two edges opposite to each other along the first direction x, and the two edges coincide the third display sub-region 64 and the fourth display sub-region 65, respectively.

The display panel further includes a ninth winding line 66. A first end of the ninth winding line 66 is electrically connected to the second A segment 9 in the third display sub-region 64, and a second end of the ninth winding line 66 is electrically connected to the second B segment 10 in the fourth display sub-region 65. The ninth winding line 66 extends along the second direction y in the first non-display region 7 surrounding the racetrack-shaped hole 40.

Since the spacing between the first light-transmitting sub-hole 41 and the second light-transmitting sub-hole 42 is large, the second A segment 9 and the second B segment 10 of the second-type signal line 8 that are located in the third display sub-region 64 and the fourth display sub-region 65 can be electrically connected directly by the ninth winding line 66 that extends along the second direction y in the first non-display region 7. In this way, the non-display region between the first light-transmitting sub-hole 41 and the second light-transmitting sub-hole 42 can be rationally utilized, and the ninth winding line 66 has a shorter extending length, so that the load of the entirety line composed of the ninth winding line 66, and the second A segment 9 and the second B segment 10 electrically connected by the ninth winding line 66 is approximately equal to the load of the second-type signal line 8 that is not broken by the light-transmitting hole 1.

Figure 45:
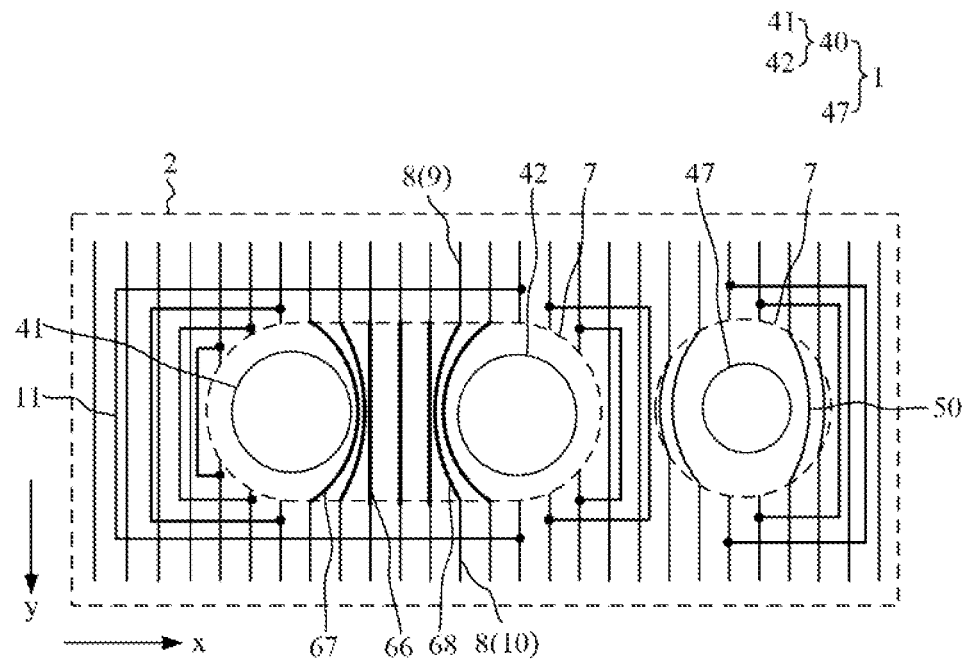
FIG. 45 is another partial top view of a display panel according to some embodiments of the present disclosure.

FIG. 45 is another partial top view of a display panel according to some embodiments of the present disclosure. In some embodiments of the present disclosure, as shown in FIG. 45, the display panel further includes a tenth winding line 67. The tenth winding line 67 is located in the first non-display region 7 surrounding the racetrack-shaped hole 40. The tenth winding line 67 electrically connects the second A segment 9 and the second B segment 10 of the second-type signal line 8 located at two sides of the first light-transmitting sub-hole 41 and is located between the first light-transmitting sub-hole 41 and the ninth winding line 66. At least one part of the tenth winding line 67 may extend in an arc along the edge of the first light-transmitting sub-hole 41.

In some embodiments, the display panel includes an eleventh winding line 68. The eleventh winding line 68 is located in the first non-display region 7 surrounding the racetrack-shaped hole 40. The eleventh winding line 68 electrically connects the second A segment 9 and the second B segment 10 of the second-type signal line 8 located at two sides of the second light-transmitting sub-hole 42 and is located between the second light-transmitting sub-hole 42 and the ninth winding line 66. At least one part of the eleventh winding line 68 may extend in an arc along the edge of the second light-transmitting sub-hole 42.

In the above configuration, the second A segment 9 and the second B segment 10 of at least one second-type signal line 8 located at two sides of the racetrack-shaped hole 40 are electrically connected by the winding line between the first light-transmitting sub-hole 41 and the second light-transmitting sub-hole 42. In this way, the wide space between the first light-transmitting sub-hole 41 and the second light-transmitting sub-hole 42 can be rationally utilized, and both the tenth winding line 67 and the eleventh winding line 68 have a short extending length and a small load, which is beneficial to reducing the load difference between the entirety line composed of the tenth wrapping winding line 67, and the second A segment 9 and the second B segment 10 electrically connected by the tenth wrapping winding line 67, the entirety line composed of the eleventh wrapping winding line 68, and the second A segment 9 and the second B segment 10 electrically connected by the eleventh wrapping winding line 68, and the second-type signal line 8 that is not broken by the racetrack-shaped hole 40.

By connecting the second A segment 9 and the second B segment 10 of the second-type signal line 8 located at two sides of the racetrack-shaped hole 40 through the winding line, the number of the second connection lines 11 that are located outside the racetrack-shaped hole 40 and surround the racetrack-shaped hole 40 is reduced, and thus the difference between the extending length of the second connection line 11 that is located outside the racetrack-shaped hole 40 and surrounds the racetrack-shaped hole 40 and the extending length of the second connection line 11 that surrounds the racetrack-shaped hole 40 is reduced, thereby reducing the load difference between different second connection lines 11.

Figure 46:
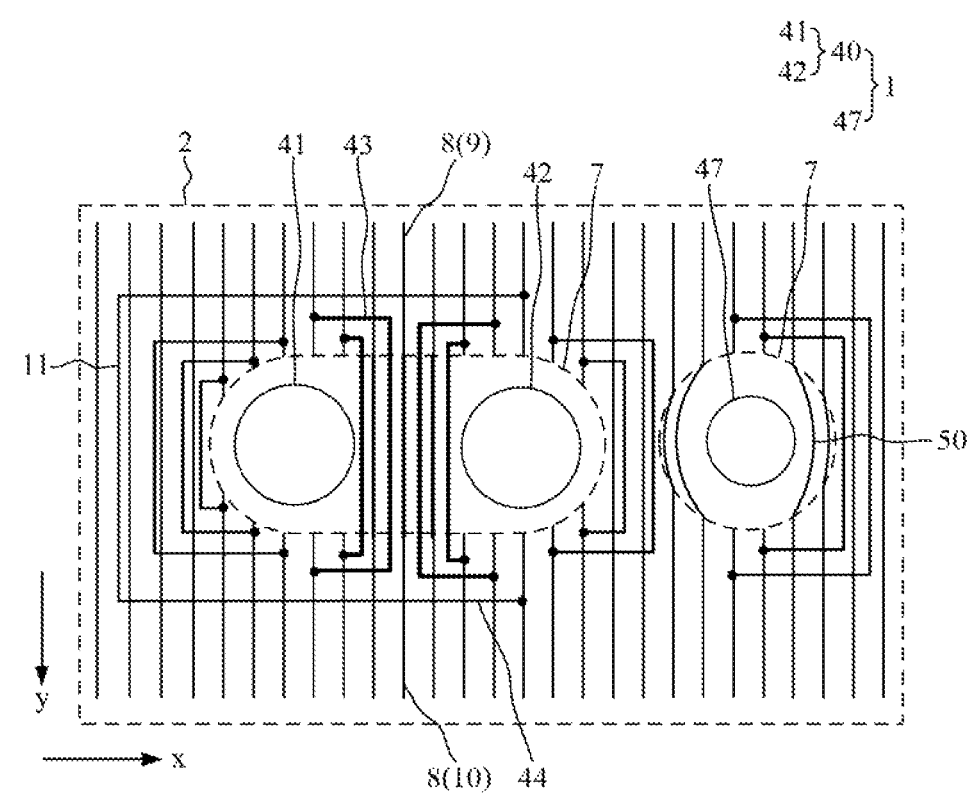
FIG. 46 is another partial top view of a display panel according to some embodiments of the present disclosure.

FIG. 46 is another partial top view of a display panel according to some embodiments of the present disclosure. In some embodiments, as shown in FIG. 46, the second connection lines 11 include at least one of at least one second C connection line 43 or at least one second D connection line 44.

The second C connection line 43 electrically connects the second A segment 9 and the second B segment 10 of one second-type signal line 8 located at two sides of the first light-transmitting sub-hole 41, and a part of the second C connection line 43 is located between the first light-transmitting sub-hole 41 and the second light-transmitting sub-hole 42.

The second D connection line 44 electrically connects the second A segment 9 and the second B segment 10 of one second-type signal line 8 located at two sides of the second light-transmitting sub-hole 42, and a part of the second D connection line 44 is located between the first light-transmitting sub-hole 41 and the second light-transmitting sub-hole 42.

Since the spacing between the first light-transmitting sub-hole 41 and the second light-transmitting sub-hole 42 is large, the second C connection line 43 and the second D connection line 44 extending between the first light-transmitting sub-hole 41 and the second light-transmitting sub-hole 42 are arranged. Compared with the second connection line 11 that is located outside the racetrack-shaped hole 40 and surrounds the racetrack-shaped hole 40, the second C connection line 43 and the second D connection line 44 have a shorter extending length since they extend between the first light-transmitting sub-hole 41 and the second light-transmitting sub-hole 42, and thus their load can be reduced. In addition, with the above arrangement, the number of the second connection line 11 that is located outside the racetrack-shaped hole 40 and surrounds the racetrack-shaped hole 40 is reduced, thereby reducing the load difference between different second connection lines 11.

Figure 47:
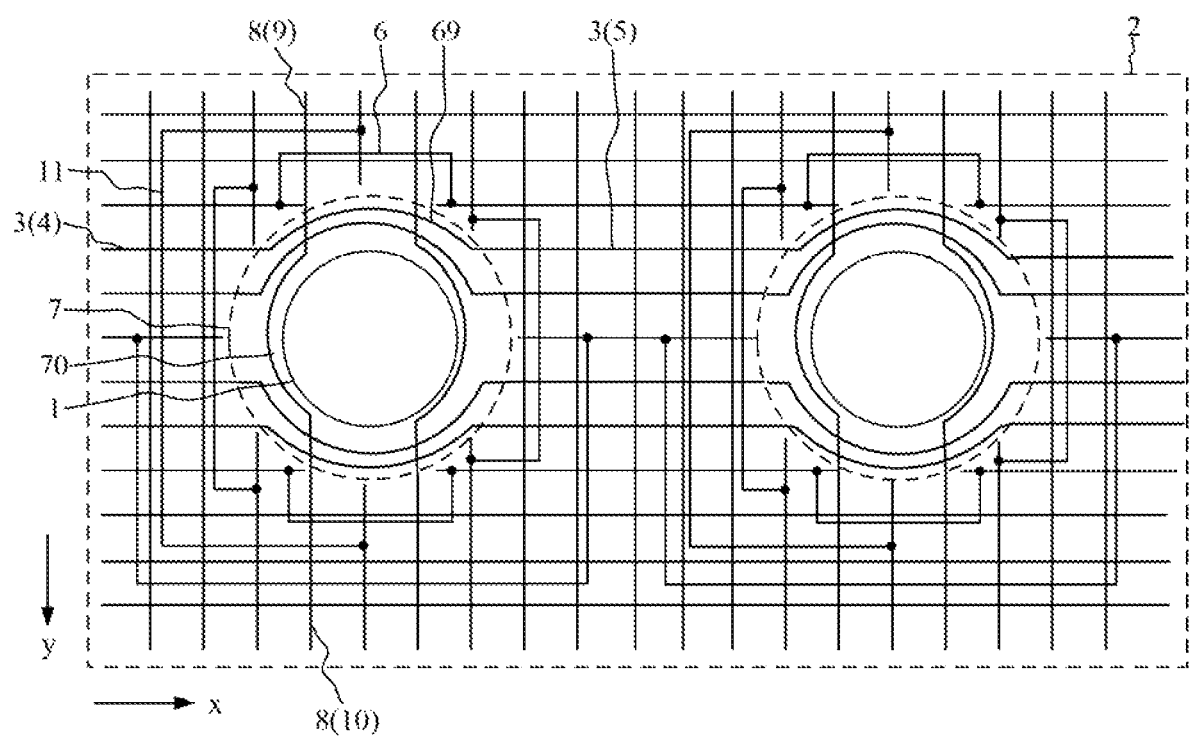
FIG. 47 is another partial top view of a display panel according to some embodiments of the present disclosure.

FIG. 47 is another partial top view of a display panel according to some embodiments of the present disclosure. In some embodiments, as shown in FIG. 47, the display panel further includes a first non-display region 7 surrounding the light-transmitting holes 1, and the display region 2 surrounds the first non-display region 7.

The display panel further includes at least one of a fourth winding line 69 or a fifth winding line 70. The fourth winding line 69 is located in the first non-display region 7. The fourth winding line 69 has a first end electrically connected to one first B segment 5, and a second end electrically connected to the first A segment 4 or another first B segment 5. The fifth winding line 70 is located in the first non-display region 7. The fifth winding line 70 has a first end electrically connected to the second A segment 9, and a second end electrically connected to the second B segment 10.

In the above configuration, the first A segment 4 and the first B segment 5 of first-type signal line 3 that are spaced apart by the light-transmitting hole 1 are electrically connected by the winding line in the first non-display region 7, and/or, the second A segment 9 and the second B segment 10 of the second-type signal line 8 that are spaced apart by the light-transmitting hole 1 are electrically connected by the winding line in the first non-display region 7. Such winding line is arranged in the frame surrounding the light-transmitting hole 1, and thus has a short extending length and a small load. As a result, the load difference between the entirety line composed of the fourth winding line 69, and the first A segment 4 and the first B segment 5 electrically connected by the fourth winding line 69, and the first-type signal line 3 that is not broken by the light-transmitting hole 1 is reduced, and the load difference between the entirety line composed of the fifth winding line 70, and the second A segment 9 and the second B segment 10 electrically connected by the fifth winding line 70, and the second-type signal line 8 that is not broken by the light-transmitting hole 1 is reduced.

The above configuration also can reduce the number of the first connection lines 6 and the number of the second connection lines 11, the difference between the extending length of the first connection line 6 on the outer side and the extending length of the first connection line 6 on the inner side is not too large, and the difference between the extending length of the second connection line 11 on the outer side and the extending length of the second connection line 11 on the inner side is not too large, thereby reducing the load difference between different first connection lines 6 and the load difference between different second connection lines 11.

Figure 48:
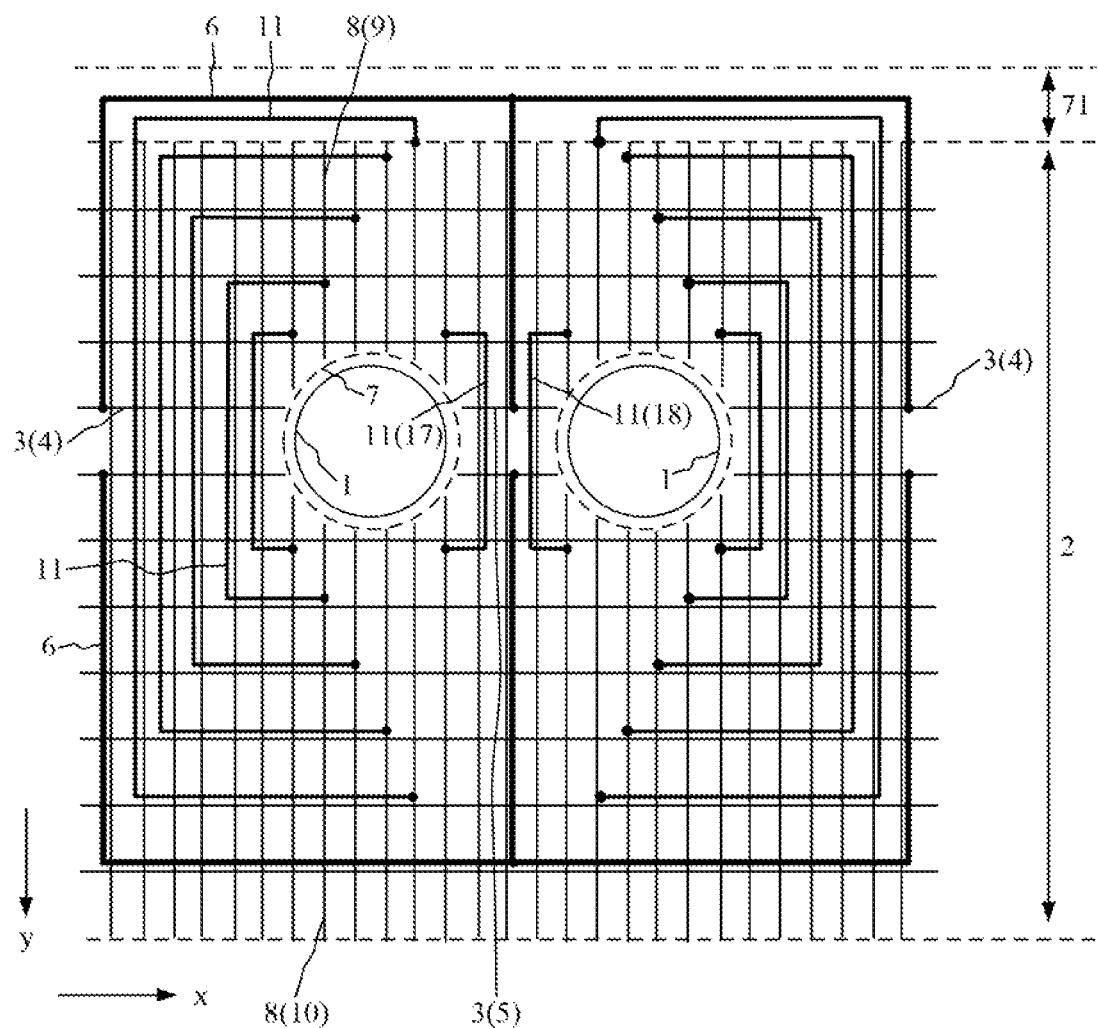
FIG. 48 is another partial top view of a display panel according to some embodiments of the present disclosure.
Figure 49:
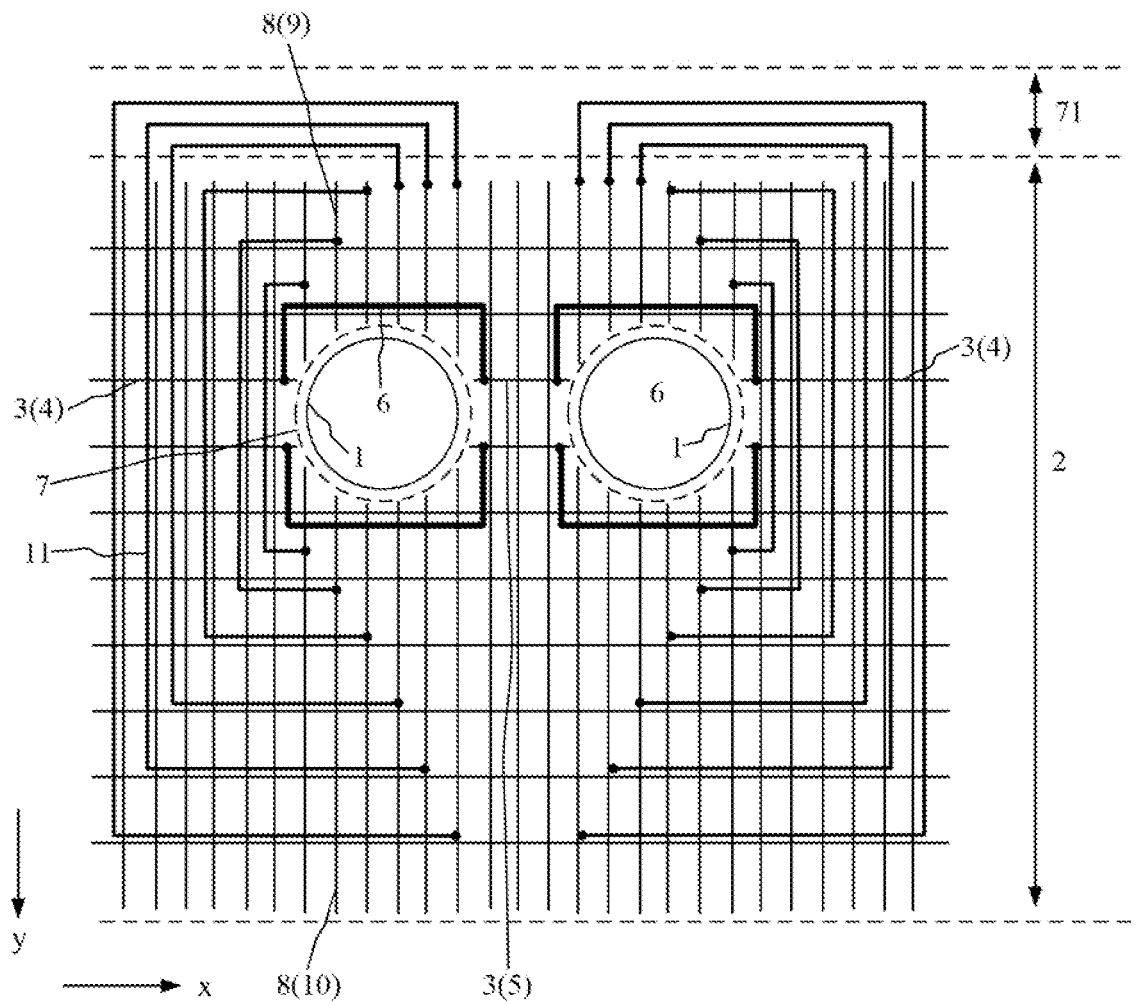
FIG. 49 is another partial top view of a display panel according to some embodiments of the present disclosure.
Figure 50:
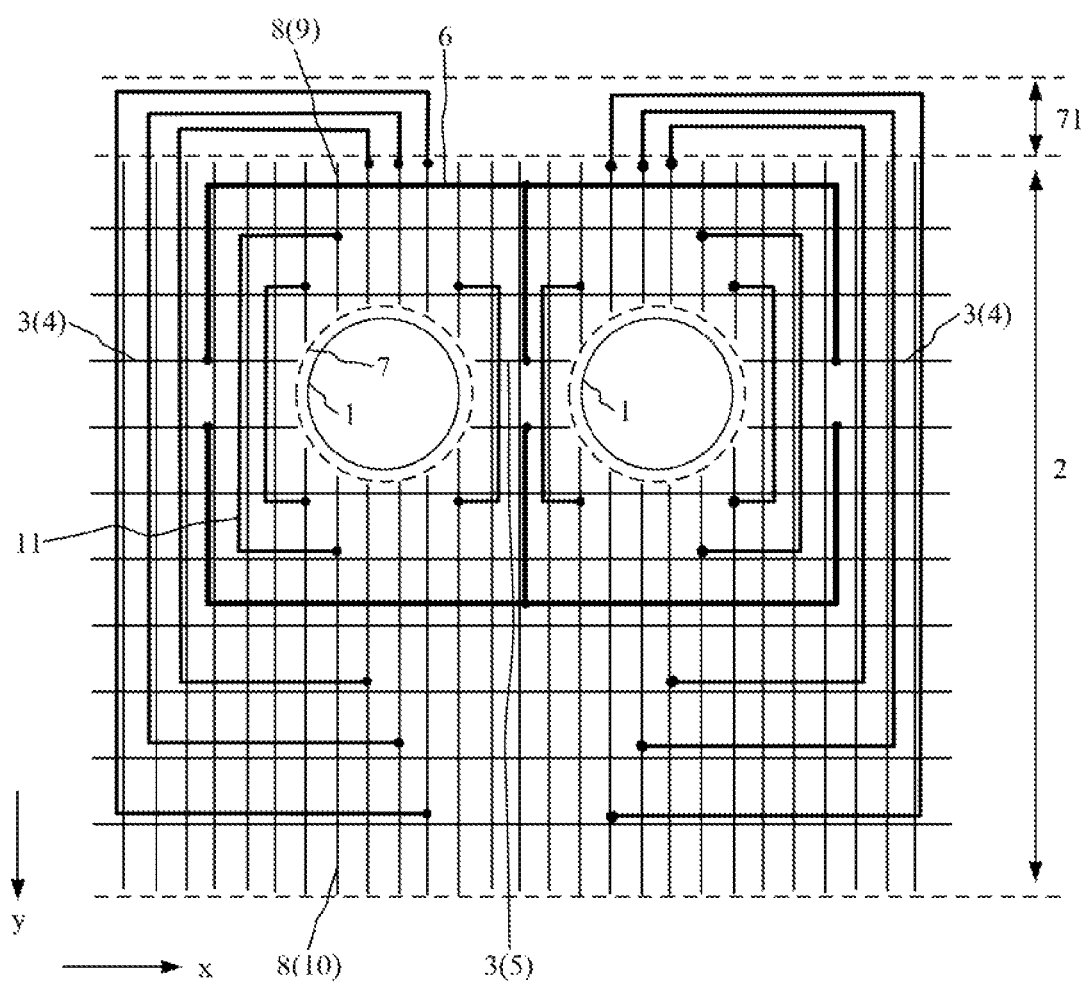
FIG. 50 is another partial top view of a display panel according to some embodiments of the present disclosure.
Figure 51:
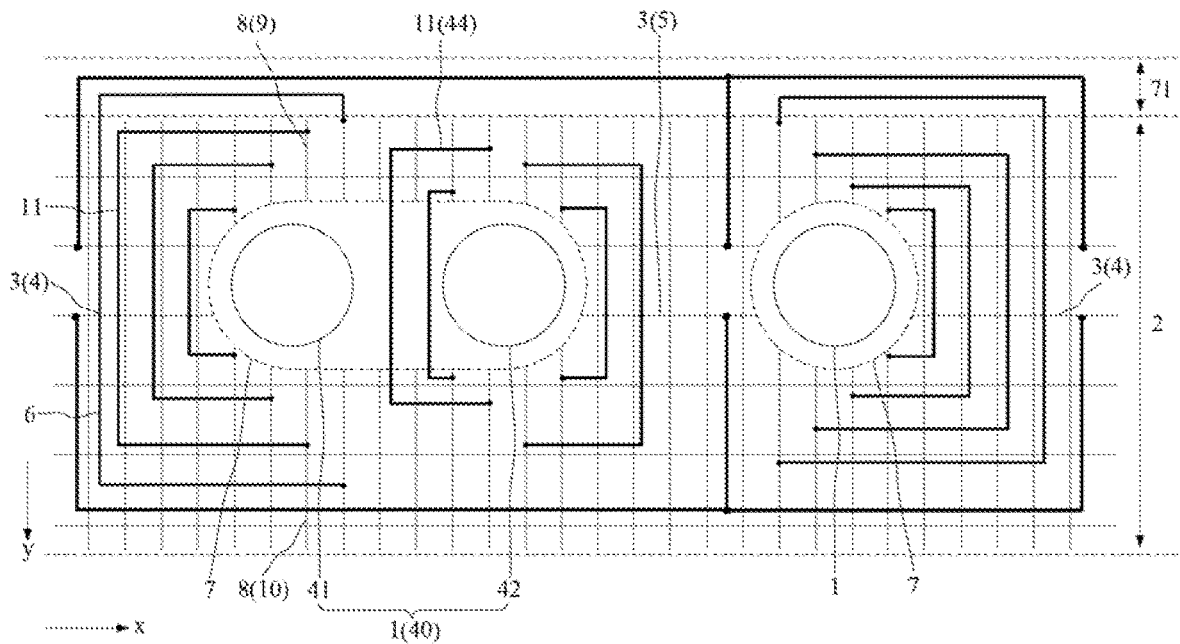
FIG. 51 is another partial top view of a display panel according to some embodiments of the present disclosure.
Figure 52:
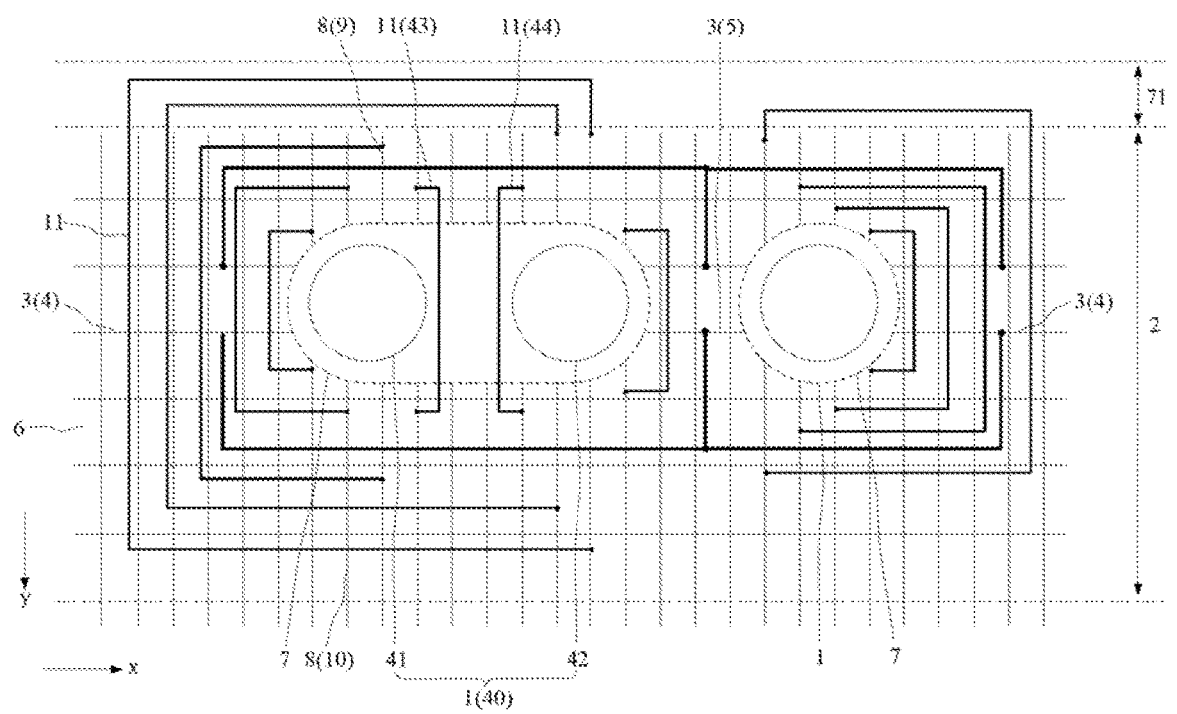
FIG. 52 is another partial top view of a display panel according to some embodiments of the present disclosure.

FIG. 48 is another partial top view of a display panel according to some embodiments of the present disclosure. FIG. 49 is another partial top view of a display panel according to some embodiments of the present disclosure. FIG. 50 is another partial top view of a display panel according to some embodiments of the present disclosure. FIG. 51 is another partial top view of a display panel according to some embodiments of the present disclosure. FIG. 52 is another partial top view of a display panel according to some embodiments of the present disclosure. In some embodiments, as shown in FIG. 3 and FIG. 48 to FIG. 52, the display panel includes a second non-display region 71. The second non-display region 71 is located at a side of the display region 2 along the second direction y, and the light-transmitting hole 1 is close to the second non-display region 71. At least one first connection line 6 has a part located in the second non-display region 71, and/or, at least one second connection line 11 has a part located in the second non-display region 71.

The second non-display region 71 may be understood as the upper frame of the display panel. Typically, the light-transmitting hole 1 of the display panel is closer to the upper frame of the display panel. The first connection line 6 and the second connection line 11 are arranged, and the first connection line 6 and the second connection line 11 surround the light-transmitting hole 1 at the outer side of the light-transmitting hole 1. If the number of the first connection line 6 and the number of the second connection line 11 are large, a horizontally-extending part of at least one first connection line 6 and a horizontally-extending part of at least one second connection line 11 are arranged to be located in the second non-display region 71, such that the horizontally-extending parts of the first connection line 6 and the second connection line 11 are not too dense in the upper part of the display region 2, thereby avoiding signal interference, etc.

Figure 53:
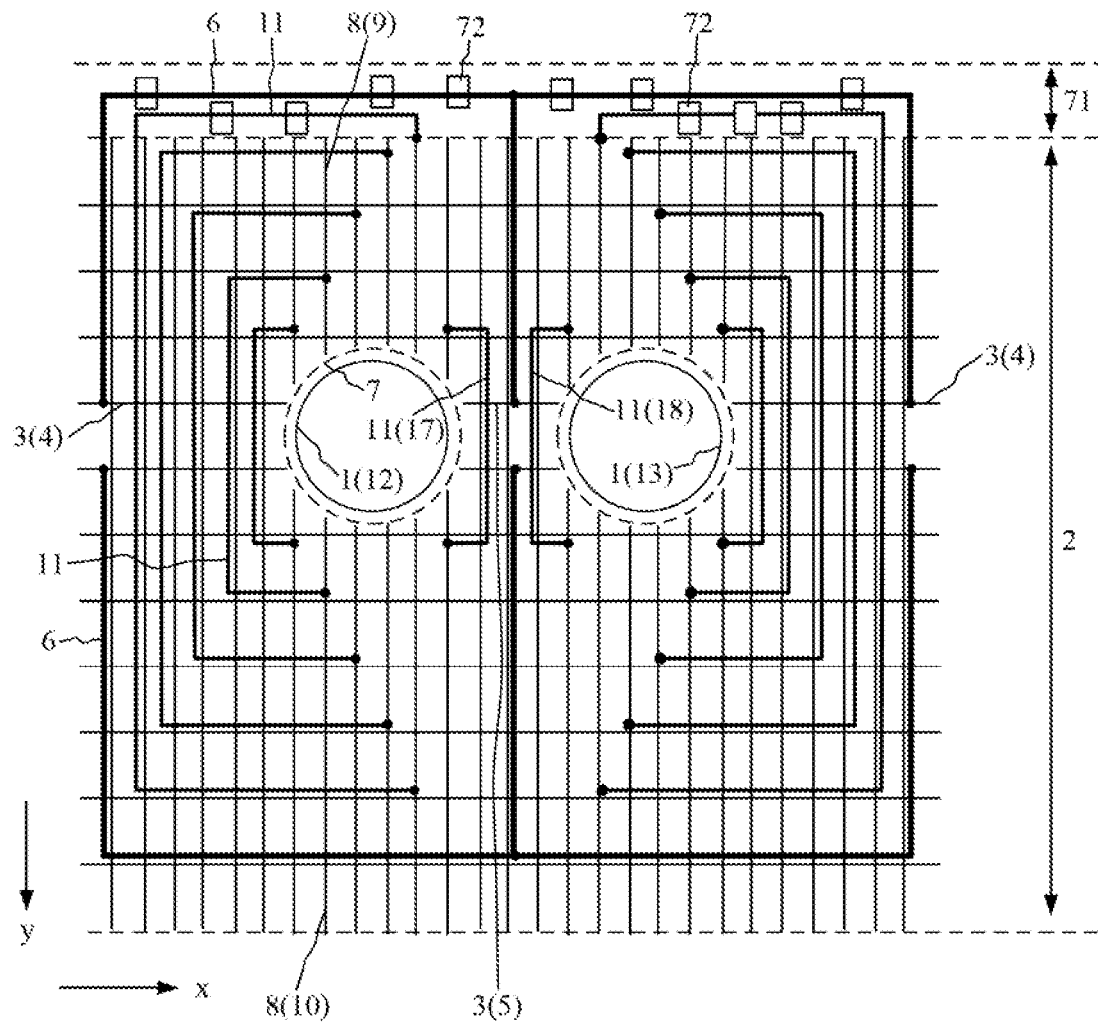
FIG. 53 is another partial top view of a display panel according to some embodiments of the present disclosure.

FIG. 53 is another partial top view of a display panel according to some embodiments of the present disclosure. In some embodiments, as shown in FIG. 53, the display panel further includes second dummy pixel circuits 72 located in the second non-display region 71. At least one of the second dummy pixel circuits 72 is electrically connected to the first connection line 6, and/or, at least one of the second dummy pixel circuits 72 is electrically connected to the second connection line 11.

Taking the first-type signal line 3 as an example, due to the existence of the light-transmitting hole 1, at least one first-type signal line 3 is divided by the light-transmitting hole 1 into two segments located at two left and right sides of the light-transmitting hole 1. Therefore, compared with the first-type signal line 3 that is located at the upper or lower side of the light-transmitting hole 1 and is not divided by the light-transmitting hole 1, the first-type signal line 3 that is divided by the light-transmitting hole 1 is connected to fewer pixel circuits 20, and thus has smaller load. In the present embodiment, at least one first connection line 6 extends in the second non-display region 71, the second non-display region 71 is further provided with the second dummy pixel circuit 72 electrically connected to the first connection line 6, so that the number of circuits electrically connected to the entirety line composed of the first connection line 6 and the first-type signal line 3 electrically connected to the first connection line 6 is approximately equal to the number of circuits electrically connected to the first-type signal line 3 that is not broken by the light-transmitting hole 1, thereby effectively improving the load uniformity of different signal lines.

Figure 54:
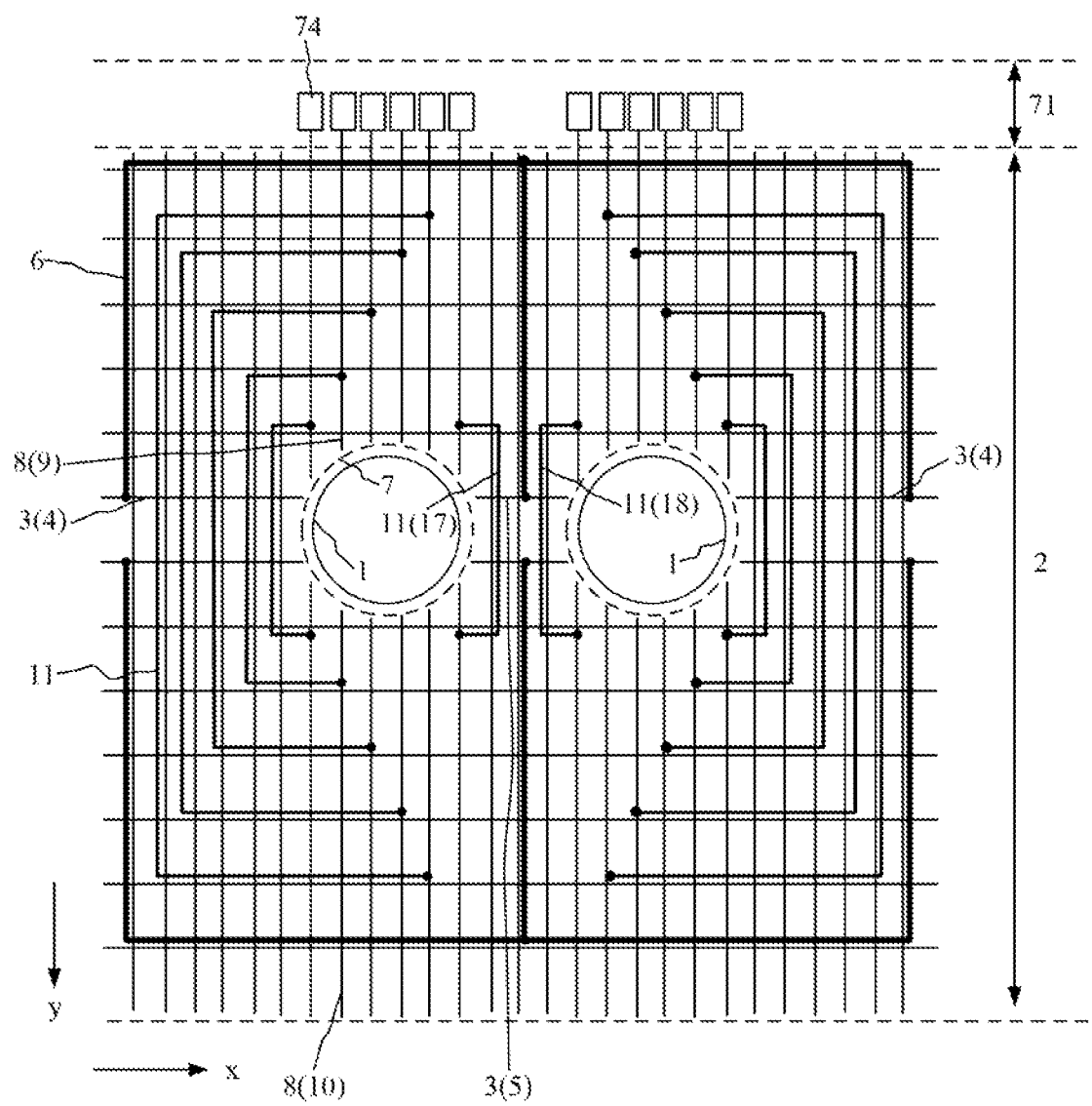
FIG. 54 is another partial top view of a display panel according to some embodiments of the present disclosure.

FIG. 54 is another partial top view of a display panel according to some embodiments of the present disclosure. In some embodiments, as shown in FIG. 54, the display panel further includes second-type signal lines 8. The second-type signal lines 8 are located in the display region 2 and extend along the second direction y. At least one of the second-type signal lines 8 each includes a second A segment 9 and a second B segment 10. The second A segment 9 and the second B segment 10 are located at two sides of the light-transmitting hole 1 along the second direction y, respectively. The second direction y intersects the first direction x.

As shown in FIG. 3, the display panel includes a second non-display region 71 and a third non-display region 73 that are located at two opposite sides of the display region 2 along the second direction y, respectively. The second non-display region 71 is close to the second A segment 9.

The display panel includes third dummy pixel circuits 74. The third dummy pixel circuit 74 is located in the second non-display region 71 and is electrically connected to the second A segment 9.

Due to the existence of the light-transmitting hole 1, at least one second-type signal line 8 is divided by the light-transmitting hole 1 into two segments located at two upper and lower sides of the light-transmitting hole 1. Therefore, compared with the second-type signal line 8 that is located at the left or right side of the light-transmitting hole 1 and is not divided by the light-transmitting hole 1, the second-type signal line 8 that is divided by the light-transmitting hole 1 is electrically connected to fewer pixel circuits 20, and thus has smaller load. In the present embodiment, the second non-display region 71 is further provided with the third dummy pixel circuit 74 electrically connected to the second A segment 9, so that the number of circuits electrically connected to the entirety line composed of the second A segment 9, the second connection line 11 and the second B segment 10 is approximately equal to the number of circuits electrically connected to the second-type signal line 8 that is not broken by the light-transmitting hole 1, thereby effectively improving the load uniformity of different second-type signal lines 8.

Figure 55:
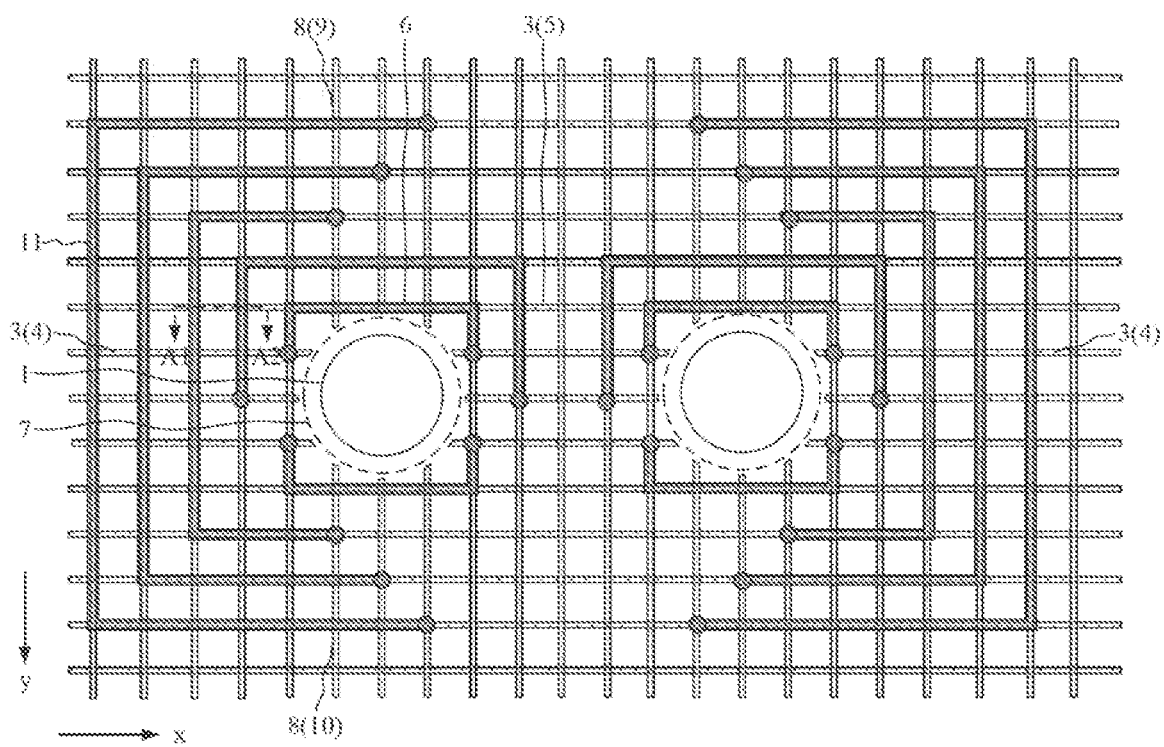
FIG. 55 is another partial top view of a display panel according to some embodiments of the present disclosure.

FIG. 55 is another partial top view of a display panel according to some embodiments of the present disclosure. In some embodiments, as shown in FIG. 55, in a direction perpendicular to a plane of the display panel, the first-type signal line 3 overlaps at least one of: a part of the first connection line 6 extending along the first direction x, or a part of the second connection line 11 extending along the first direction x; and the second-type signal line 8 overlaps at least one of: a part of the first connection line 6 extending along the second direction y, or a part of the second connection line 11 extending along the second direction y.

In the display panel provided by the present embodiment, the first connection line 6 overlaps the first-type signal line 3 and the second-type signal line 8, so that less ambient light is blocked when the ambient light is incident on the position of the first connection line 6, and the affecting of the first connection line 6 on the reflection of the ambient light is reduced, thereby reducing the affecting of the first connection line 6 on the reflection uniformity of the display panel. Similarly, when the second connection line 11 overlaps the first-type signal line 3 and the second-type signal line 8, the affecting of the second connection line 11 on the reflection uniformity of the display panel is reduced.

Figure 56:
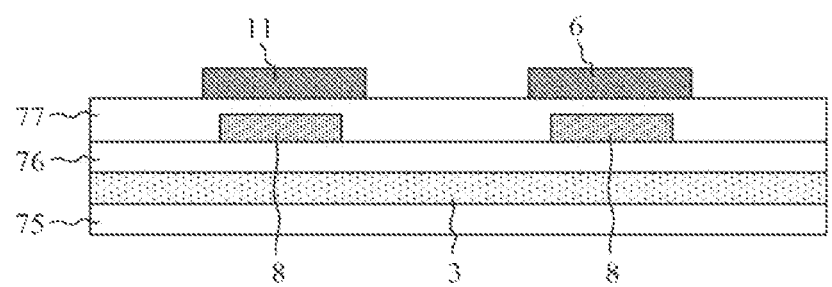
FIG. 56 is a cross-sectional view taken along line A1-A2 shown in FIG. 55.

FIG. 56 is a cross-sectional view taken along line A1-A2 shown in FIG. 55. In some embodiments, as shown in FIG. 56, the first connection line 6 is arranged in a different layer from the first-type signal line 3 and the second-type signal line 8, and the second connection line 11 is arranged in a different layer from the first-type signal line 3 and the second-type signal line 8.

In some exemplary embodiments, the first connection line 6 and the second connection line 11 are arranged in the same layer, and this layer is on the side of the first-type signal line 3 and the second-type signal line 8 facing away from a substrate 75. In addition, a first insulation layer 76 is arranged between the first-type signal line 3 and the second-type signal line 8, and a second insulation layer 77 is arranged between the second-type signal line 8, and the first connection line 6 and the second connection line 11. In an alternative embodiment, the part of the first connection line 6 that extends along the first direction x and the part of the second connection line 11 that extends along the first direction x are arranged in the same layer, and are located at the side of the first-type signal line 3 and the second-type signal line 8 facing away from the substrate 75; a part of the first connection line 6 that extends along the second direction y and a part of the second connection line 11 that extends along the second direction y are arranged in the same layer, and are located at the side of the first-type signal line 3 and the second-type signal line 8 facing away from the substrate 75; and the part of the first connection line 6 that extends along the first direction x and the part of the first connection line 6 that extends along the second direction y may be arranged in different layers.

Generally, the first-type signal lines 3 and the second-type signal lines 8 are densely arranged in the display panel. Especially in the high-resolution display panel, the spacing of the first-type signal lines 3 and the spacing of the second-type signal lines 8 are very small. If the first connection line 6 or the second connection line is arranged in the same layer as the first-type signal line 3 or the second-type signal line 8, the spacing of the first-type signal lines 3 or the spacing of the second-type signal lines 8 needs to be increased to avoid short-circuit of the signal lines, which needs to re-adjust the pattern of the mask. Alternatively, the spacing of the first-type signal lines 3 or the spacing of the second-type signal lines 8 is not adjusted, the first connection line 6 is arranged between the first-type signal lines 3 or the second connection line is arranged between the second-type signal lines 8, which is likely to cause short-circuit of the signal lines.

In this regard, in the present embodiment, the first connection line 6, the first-type signal line 3 and the second-type signal line 8 are arranged in different layers, and the second connection line 11, the first-type signal line 3 and the second-type signal line 8 are arranged in different layers. As a result, the first connection line 6 and the second connection line 11 do not occupy the layer of the first-type signal line 3 and the layer of the second-type signal line 8. In this way, the short-circuit is reduced, and the mask design of the first-type signal line 3 and the second-type signal line 8 does not need to be adjusted. For example, there is no need to increase the spacing of the first-type signal line 3 or the spacing of the second-type signal line 8 to accommodate the first connection line 6 or the second connection line 11, and thus there is no need to change the pattern of the original mask.

Figure 57:
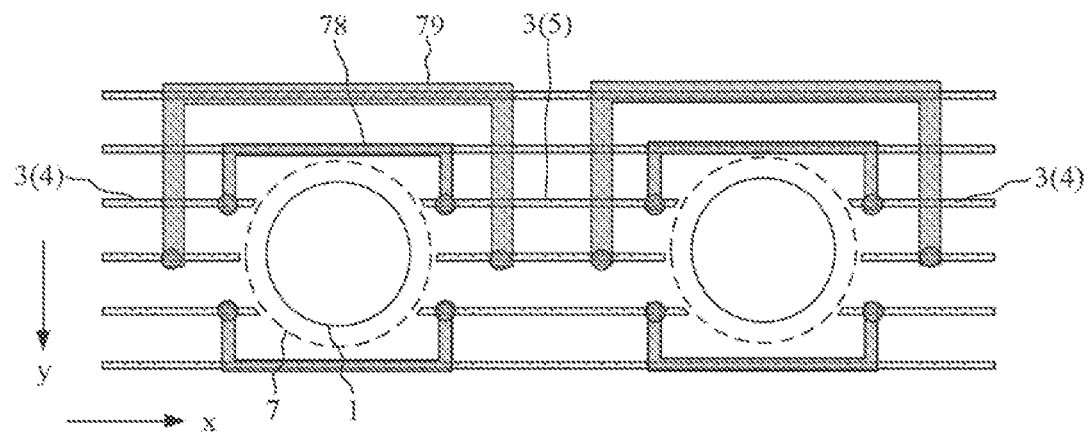
FIG. 57 is another partial top view of a display panel according to some embodiments of the present disclosure.

FIG. 57 is another partial top view of a display panel according to some embodiments of the present disclosure. In some embodiments, as shown in FIG. 57, the first connection lines 6 include a first A connection line 78 and a first B connection line 79. A length of the first A connection line 78 is smaller than that of the first B connection line 79, and a line width of the first A connection line 78 is smaller than that of the first B connection line 79. In this way, the load of the first A connection line 78 is approximately equal to the load of the first B connection line 79, and the load uniformity of different first connection lines 6 is improved.

Figure 58:
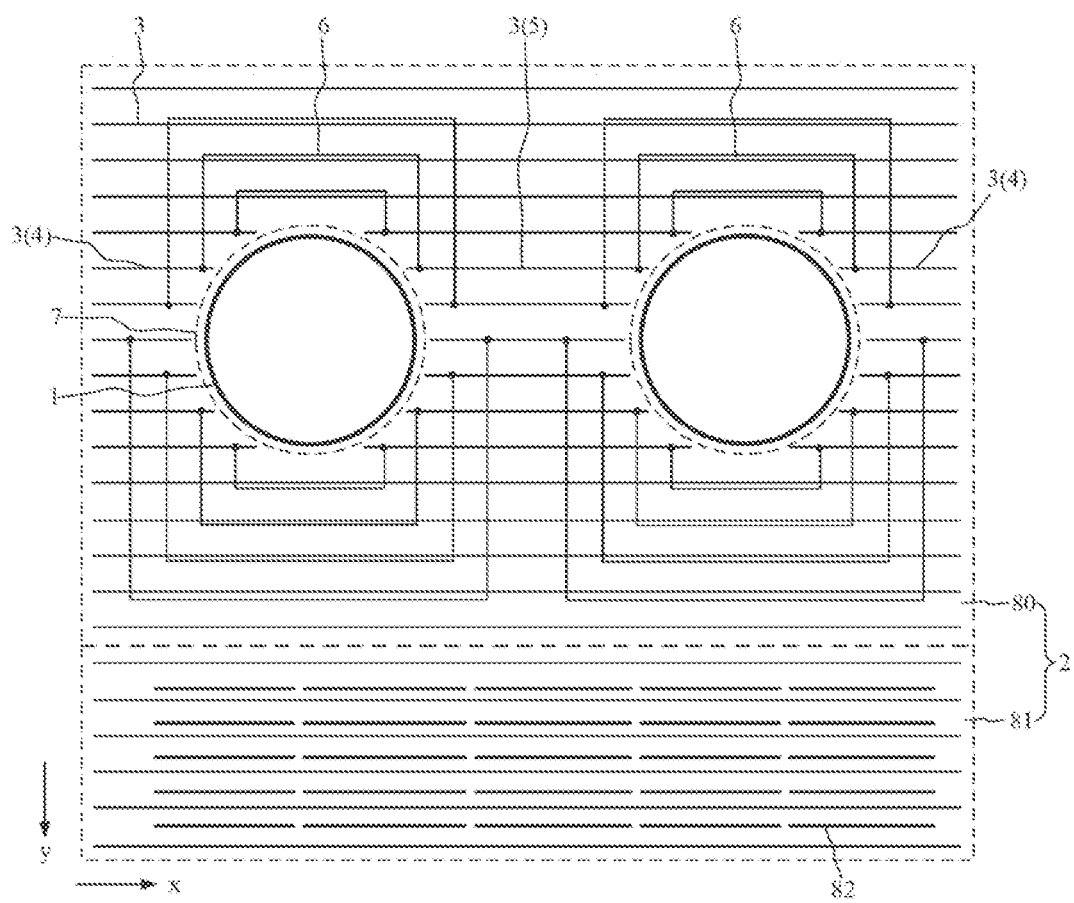
FIG. 58 is another partial top view of a display panel according to some embodiments of the present disclosure.

FIG. 58 is another partial top view of a display panel according to some embodiments of the present disclosure. In some embodiments, as shown in FIG. 58, the display region 2 includes a first display sub-region 80 and a second display sub-region 81. The first connection line 6 is located in the first display sub-region 80. The display panel further includes a dummy line 82 located in the second display sub-region 81. In one embodiment, the dummy line 82 may be arranged in a same layer as the first connection line 6.

The first connection line 6 arranged in the first display sub-region 80 may affect the reflectivity of the first display sub-region 80. In this regard, in the present embodiment, the dummy line 82 is arranged in the second display sub-region 81 where no first connection line 6 is arranged. With the dummy line 82, the ambient-light reflectivity of the first display sub-region 80 and the ambient-light reflectivity of the second display sub-region 81 have an improved uniformity.

In some embodiments, a constant voltage is applied to the dummy line 82, and thus the dummy line 82 can further function as a shielding metal to shield the mutual interference between different signal lines. In addition, if the dummy line 82 receives a constant voltage, the dummy line 82 may be electrically connected to the reset signal line Vref or the power supply signal line PVDD in the display region 2 that transmits a constant voltage, so as to reduce the load of the reset signal line Vref or the power supply signal line PVDD and reduce the voltage drop of the reset signal or power supply signal during transmission.

Figure 59:
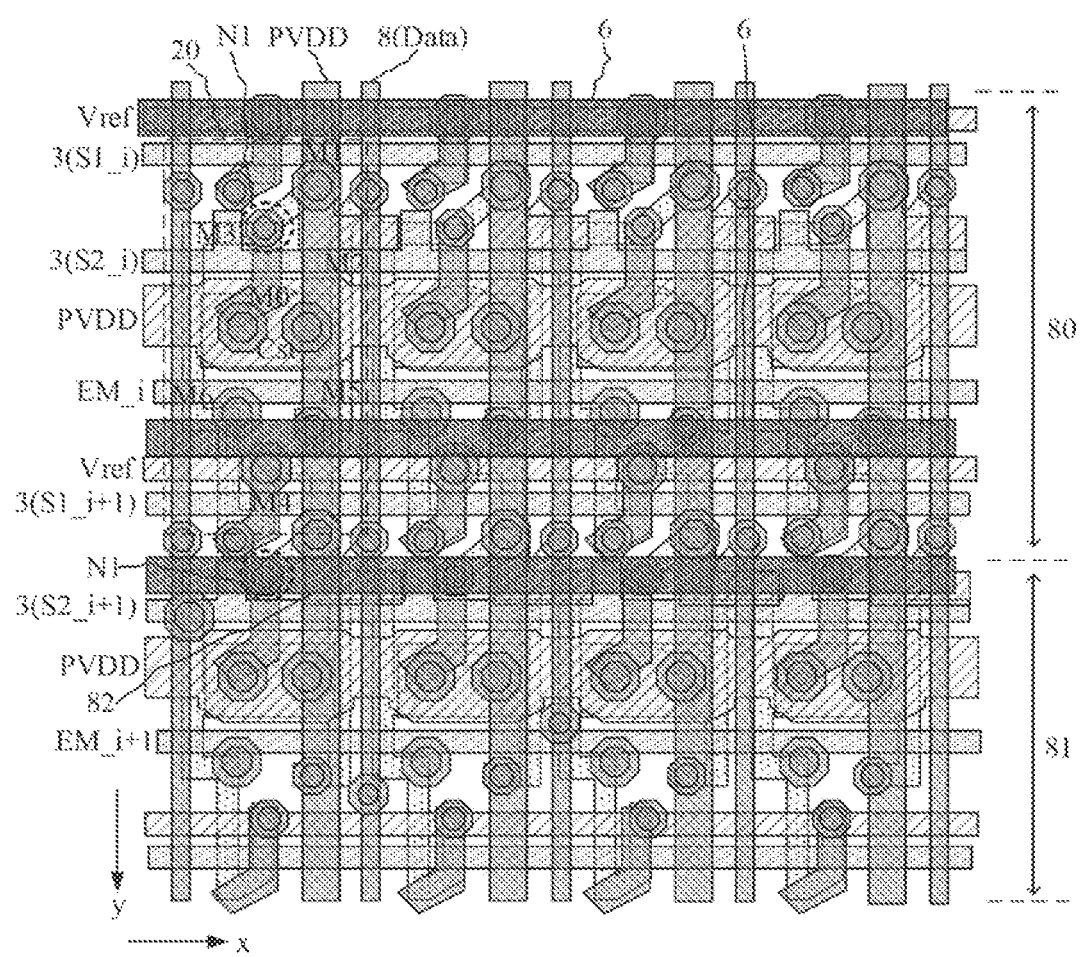
FIG. 59 is a top view of layers of a display panel according to some embodiments of the present disclosure.

FIG. 59 is a top view of layers of a display panel according to some embodiments of the present disclosure. In some embodiments, as shown in FIG. 16 and FIG. 19, the display panel further includes pixel circuits 20 located in the display region 2. The pixel circuit 20 includes a driving transistor M0. A gate of the driving transistor M0 is electrically connected to a first node N1. In the direction perpendicular to the plane of the display panel, the dummy line 82 overlaps the first node N1 in at least one of the pixel circuits 20.

During the work process of the pixel circuit 20, the reliability of the work state of the driving transistor M0 significantly depends on the stability of the potential of the gate of the driving transistor M0. In the present embodiment, the dummy line 82 receives a constant voltage, and overlaps the first node N1 in at least one pixel circuit 20, so the dummy line 82 can shield interference from other elements to the potential of the gate of the driving transistor M0. For example, the dummy line 82 can shield the interference caused by the voltage jumping on the data line Data to the potential of the gate of the driving transistor M0. As a result, the stability of the potential of the gate of the driving transistor M0 is improved, and thus reliability of the drive current generated by the driving transistor M0 is improved.

Figure 60:
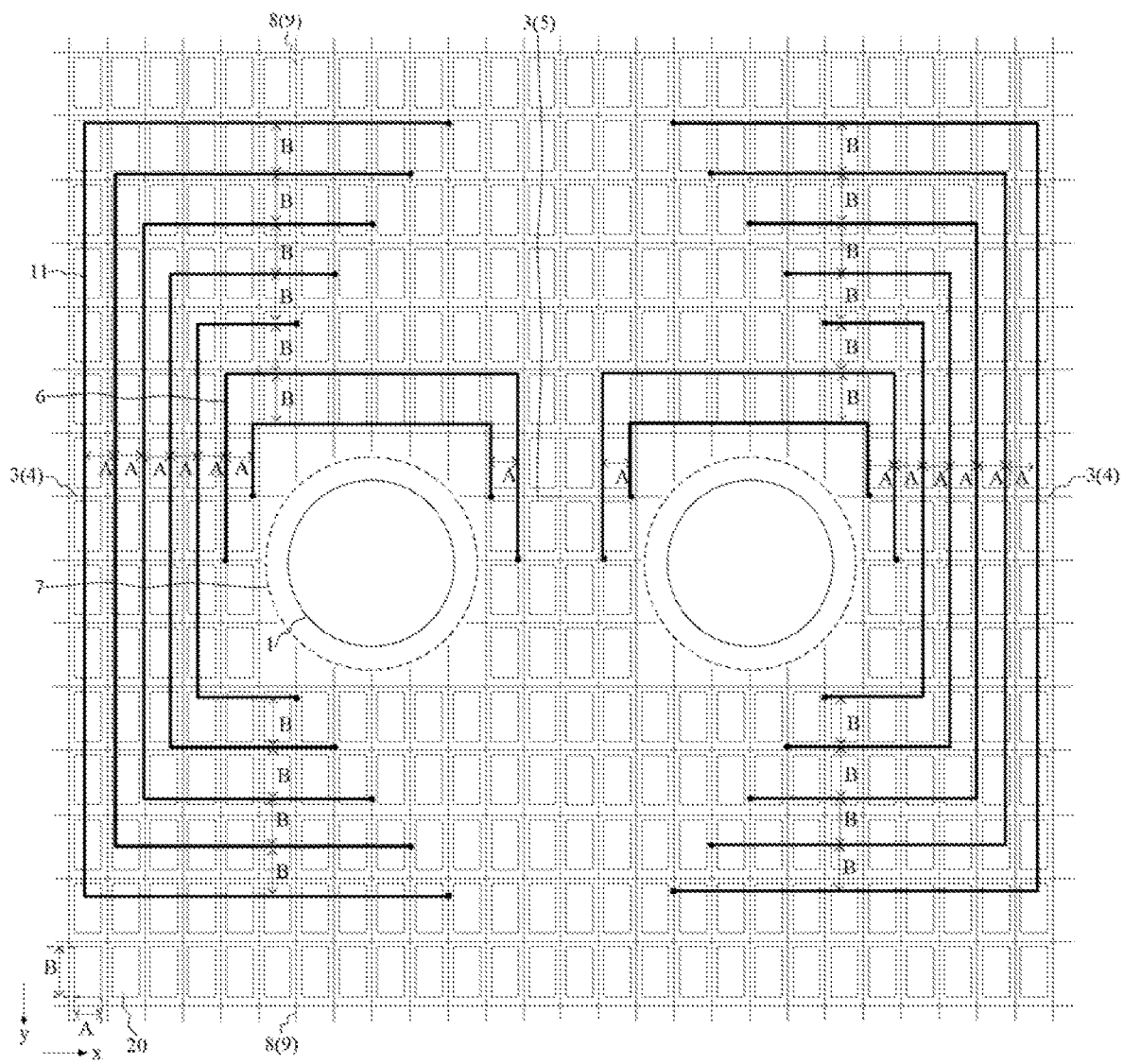
FIG. 60 is a schematic diagram showing a spacing of connection lines according to some embodiments of the present disclosure.

FIG. 60 is a schematic diagram showing a spacing of connection lines according to some embodiments of the present disclosure. In some embodiments, as shown in FIG. 60, the display panel further includes pixel circuits 20 located in the display region 2. A length of the pixel circuit 20 along the first direction x is A, and a length of the pixel circuit 20 along the second direction y is B.

For at least one first connection line 6, the distance between one first connection line 6 and the second connection line 11 or another first connection line 6 adjacent to the one first connection line 6 along the first direction x is equal to A. For at least one first connection line 6, the distance between one first connection line 6 and the second connection line 11 or another first connection line 6 adjacent to the one first connection line 6 along the second direction y is equal to B. For at least one second connection line 11, the distance between one second connection line 11 and the first connection line 6 or another second connection line 11 adjacent to the one second connection line 11 along the first direction x is equal to A. For at least one second connection line 11, the distance between one second connection line 11 and the first connection line 6 or another second connection line 11 adjacent to the one second connection line 11 along the second direction y is equal to B.

With such configuration, the first connection lines 6 are evenly spaced in display region 2 at equal intervals, the second connection lines 11 are evenly spaced in display region 2 at equal intervals, so the arrangement is more regular. As a result, it is avoided that the first connection lines 6 or the second connection lines 11 are concentrated in a certain region and cause a large coupling to the signal lines in the display region 2.

Figure 61:
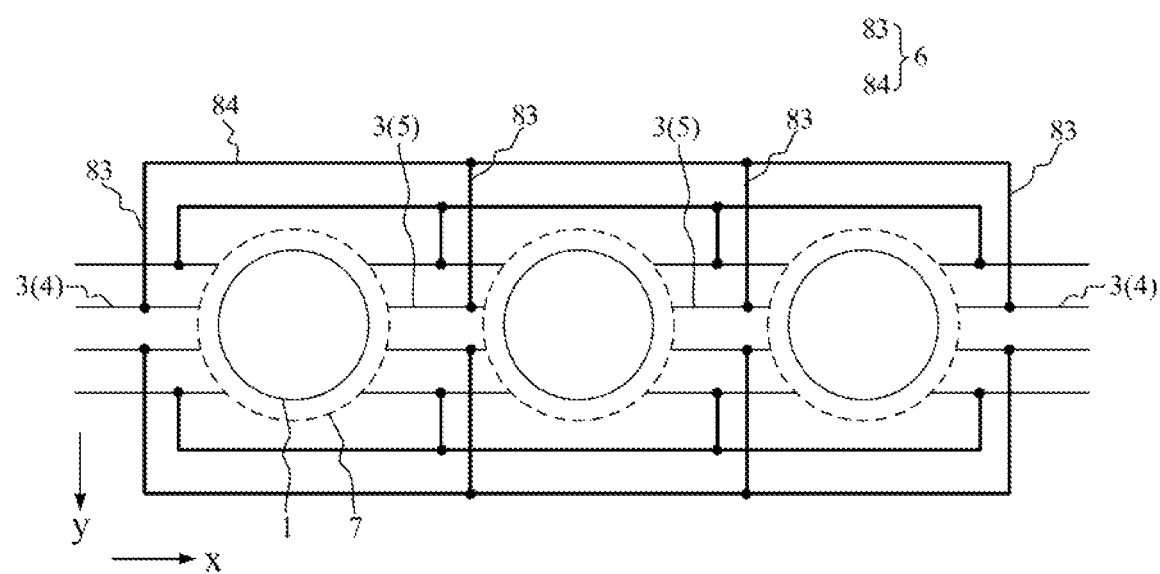
FIG. 61 is another partial top view of a display panel according to some embodiments of the present disclosure.

FIG. 61 is another partial top view of a display panel according to some embodiments of the present disclosure. In some embodiments, as shown in FIG. 61, the display panel includes at least three light-transmitting holes 1.

The first connection line 6 includes a first segment 84 extending along the first direction x and multiple second segments 83 each extending along the second direction y, where the second direction y intersects the first direction x. Each first A segment 4 is electrically connected to the first segment 84 through one second segment 83, and each first B segment 5 is electrically connected to the first segment 84 through one second segment 83.

In the present embodiment, every two adjacent light-transmitting holes 1 are provided with the first B segment 5 located therebetween, and the first B segment 5 is electrically connected to the first A segments 4 located at the two sides of the first B segment 5, so as to form a continuous signal transmission path, so that each first B segment 5 has signal transmission. In this configuration, the shift register 21 may drive the first-type signal lines in the unilateral drive manner or the bilateral drive manner, and thus the drive manner is more flexible.

In some embodiments, as shown in FIG. 16 and FIG. 27, the display panel includes pixel circuits 20 located in the display region 2. The pixel circuit 20 is electrically connected to the scanning signal lines, the reset signal line Vref, the light-emitting control signal line EM, and the data line Data. The first-type signal lines 3 include at least one of the scanning signal lines, the reset signal line Vref, or the light-emitting control signal line EM. The second-type signal lines 8 include the data line Data.

In some embodiments, as shown in FIG. 16, the scanning signal lines include the first scanning signal line Si and the second scanning signal line S2, and the first-type signal lines 3 include: the first scanning signal line S1 and the second scanning signal line S2. In another embodiment, as shown in FIG. 27, the scanning signal lines include: the third scanning signal line S3, the fourth scanning signal line S4, and the fifth scanning signal line S5, and the first-type signal lines 3 include: the third scanning signal line S3, the fourth scanning signal line S4, and the fifth scanning signal line S5.

The connection manner and function of these signal lines have been described in detail in the above embodiments and are not repeated herein.

Figure 62:
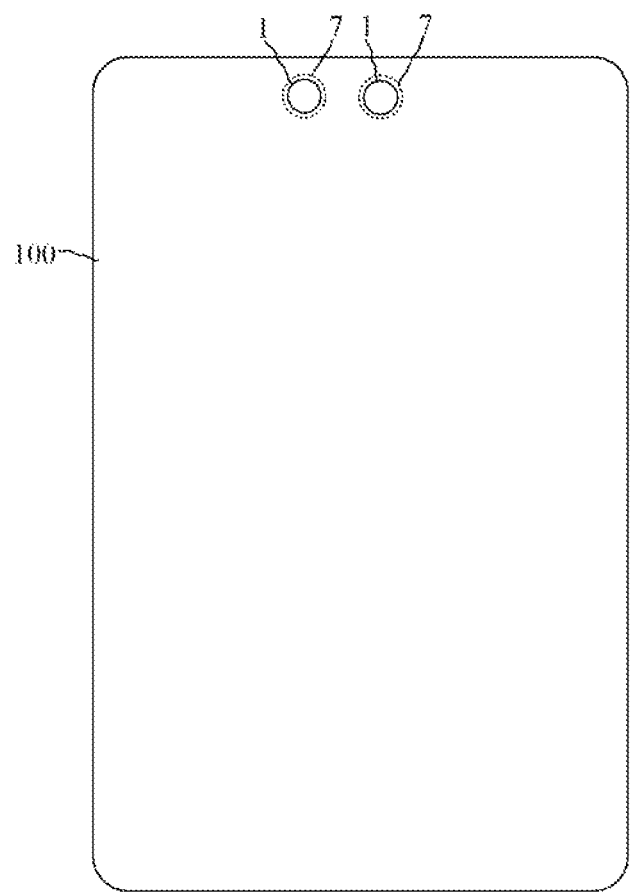
FIG. 62 is a schematic diagram of a display apparatus according to some embodiments of the present disclosure.

Some embodiments of the present disclosure provide a display apparatus. FIG. 62 is a schematic diagram of a display apparatus according to some embodiments of the present disclosure. As shown in FIG. 62, the display apparatus includes the display panel 100 described above. A structure of the display panel 100 has been described in detail in the foregoing embodiments and will not be repeated herein. It should be noted that, the display apparatus shown in FIG. 62 is merely illustrated exemplarily, and the display apparatus can be any electronic device having a display function, such as a mobile phone, a tablet computer, a notebook computer, an electronic paper reader, or a television.

The above embodiments are merely some embodiments of the present disclosure and are not intended to limit the present disclosure. Any modifications, equivalent substitutions, and improvements made within the principle of the present disclosure shall fall into the scope of the present disclosure.

Finally, it should be noted that the above embodiments are only intended to illustrate technical schemes of the present disclosure, but not to limit it. Although the present disclosure has been described in detail with reference to the foregoing embodiments, it should be understood by those skilled in the art that modifications can be made to the technical schemes described in the foregoing embodiments, or equivalent substitutions can be made to part or all of technical features thereof. These modifications or substitutions do not cause essence of corresponding technical schemes to depart from the spirit and scope of the technical schemes of the embodiments of this disclosure.

What is claimed is:

1. A display panel, having at least two light-transmitting holes arranged in a first direction and a display region surrounding the at least two light-transmitting holes,
    wherein the display panel comprise:
        first-type signal lines located in the display region and each extending along the first direction, wherein at least one first-type signal line of the first-type signal lines each comprises first A segments and at least one first B segment, wherein each of the at least one first B segment is located between two adjacent light-transmitting holes of the at least two light-transmitting holes, and each of the first A segments is located at a side of an outermost light-transmitting hole of the at least two light-transmitting holes away from the at least one first B segment; and at least one first connection line, wherein one of the at least one first connection line has a first end electrically connected to one of the at least one first B segment, and a second end electrically connected to one of the first A segments or another one of the at least one first B segment, and wherein one of the first connection lines has at least one part located in the display region, wherein the at least two light-transmitting holes comprises a racetrack-shaped hole and a first hole, one of the first-type signal lines is disconnected at both the racetrack-shaped hole and the first hole and is connected by at least one connection line or at least one winding line at the first hole.

2. The display panel according to claim 1, further comprising:

second-type signal lines located in the display region and each extending along a second direction that intersects the first direction, at least one second-type signal line of the second-type signal lines each comprising a second A segment and a second B segment, wherein the second A segment and the second B segment are located at two sides of one of the at least two light-transmitting holes along the second direction; and at least one second connection line, one of the at least one second connection line comprising two ends respectively electrically connected to the second A segment and the second B segment of one of the at least one second-type signal line, and a second connection line of the at least one second connection line having at least one part located in the display region.

3. The display panel according to claim 1, wherein the at least two light-transmitting holes comprise a first light-transmitting hole and a second light-transmitting hole; and wherein one first B segment of the at least one first B segment that is located between the first light-transmitting hole and the second light-transmitting hole is electrically connected to another one of the at least one first B segment or electrically connected to one of the first A segments that is located at another side of the first light-transmitting hole, and the one first B segment is further electrically connected to another one of the at least one first B segment or electrically connected to another one of the first A segments that is located at another side of the second light-transmitting hole.

4. The display panel according to claim 3, wherein the at least one first connection line comprises at least two first connection lines, wherein each of the at least two first connection lines comprises a first connection segment, a second connection segment, and a third connection segment that are sequentially connected, wherein the third connection segment has an end electrically connected to the one first B segment that is located between the first light-transmitting hole and the second light-transmitting hole, and wherein two of the at least two first connection lines that are electrically connected to the one first B segment share the third connection segment.

5. The display panel according to claim 4, further comprising:

second-type signal lines located in the display region and each extending along a second direction that intersects the first direction, at least one second-type signal line of the second-type signal lines each comprising a second A segment and a second B segment that are respectively located at two sides of one of the at least two light-transmitting holes along the second direction; and at least one second connection line, wherein each of the at least one second connection line having two ends respectively electrically connected to the second A segment and the second B segment of one of the at least one second-type signal line, and one of the at least one second connection lines having at least one part located in the display region, wherein the at least one second connection line comprises at least one of at least one second A connection line or at least one second B connection line, wherein one of the at least one second A connection line has at least one part located between the first light-transmitting hole and the second light-transmitting hole, and is electrically connects the second A segment and the second B segment of one of the at least one second-type signal line that are located at two sides of the first light-transmitting hole; and one of the at least one second B connection line has at least one part located between the first light-transmitting hole and the second light-transmitting hole, and is electrically connects the second A segment and the second B segment of one of the at least one second-type signal line that are located at two sides of the second light-transmitting hole.

6. The display panel according to claim 3, wherein the at least one first connection line comprises at least two first connection lines, wherein each of the at least two first connection lines comprises a first connection segment, a second connection segment, and a third connection segment that are sequentially connected, wherein the third connection segment has an end electrically connected to the one first B segment located between the first light-transmitting hole and the second light-transmitting hole, and wherein the third connection segments of two first connection lines of the at least two first connection lines that are electrically connected to the one first B segment are spaced apart from each other.

7. The display panel according to claim 6, further comprising:

second-type signal lines located in the display region and each extending along a second direction that intersects the first direction, at least two second-type signal lines of the second-type signal lines each comprising a second A segment and a second B segment, and the second A segment and the second B segment being located at two sides of one of the at least two light-transmitting holes along the second direction; and second connection lines, one of the second connection lines having two ends respectively electrically connected to the second A segment and the second B segment of one of the at least two second-type signal lines, and one of the second connection lines having at least one part located in the display region, wherein one of the second connection line that electrically connects the second A segment and the second B segment of one of the at least two second-type signal lines that are respectively located at two sides of the first light-transmitting hole surrounds the first light-transmitting hole at a side of the first light-transmitting hole away from the second light-transmitting hole, and another one of the second connection lines that electrically connects the second A segment and the second B segment of another one of the at least two second-type signal lines that are respectively located at two sides of the second light-transmitting hole surrounds the second light-transmitting hole at a side of the second light-transmitting hole away from the first light-transmitting hole.

8. The display panel according to claim 2, wherein for each light-transmitting hole of the at least two light-transmitting holes, one first connection line of the at least one first connection line that electrically connects the first A segments and the at least one first B segment of one of the at least one first-type signal line that are respectively located at two sides of the light-transmitting hole, and one second connection line of the at least one second connection line that electrically connects the second A segment and the second B segment of one of the at least one second-type signal line that are respectively located at two sides of the light-transmitting hole, are defined as a first connection line corresponding to the light-transmitting hole and a second connection line corresponding to the light-transmitting hole; and wherein for at least one light-transmitting hole of the at least two light-transmitting holes, the first connection line corresponding to each light-transmitting hole of the at least one light-transmitting hole is located at a side of the second connection line corresponding to the light-transmitting hole away from the light-transmitting hole.

9. The display panel according to claim 2, wherein for each light-transmitting hole of the at least two light-transmitting holes, one first connection line of the at least one first connection line that electrically connects the first A segments and the at least one first B segment of one of the at least one first-type signal line that are respectively located at two sides of the light-transmitting hole, and one second connection line of the at least one second connection line that electrically connects the second A segment and the second B segment of one of the at least one second-type signal line that are respectively located at two sides of the light-transmitting hole, are defined as a first connection line corresponding to the light-transmitting hole and a second connection line corresponding to the light-transmitting hole, and wherein for each of at least one of the at least two light-transmitting holes, the second connection line corresponding to the light-transmitting hole is located at a side of the first connection line corresponding to the light-transmitting hole away from the light-transmitting hole.

10. The display panel according to claim 2, wherein for each light-transmitting hole of the at least two light-transmitting holes, one first connection line of the at least one first connection line that electrically connects the first A segment and the first B segment of one of the at least one first-type signal line that are respectively located at two sides of the light-transmitting hole, and one second connection line of the at least one second connection line that electrically connects the second A segment and the second B segment of one of the at least one second-type signal line that are respectively located at two sides of the light-transmitting hole, are defined as a first connection line corresponding to the light-transmitting hole and a second connection line corresponding to the light-transmitting hole; and wherein for at least one light-transmitting hole of the at least two light-transmitting holes, at least one second connection line corresponding to one of the at least one light-transmitting hole is arranged between at least two first connection lines corresponding to the one of the at least one light-transmitting hole, and/or, at least one first connection line corresponding to the one of the at least one light-transmitting hole is arranged between at least two second connection lines corresponding to the one of the at least one light-transmitting hole.

11. The display panel according to claim 1, further comprising:

a plurality of pixel rows arranged along a second direction that intersects the first direction, each of the plurality of pixel rows comprising a plurality of pixel circuits arranged along the first direction, and the plurality of pixel circuits being electrically connected to one of the first-type signal lines; and at least one shift register, one of the at least one shift register comprising a plurality of shift units that is cascaded, and one of the plurality of shift units being electrically connected to one of the first-type signal lines that is connected to at least two pixel rows of the plurality of pixel rows, wherein at least one first-type signal line comprises at least two first-type signal lines; for at least two of the at least two first-type signal lines that are electrically connected to one of the plurality of shift units and each comprise segments respectively located at two sides of one of the at least two light-transmitting holes, the first A segments of the at least two of the at least two first-type signal lines that are located at a same side of one of the at least two light-transmitting holes, or the first B segments of the at least two of the at least two first-type signal lines that are located at a same side of the one of the at least two light-transmitting holes, are electrically connected to one first connection line of the at least one first connection line.

12. The display panel according to claim 11, wherein each of the at least one first connection line comprises a first connection segment, a second connection segment, and a third connection segment that are sequentially connected, wherein both the first connection segment and the third connection segment extend along the second direction, and the second connection segment extends along the first direction; and wherein for at least two of the at least two first-type signal lines that are electrically connected to one of the plurality of shift units and each comprise segments respectively located at two sides of one of the at least two light-transmitting holes, the first A segments of the at least two first-type signal lines that are located at a same side of one of the at least two light-transmitting holes are electrically connected to the first connection segment of one first connection line of the at least one first connection line, and the first B segments of the at least two first-type signal lines that are located at a same side of the one of the at least two light-transmitting holes are electrically connected to the first connection segment of one first connection line of the at least one first connection line or the third connection segment of one first connection line of the at least one first connection line.

13. The display panel according to claim 11, wherein one of the plurality of pixel circuits comprises a driving transistor, a gate reset circuit, a data writing circuit, and a threshold voltage compensation circuit;

wherein the first-type signal lines comprise first scanning signal lines and second scanning signal lines;

wherein the gate reset circuit is electrically connected to a reset signal line, a gate of the driving transistor, and one of the first scanning signal lines; the data writing circuit is electrically connected to a data line, a first electrode of the driving transistor, and one of the second scanning signal lines; and the threshold voltage compensation circuit is electrically connected to a second electrode of the driving transistor, the gate of the driving transistor, and the one of the second scanning signal lines;

wherein the at least one shift register comprises a first shift register, and the first shift register comprises a plurality of first shift units that is cascaded; and wherein for two adjacent pixel rows of the plurality of pixel rows, one of the second scanning signal lines electrically connected to a former pixel row of the two adjacent pixel rows and one of the first scanning signal lines electrically connected to succeeding later one of the two adjacent pixel rows are electrically connected to one of the plurality of first shift units.

14. The display panel according to claim 11, wherein one of the plurality of pixel circuits comprises a driving transistor, a gate reset circuit, a data writing circuit, and a threshold voltage compensation circuit;

wherein the first-type signal lines comprise a plurality of third scanning signal lines, the at least one shift register comprises a second shift register, the second shift register comprises a plurality of second shift units that is cascaded, and one of the plurality of second shift units is electrically connected to at least two third scanning signal lines of the plurality of third scanning signal lines that are respectively connected to at least two pixel rows of the plurality of pixel rows; and/or wherein the first-type signal lines comprise a plurality of fifth scanning signal lines, the at least one shift register comprises a third shift register, the third shift register comprises a plurality of third shift units that is cascaded, and one of the plurality of third shift units is electrically connected to at least two fifth scanning signal lines of the plurality of fifth scanning signal lines that are respectively connected to at least two pixel rows of the plurality of pixel rows; and wherein the gate reset circuit is electrically connected to one of the third scanning signal lines, a reset signal line, and a gate of the driving transistor; the data writing circuit is electrically connected to a fourth scanning signal line, a data line, and a first electrode of the driving transistor; and the threshold voltage compensation circuit is electrically connected to one of the fifth scanning signal lines, a second electrode of the driving transistor, and the gate of the driving transistor.

15. The display panel according to claim 11, wherein one of the plurality of pixel circuits comprises a driving transistor and a second light-emitting control circuit, the first-type signal lines comprise a plurality of light-emitting control signal lines, and the second light-emitting control circuit is electrically connected to a second electrode of the driving transistor, a light-emitting element, and one of the plurality of light-emitting control signal lines; and wherein the at least one shift register comprises a fourth shift register, the fourth shift resister comprises a plurality of fourth shift units that is cascaded, and one of the plurality of fourth shift units is electrically connected to at least two light-emitting control signal lines of the plurality of light-emitting control signal lines that are respectively electrically connected to at least two pixel rows of the plurality of pixel rows.

16. The display panel according to claim 11, wherein one of the plurality of pixel circuits comprises a driving transistor and a bias adjusting circuit, the first-type signal lines comprise a plurality of sixth scanning signal lines, and the bias adjusting circuit is electrically connected to, a bias signal line, a first electrode of the driving transistor, and one of the plurality of sixth scanning signal lines; and wherein the at least one shift register comprises a fifth shift register, wherein the fifth shift register comprises a plurality of fifth shift units that is cascaded, wherein one of the plurality of fifth shift units is electrically connected to at least two sixth scanning signal lines of the plurality of sixth scanning signal lines that are respectively electrically connected to at least two pixel rows of the plurality of pixel rows.

17. The display panel according to claim 2, wherein the display panel further comprises a first non-display region surrounding the at least two light-transmitting holes, wherein the display region surrounds the first non-display region;

wherein the at least two light-transmitting holes comprise a racetrack-shaped hole, and the racetrack-shaped hole comprises a first light-transmitting sub-hole and a second light-transmitting sub-hole that are arranged along the first direction; and wherein the at least one second connection line comprises at least one of:

at least one second C connection line, or at least one second D connection line, one of the at least one second C connection line electrically connects the second A segment and the second B segment of one of the at least one second-type signal line that are located at two sides of the first light-transmitting sub-hole and comprises a part located between the first light-transmitting sub-hole and the second light-transmitting sub-hole, and one of the at least one second D connection line electrically connects the second A segment and the second B segment of another one of the at least one second-type signal line that are located at two sides of the second light-transmitting sub-hole and comprises a part located between the first light-transmitting sub-hole and the second light-transmitting sub-hole.

18. The display panel according to claim 17, further comprising:

at least one of a first winding line or a second winding line, wherein the first winding line is located in the first non-display region surrounding the racetrack-shaped hole, the first winding line electrically connects the second A segment and the second B segment of one of the at least one second-type signal line that are located at two sides of the first light-transmitting sub-hole, and the first winding line is located between the first light-transmitting sub-hole and the second C connection line; and wherein the second winding line is located in the first non-display region surrounding the racetrack-shaped hole, the second winding line electrically connects the second A segment and the second B segment of one of the at least one second-type signal line that are located at two sides of the second light-transmitting sub-hole, and the second winding line is located between the second light-transmitting sub-hole and the second D connection line.

19. The display panel according to claim 2, wherein the at least two light-transmitting holes comprise a racetrack-shaped hole, wherein the racetrack-shaped hole comprises a first light-transmitting sub-hole and a second light-transmitting sub-hole that are arranged along the first direction;

wherein one light-transmitting hole of the at least two light-transmitting holes other than the racetrack-shaped hole is located at a side of the second light-transmitting sub-hole away from the first light-transmitting sub-hole; and wherein at least one of the at least one second connection line that each electrically connects the second A segment and the second B segment of one of the at least one second-type signal line located at two sides of the first light-transmitting sub-hole surrounds the racetrack-shaped hole at a side of the first light-transmitting sub-hole away from the second light-transmitting sub-hole, and at least one of the at least one second connection line that each electrically connects the second A segment and the second B segment of one of the at least one second-type signal line located at two sides of the second light-transmitting sub-hole surrounds the racetrack-shaped hole at the side of the first light-transmitting sub-hole away from the second light-transmitting sub-hole.

20. The display panel according to claim 1, wherein the at least two light-transmitting holes comprise a racetrack-shaped hole, wherein the racetrack-shaped hole comprises a first light-transmitting sub-hole and a second light-transmitting sub-hole that are arranged along the first direction;

wherein the display panel further comprises a first non-display region surrounding the at least two light-transmitting holes, and wherein the display region surrounds the first non-display region, wherein the first non-display region comprises a first non-display sub-region located between the first light-transmitting sub-hole and the second light-transmitting sub-hole, and a sensing element is arranged in the first non-display sub-region.

21. The display panel according to claim 19, further comprising:

pixel circuits and first dummy pixel circuits, wherein the first dummy pixel circuits are located in the first non-display region, and wherein the pixel circuits and at least one first dummy pixel circuit of the first dummy pixel circuits are electrically connected to at least two first-type signal lines of the first-type signal lines; and wherein a number of at least two first-type signal lines of the first-type signal lines that are electrically connected to the first dummy pixel circuits in the first non-display region is smaller than a number of another at least two first-type signal lines of the first-type signal lines that are electrically connected to the pixel circuits.

22. The display panel according to claim 21, further comprising:

at least one third winding line, wherein the at least one first-type signal line comprises at least two first-type signal lines, one of the at least one third winding line comprises a first end electrically connected to one of the first A segments or one of the at least one first B segment of one first-type signal line of the at least two first-type signal lines located at a first side of the racetrack-shaped hole, and a second end electrically connected to one of the first A segments or one of the at least one first B segment of another first-type signal line of the at least two first-type signal lines located at a second side of the racetrack-shaped hole opposite to the first side;

wherein the first non-display region surrounding the racetrack-shaped hole further comprises a second non-display sub-region; and wherein the at least one third winding line is located in the second display sub-region, and one of the at least one third winding line is reused as one of the first-type signal lines that is electrically to at least one of the dummy pixel circuits located in the second non-display sub-region.

23. The display panel according to claim 20, further comprising:

first dummy pixel circuits that are located in the first non-display region, wherein the first non-display region further comprises a second non-display sub-region, and the first dummy pixel circuits in the first non-display region are only located in the second non-display sub-region.

24. The display panel according to claim 2, further comprising:

at least one of a fourth winding line located in the first non-display region or a fifth winding line located in the first non-display region, wherein the display panel has a first non-display region surrounding the at least two light-transmitting holes, and the display region surrounds the first non-display region, wherein the fourth winding line comprises a first end electrically connected to one of the at least one first B segment of one of the at least one first-type signal line and a second end electrically connected to one of the first A segments or another one of the at least one first B segment of one of the at least one first-type signal line, and the fifth winding line electrically connects the second A segment and the second B segment of one of the at least one second-type signal line.

25. The display panel according to claim 2, wherein the display panel further has a second non-display region located at a side of the display region along the second direction, and the at least two light-transmitting holes are close to the second non-display region, wherein at least one of the first-type connection lines is located in the second non-display region, and/or at least one of the second-type connection lines is located in the second non-display region.

26. The display panel according to claim 25, further comprising:

second dummy pixel circuits located in the second non-display region, wherein at least one of the second dummy pixel circuits is electrically connected to one of the first connection lines, and/or at least one of the second dummy pixel circuits is electrically connected to one of the second connection lines.

27. The display panel according to claim 1, further comprising:

second-type signal lines located in the display region and each extending along a second direction intersecting the first direction; and a third dummy pixel circuit, wherein at least one second-type signal line of the second-type signal lines each comprises a second A segment and a second B segment that are respectively located at two sides of one of the at least two light-transmitting holes along the second direction;

wherein the display panel has a second non-display region and a fourth non-display region that are located at two opposite sides of the display region along the second direction, respectively, and the second non-display region is close to the second A segment; and wherein the third dummy pixel circuit is located in the second non-display region and is electrically connected to the second A segment of one of at least one second-type signal line.

28. The display panel according to claim 2, wherein along a direction perpendicular to a plane of the display panel, at least one of one of the at least one first connection line or the at least one second connection line comprises a part extending along the first direction and overlapping one of the first-type signal lines, and a part extending along the second direction and overlapping one of the second-type signal lines.

29. The display panel according to claim 2, wherein the first connection lines are arranged in a layer different from a layer of the first-type signal lines and a layer of the second-type signal lines, and the second connection lines are arranged in a layer different from the layer of the second-type signal lines.

30. The display panel according to claim 1, wherein the at least one first connection line comprises a first A connection line and a first B connection line, wherein a length of the first A connection line is smaller than a length of the first B connection line, and a line width of the first A connection line is smaller than a line width of the first B connection line.

31. The display panel according to claim 1, further comprising:
a dummy line, wherein the display region comprises a first display sub-region and a second display sub-region, the at least one first connection line is located in the first display sub-region, and the dummy line is located in the second display sub-region.

32. The display panel according to claim 31, wherein the dummy line is configured to receive a constant voltage.

33. The display panel according to claim 32, further comprising:
pixel circuits located in the display region, wherein each of the pixel circuits comprises a driving transistor, wherein a gate of the driving transistor is electrically connected to a first node, and the dummy line overlaps the first node of at least one of the pixel circuits in the pixel circuits along a direction perpendicular to a plane of the display panel.

34. The display panel according to claim 2, further comprising:
a pixel circuit located in the display region, a length of the pixel circuit along the first direction being A, and a length of the pixel circuit along the second direction being B;
wherein at least one first connection line comprises at least two first connection lines, at least one second connection line comprises at least two second connection lines, a distance between one connection line of the at least two first connection lines and another first connection line of the at least two first connection lines or one of the at least two second connection lines that is adjacent to the one first connection line along the first direction is A, and a distance between one of the at least two first connection lines and another one of the at least two first connection lines or one of the at least two second connection lines that is adjacent to the one of the at least two first connection lines along the second direction is B; and wherein a distance between a first one of the at least two second connection lines and a first one of the at least two first connection lines or a second one of the at least two second connection lines adjacent to the first one of the at least two second connection lines along the first direction is A, and a distance between a first one of the at least two second connection lines and a first one of the at least two first connection lines or a second one of the at least two second connection lines adjacent to the first one of the at least two second connection lines along the second direction is B.

35. The display panel according to claim 1, wherein the at least two light-transmitting holes comprise at least three light-transmitting holes, and each of the at least one first connection line comprises: a first segment extending along the first direction, and a plurality of second segments each extending along a second direction that intersects the first direction; and
wherein each of the first A segments and the at least one first B segment is electrically connected to the first segment of one first connection line of the at least one first connection line through the plurality of second segments of the one first connection line.

36. The display panel according to claim 2, further comprising:
a pixel circuit located in the display region,
wherein the first-type signal lines comprise at least one of a scanning signal line, a reset signal line, or a light-emitting control signal line, and the second-type signal lines comprise a data line; and
wherein the pixel circuit is electrically connected to the scanning signal line, the reset signal line, the light-emitting control signal line, and the data line.

37. A display apparatus, comprising a display panel,
wherein the display panel has at least two light-transmitting holes arranged in a first direction and a display region surrounding the at least two light-transmitting holes, and comprises:
first-type signal lines located in the display region and each extending along the first direction, wherein at least one first-type signal line of the first-type signal lines each comprises first A segments and at least one first B segment, wherein each of the at least one first B segment is located between two adjacent light-transmitting holes of the at least two light-transmitting holes, and each of the first A segments is located at a side of an outermost light-transmitting hole of the at least two light-transmitting holes away from the at least one first B segment; and
at least one first connection line, wherein one of the at least one first connection lines has a first end electrically connected to one of the at least one first B segment, and a second end electrically connected to one of the first A segments or another one of the at least one first B segment, and one of the first connection lines has at least one part located in the display region,
wherein the at least two light-transmitting holes comprises a racetrack-shaped hole and a first hole, one of the first-type signal lines is disconnected at both the racetrack-shaped hole and the first hole and is connected by at least one connection line or at least one winding line at the first hole.

* * * * *